US012660239B2

(12) United States Patent (10) Patent No.: US 12,660,239 B2
Negoro et al. (45) Date of Patent: Jun. 16, 2026

(54) IMAGING DEVICE

(71) Applicant: Semiconductor Energy Laboratory Co., Ltd., Atsugi (JP)

(72) Inventors: Yusuke Negoro, Kaizuka (JP); Seiichi Yoneda, Isehara (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 809 days.

(21) Appl. No.: 17/912,560

(22) PCT Filed: Apr. 19, 2021

(86) PCT No.: PCT/IB2021/053188
§ 371 (c)(1),
(2) Date: Sep. 19, 2022

(87) PCT Pub. No.: WO2021/214616
PCT Pub. Date: Oct. 28, 2021

(65) Prior Publication Data
US 2023/0133706 A1 May 4, 2023

(30) Foreign Application Priority Data

Apr. 24, 2020 (JP) .................................. 2020-077098

(51) Int. Cl.
*H10D 30/67* (2025.01)
*H04N 25/40* (2023.01)
(52) U.S. Cl.
CPC ............. *H10D 30/67* (2025.01); *H04N 25/40* (2023.01)

(58) Field of Classification Search
CPC .. H10K 50/844; H10K 59/131; H10K 77/111; H10K 50/805; H10K 50/852;
(Continued)

(56) References Cited

U.S. PATENT DOCUMENTS 8,378,391 B2 2/2013 Koyama et al.
8,916,869 B2 12/2014 Koyama et al.
(Continued)

FOREIGN PATENT DOCUMENTS

CN 102598269 A 7/2012
EP 3051588 A 8/2016
(Continued)

OTHER PUBLICATIONS

International Search Report (Application No. PCT/IB2021/053188) Dated Jul. 27, 2021.
(Continued)

*Primary Examiner* — Moin M Rahman
(74) *Attorney, Agent, or Firm* — Eric J. Robinson; Robinson Intellectual Property Law Office, P.C.

(57) ABSTRACT

An imaging device having an image processing function is provided. The imaging device includes a plurality of pixels. The pixel has a function of generating first data of an n-th frame by supplying a first weight to image data obtained in the n-th frame (n is an integer greater than or equal to 2). The pixel has a function of generating first data of an n−1-th frame by supplying a second weight to image data obtained in the n−1-th frame. The pixel has a function of generating second data by adding the first data of the n−1-th frame and the first data of the n-th frame.

9 Claims, 29 Drawing Sheets

(58) Field of Classification Search

CPC .. H10K 50/856; H10K 59/12; H10K 50/8445; H10K 50/85; H10K 59/10; H10K 59/129; H10K 2101/00; H10K 2102/311; H10K 2102/361; H10K 71/00; H10K 10/46–491; H10K 50/30; H10K 19/10; H10K 59/125; H10K 10/481–482; H10K 10/464; H10K 10/466; H10K 10/08; G02F 1/133305; G02F 1/133388; G02F 1/13452; G02F 1/136254; G02F 2201/50; G02F 2202/28; H01L 2224/73204; Y02E 10/549; G09G 2300/0426; H04N 25/40; H04N 25/76; H04N 25/79; H04N 25/68; H04N 17/002; H04N 25/7795; H04N 25/69; H04N 25/779; H04N 25/745; H10D 30/674; H10D 30/6733; H10D 30/6757; H10D 86/423; H10D 86/60; H10D 30/67–6759; H10D 30/031–0327; H10D 86/021–0251; H10D 30/6728; H10D 86/40; H10F 39/12

See application file for complete search history.

(56) References Cited

U.S. PATENT DOCUMENTS

| | | | |
|---|---|---|---|
| 9,331,112 | B2 | 5/2016 | Koyama et al. |
| 9,773,814 | B2 | 9/2017 | Koyama et al. |
| 9,773,832 | B2 | 9/2017 | Kurokawa |
| 9,900,532 | B2 | 2/2018 | Takado et al. |
| 10,074,687 | B2 | 9/2018 | Kurokawa |
| 10,122,951 | B2 | 11/2018 | Takado et al. |
| 10,600,839 | B2 | 3/2020 | Kurokawa |
| 10,964,743 | B2 | 3/2021 | Kurokawa |
| 2009/0027519 | A1 | 1/2009 | Nishiwaki et al. |
| 2011/0108836 | A1 | 5/2011 | Koyama et al. |
| 2012/0268446 | A1* | 10/2012 | Yamauchi ........... G09G 3/3618 |
| | | | 345/212 |
| 2015/0348500 | A1* | 12/2015 | Lin ........................ G06T 7/90 |
| | | | 345/600 |
| 2016/0172410 | A1 | 6/2016 | Kurokawa |
| 2016/0301890 | A1 | 10/2016 | Kurokawa |
| 2016/0344956 | A1 | 11/2016 | Takado et al. |
| 2017/0154678 | A1 | 6/2017 | Nakagawa et al. |
| 2017/0270405 | A1 | 9/2017 | Kurokawa |
| 2018/0005588 | A1 | 1/2018 | Kurokawa |
| 2018/0018752 | A1 | 1/2018 | Kurokawa |
| 2018/0039882 | A1 | 2/2018 | Ikeda et al. |
| 2018/0061344 | A1 | 3/2018 | Kurokawa |
| 2018/0181862 | A1 | 6/2018 | Ikeda |
| 2020/0007114 | A1 | 1/2020 | Kimura et al. |
| 2020/0028498 | A1 | 1/2020 | Kimura et al. |
| 2020/0091214 | A1 | 3/2020 | Ikeda |
| 2020/0125935 | A1 | 4/2020 | Kurokawa et al. |
| 2020/0145600 | A1 | 5/2020 | Yamamoto et al. |
| 2020/0160158 | A1 | 5/2020 | Okamoto et al. |
| 2020/0169683 | A1 | 5/2020 | Yamamoto |
| 2020/0175905 | A1 | 6/2020 | Yamazaki et al. |
| 2020/0194527 | A1 | 6/2020 | Kawashima et al. |
| 2020/0242730 | A1 | 7/2020 | Shiokawa et al. |
| 2020/0258921 | A1 | 8/2020 | Takahashi et al. |
| 2020/0278398 | A1 | 9/2020 | Isa et al. |
| 2020/0278837 | A1 | 9/2020 | Yamazaki et al. |
| 2020/0279525 | A1 | 9/2020 | Kawashima et al. |
| 2020/0372861 | A1* | 11/2020 | Ok ........................ G09G 3/3233 |
| 2020/0382730 | A1 | 12/2020 | Kurokawa et al. |
| 2020/0409963 | A1 | 12/2020 | Higashi et al. |
| 2021/0055352 | A1 | 2/2021 | Takahashi et al. |
| 2021/0073610 | A1 | 3/2021 | Kuriki et al. |
| 2021/0098300 | A1 | 4/2021 | Kusunoki et al. |
| 2021/0116511 | A1 | 4/2021 | Tajima et al. |
| 2021/0150241 | A1 | 5/2021 | Fukutome et al. |
| 2021/0150994 | A1 | 5/2021 | Fukai et al. |
| 2021/0151486 | A1 | 5/2021 | Kobayashi et al. |
| 2021/0210517 | A1 | 7/2021 | Kawashima et al. |
| 2021/0233952 | A1 | 7/2021 | Kurokawa |
| 2021/0257016 | A1 | 8/2021 | Kimura et al. |
| 2021/0257681 | A1 | 8/2021 | Takahashi et al. |
| 2021/0279449 | A1 | 9/2021 | Yamazaki et al. |
| 2021/0318856 | A1 | 10/2021 | Ikeda et al. |
| 2021/0343243 | A1 | 11/2021 | Takahashi et al. |
| 2021/0384193 | A1 | 12/2021 | Kimura et al. |
| 2022/0004570 | A1 | 1/2022 | Okano et al. |
| 2022/0027799 | A1 | 1/2022 | Momo et al. |
| 2022/0041101 | A1 | 2/2022 | Yamazaki et al. |
| 2022/0045125 | A1 | 2/2022 | Kimura et al. |
| 2022/0052663 | A1 | 2/2022 | Sato et al. |
| 2022/0059619 | A1 | 2/2022 | Kubota et al. |
| 2022/0075815 | A1 | 3/2022 | Akimoto et al. |
| 2022/0100943 | A1 | 3/2022 | Oguni et al. |
| 2022/0165311 | A1 | 5/2022 | Kimura et al. |

FOREIGN PATENT DOCUMENTS

| | | | |
|---|---|---|---|
| JP | 03-041935 | A | 2/1991 |
| JP | 2009-027604 | A | 2/2009 |
| JP | 2010-141663 | A | 6/2010 |
| JP | 2011-119711 | A | 6/2011 |
| JP | 2016-123087 | A | 7/2016 |
| JP | 2016-219977 | A | 12/2016 |
| KR | 2012-0091294 | A | 8/2012 |
| WO | WO-2011/055626 | | 5/2011 |

OTHER PUBLICATIONS

Written Opinion (Application No. PCT/IB2021/053188) Dated Jul. 27, 2021.

* cited by examiner

100

<u>100</u>

$$a = x_1 w_1 + x_2 w_2 + b$$

FIG. 18A
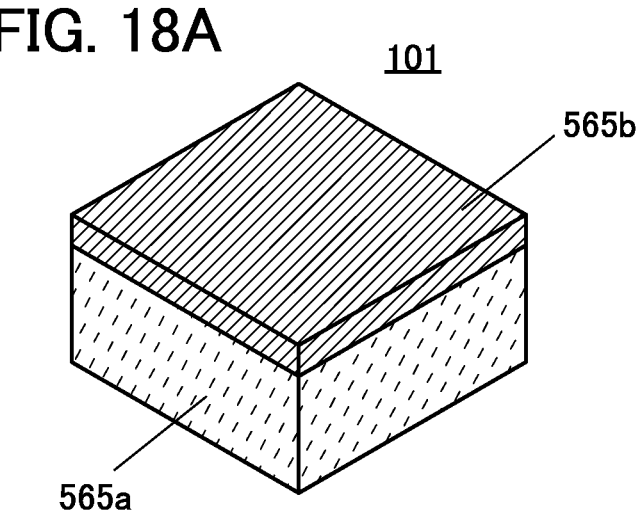
101
565b
565a
FIG. 18B
101
566d
566c
566b
566a
FIG. 18C
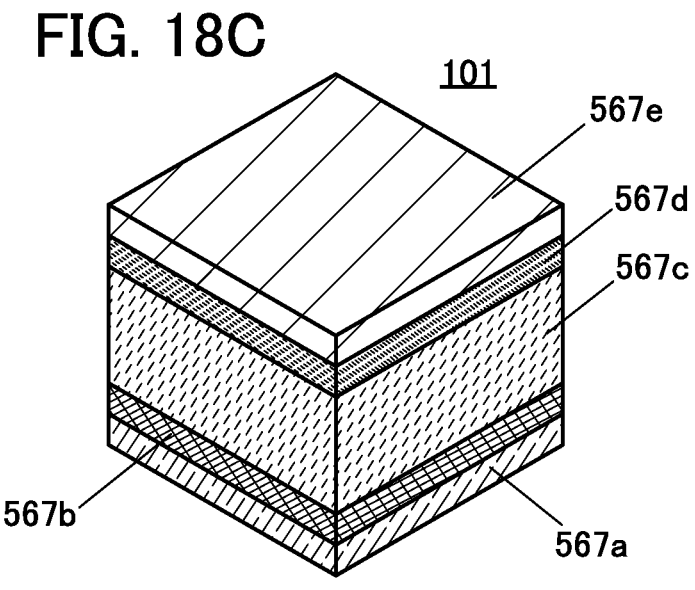
101
567e
567d
567c
567b
567a FIG. 24A
705    701    702 707 706
B1
703 708    B2    735    704
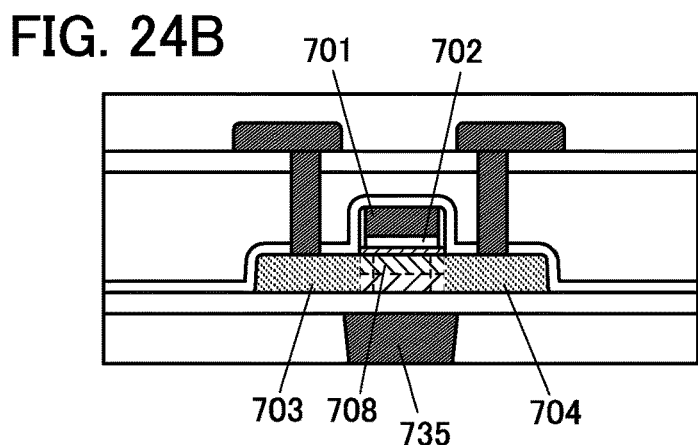
FIG. 24B
701    702
703 708    735    704
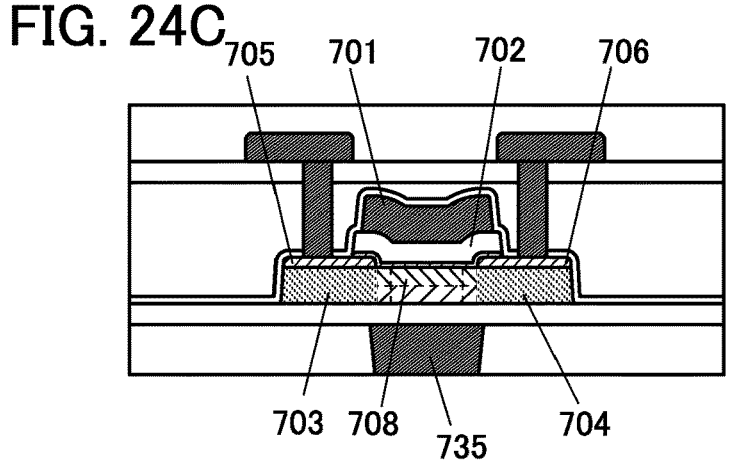
FIG. 24C
705    701    702    706
703 708    735    704
FIG. 24D
708
B1
701
702
707
B2
735
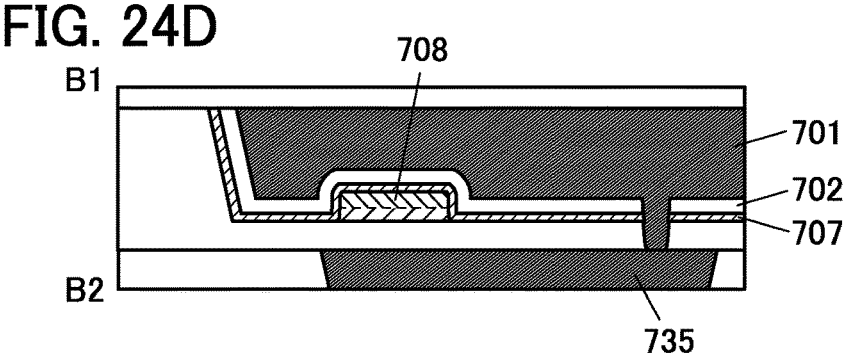

672R   672G   672B

561

562

671

672R   672G   672B   672IR

561

562

671

672R   672G   672B   672UV

561

562

671

FIG. 27A1
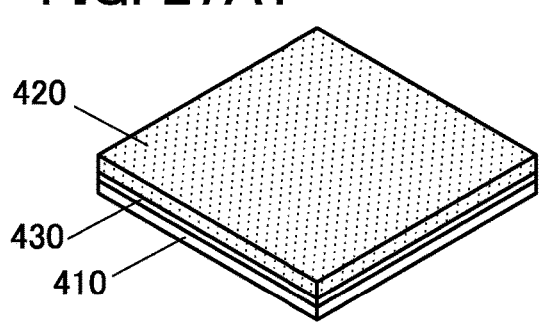
FIG. 27B1
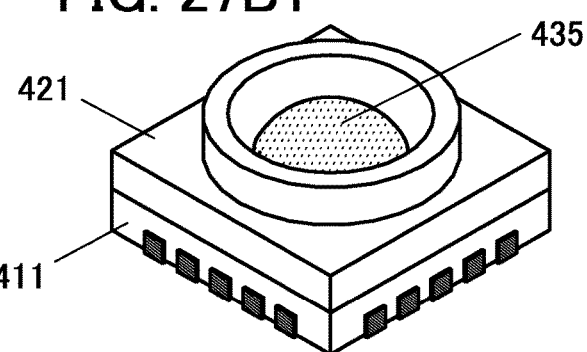
FIG. 27A2
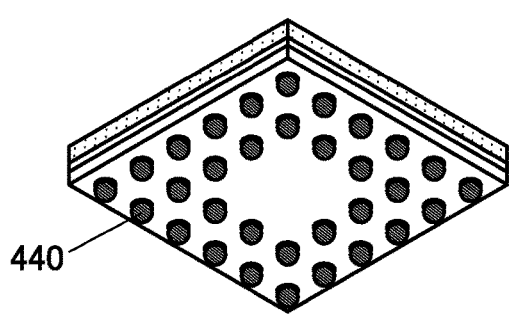
FIG. 27B2
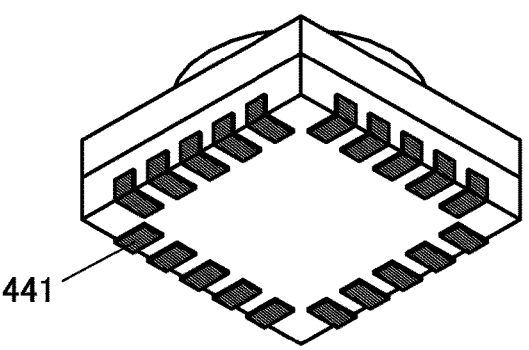
FIG. 27A3
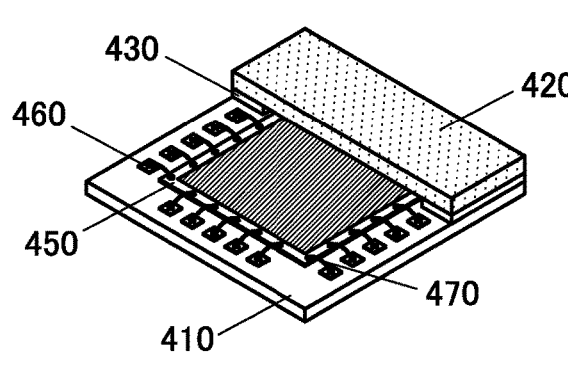
FIG. 27B3
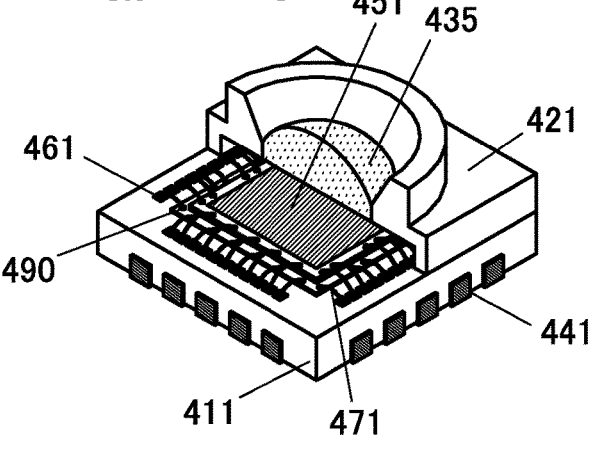

FIG. 28A
985 987 984
982
983
981
986
FIG. 28B
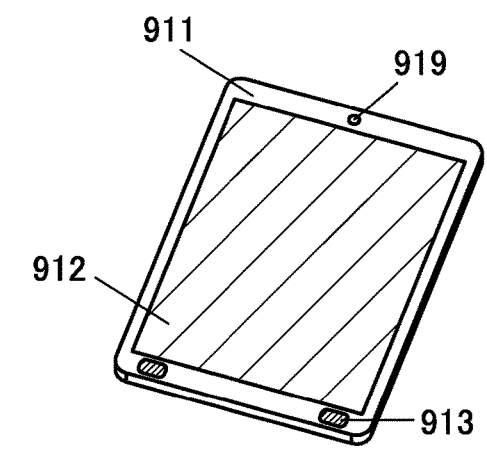
911
919
912
913
FIG. 28C
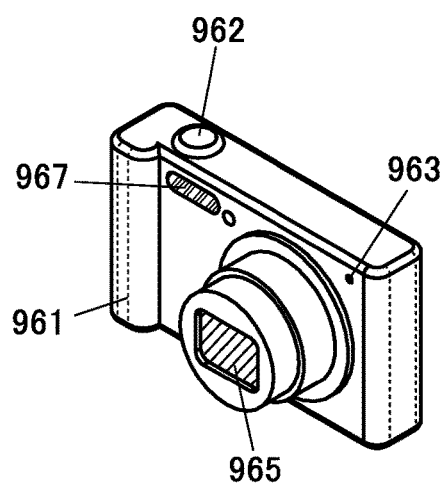
951
952
953
FIG. 28D
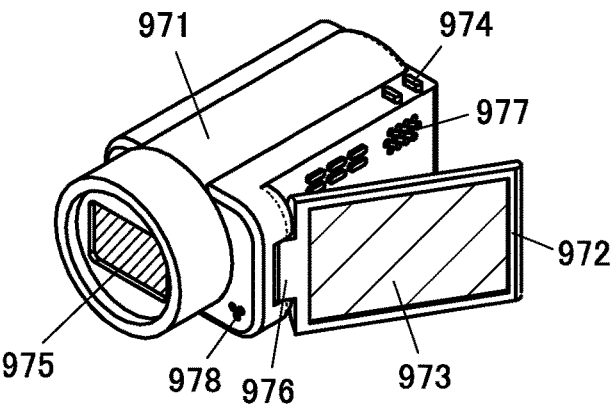
971
974
977
972
975
978 976
973
FIG. 28E
962
967
963
961
965
FIG. 28F
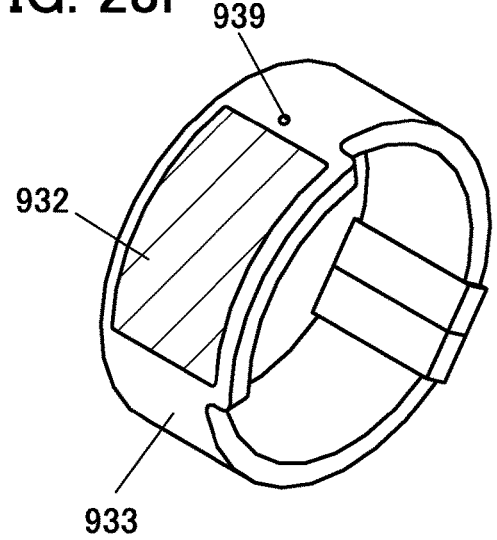
939
932
933

IMAGING DEVICE

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display device, a liquid crystal display device, a light-emitting device, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display device, an imaging device, or an electronic device includes a semiconductor device.

BACKGROUND ART

A technique for forming a transistor using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique which adds an arithmetic function to an imaging device is disclosed in Patent Document 2.

REFERENCE

Patent Document

[Patent Document 1] Japanese Published Patent Application No. 2011-119711
[Patent Document 2] Japanese Published Patent Application No. 2016-123087

SUMMARY OF THE INVENTION

Problems to be Solved by the Invention

An imaging device included in a portable device or the like generally has a function of capturing a high-resolution image. In the next generation, an imaging device is required to be equipped with more intelligent functions.

In the present image data compression, image recognition, or the like, image data captured with an imaging device is taken out of the imaging device, and then subjected to processing. If the processing can be carried out in the imaging device, higher-speed communication with an external device is possible, improving user's convenience. Furthermore, load and power consumption of a peripheral device or the like can be reduced.

To express smooth motion in moving images, increasing the frame rate is preferable. Meanwhile, it is difficult to simply increase the frame rate because as the number of pixels increases, a horizontal period becomes shorter. Therefore, a technique for generating an image for interpolation between frames of an actual image (an interpolation image) is sometimes used. However, in the case where the frame rate for obtaining an actual image is rather high, it is likely to be difficult to ensure a time for generating an interpolation image.

In view of the above, an object of one embodiment of the present invention is to provide an imaging device capable of image processing. Another object is to provide an imaging device capable of generating an image for interpolation between frames. Another object is to provide an imaging device capable of capturing a high-quality moving image. Another object is to provide an imaging device functioning as some components of a neural network. Another object is to provide an imaging device with low power consumption. Another object is to provide a highly reliable imaging device. Another object is to provide a novel imaging device or the like. Another object is to provide a method for driving the above-described imaging device. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is an imaging device including a plurality of pixels. The pixel has a function of generating first data of an n-th frame by supplying a first weight to image data obtained in the n-th frame (n is an integer greater than or equal to 2). The pixel has a function of generating first data of an n−1-th frame by supplying a second weight to image data obtained in the n−1-th frame. The pixel has a function of generating second data by adding the first data of the n−1-th frame and the first data of the n-th frame.

One embodiment of the present invention is an imaging device including a plurality of pixels and a plurality of first circuits. The pixels are arranged in a matrix. The first circuit is electrically connected to the plurality of pixels arranged in a column direction. The pixel includes a second circuit and a third circuit. One of the second circuit and the third circuit has a function of generating first data of an n-th frame by supplying a first weight to image data obtained in the n-th frame (n is an integer greater than or equal to 2). The other of the second circuit and the third circuit has a function of generating first data of an n−1-th frame by supplying a second weight to image data obtained in the n−1-th frame. The pixel has a function of generating second data by adding the first data of the n−1-th frame and the first data of the n-th frame. The first circuit has a function of generating third data corresponding to the sum of the second data generated by the pixels.

In the above imaging device, the pixel preferably includes a photoelectric conversion device and a first transistor. The second circuit and the third circuit each include a second transistor, a third transistor, a fourth transistor, a fifth transistor, and a first capacitor. One electrode of the photoelectric conversion device is electrically connected to one of a source and a drain of the second transistor. The other of the source and the drain of the second transistor is electrically connected to one of a source and a drain of the third transistor. The one of the source and the drain of the third transistor is electrically connected to a gate of the fourth transistor. The gate of the fourth transistor is electrically connected to one electrode of the first capacitor. The other electrode of the first capacitor is electrically connected to one of a source and a drain of the fifth transistor. One of a source and a drain of the fourth transistor is electrically connected to one of a source and a drain of the first transistor. The other of the source and the drain of the first transistor is electrically connected to the first circuit.

In the above imaging device, the other of the fifth transistor is preferably electrically connected to a first wiring. The first wiring is supplied with either a potential corresponding to the first weight or a potential corresponding to the second weight.

In the above imaging device, the pixel preferably includes a photoelectric conversion device and a first transistor. The second circuit and the third circuit each include a second transistor, a third transistor, a fourth transistor, and a first capacitor. One electrode of the photoelectric conversion device is electrically connected to one of a source and a drain of the second transistor. The other of the source and the drain of the second transistor is electrically connected to one of a source and a drain of the third transistor. The one of the source and the drain of the third transistor is electrically connected to a gate of the fourth transistor. The gate of the fourth transistor is electrically connected to one electrode of the first capacitor. One of a source and a drain of the fourth transistor is electrically connected to one of a source and a drain of the first transistor. The other of the source and the drain of the first transistor is electrically connected to the first circuit. The fourth transistor includes a back gate.

In the above imaging device, the back gate is preferably electrically connected to a first wiring. The first wiring is supplied with either a potential corresponding to the first weight or a potential corresponding to the second weight.

In the above imaging device, the first circuit preferably includes a sixth transistor, a seventh transistor, an eighth transistor, a ninth transistor, a tenth transistor, and a second capacitor. One electrode of the second capacitor is electrically connected to the plurality of pixels. The one electrode of the second capacitor is electrically connected to the sixth transistor. The other electrode of the second capacitor is electrically connected to one of a source and a drain of the seventh transistor. The one of the source and the drain of the seventh transistor is electrically connected to a gate of the eighth transistor. One of a source and a drain of the eighth transistor is electrically connected to one of a source and a drain of the ninth transistor. The one of the source and the drain of the ninth transistor is electrically connected to one of a source and a drain of the tenth transistor.

In the above imaging device, any one or more of the transistors of the pixel and the first circuit preferably contain a metal oxide in a channel formation region. The metal oxide contains In, Zn, and an element M (M is one or more of Al, Ti, Ga, Ge, Sn, Y, Zr, La, Ce, Nd, and Hf).

In the above imaging device, any one or more of the transistors of the pixel and the first circuit preferably contain silicon in a channel formation region.

Effect of the Invention

With one embodiment of the present invention, an imaging device capable of image processing can be provided. An imaging device capable of generating an image for interpolation between frames can be provided. An imaging device capable of capturing a high-quality moving image can be provided. An imaging device functioning as some components of a neural network can be provided. An imaging device with low power consumption can be provided. A highly reliable imaging device can be provided. A novel imaging device or the like can be provided. A method for driving the above-described imaging device can be provided. A novel semiconductor device or the like can be provided.

BRIEF DESCRIPTION OF THE DRAWINGS

FIG. 18A to FIG. 18C are diagrams illustrating structures of a photoelectric conversion device.
FIG. 24A to FIG. 24D are diagrams illustrating OS transistors.
FIG. 27A1 to FIG. 27A3 and FIG. 27B1 to FIG. 27B3 are perspective views of a package and a module in each of which an imaging device is placed.
FIG. 28A to FIG. 28F are diagrams illustrating electronic devices.

MODE FOR CARRYING OUT THE INVENTION

Figure 1:
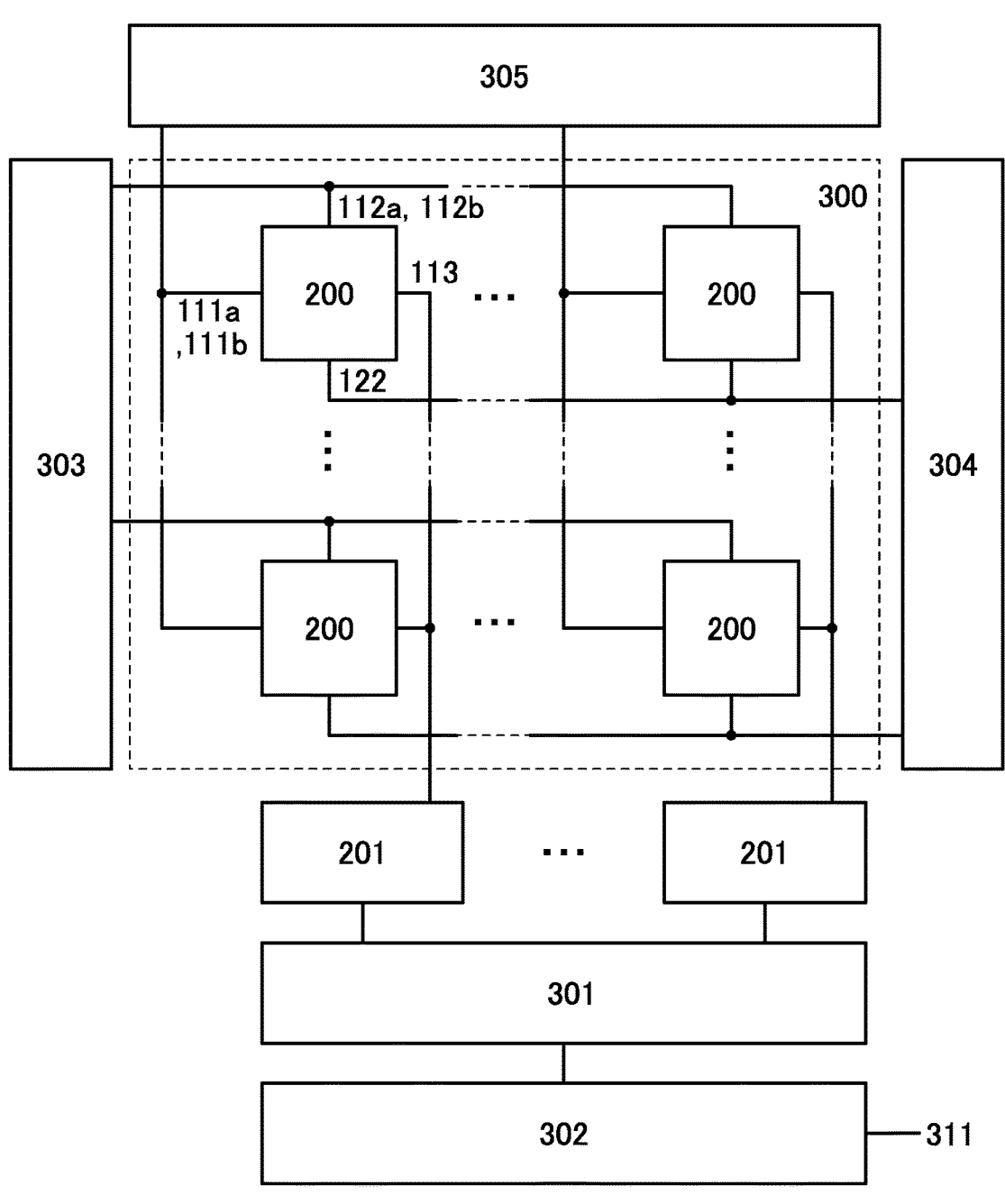
FIG. 1 is a block diagram illustrating an imaging device.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the description of the embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a structure is included in direct connection.

Embodiment 1

In this embodiment, an imaging device capable of image processing is described with reference to drawings.

One embodiment of the present invention is an imaging device having an additional function such as image processing. The imaging device has a function of retaining analog data (image data) obtained by an imaging operation in pixels and extracting data obtained by multiplying the analog data by a predetermined weight coefficient. The imaging device also has a function of adding the data output from the plurality of pixels (a product-sum operation function).

In addition, when the data taken out from the pixels is taken in a neural network or the like provided inside or outside the imaging device, processing such as image recognition can be performed. Since, in the imaging device which is one embodiment of the present invention, an enormous amount of image data can be retained in pixels in an analog data state and an arithmetic operation can be performed in the pixels, processing can be performed efficiently.

One embodiment of the present invention is the imaging device having a function of generating an image for interpolation between frames (an interpolation image). In the imaging device, the pixel has a function of, in an n-th frame, supplying a predetermined weight to image data obtained by imaging in the n-th frame to generate first data of the n-th frame. The pixel also has a function of retaining image data obtained by imaging in an n−1-th frame and a function of, in the n-th frame, supplying a predetermined weight to the image data obtained by the imaging in the n−1-th frame to generate first data of the n−1-th frame. The pixel also has a function of adding the first data of the n−1-th frame and the first data of the n-th frame to generate second data. The second data can be favorably used as image data for interpolation between frames, for example.

<Imaging Device>

FIG. 1 is a block diagram of an imaging device which is one embodiment of the present invention. The imaging device includes a pixel array 300, a circuit 201, a circuit 301, a circuit 302, a circuit 303, a circuit 304, and a circuit 305. Note that one or more of the circuit 201, the circuit 301, the circuit 302, the circuit 303, the circuit 304, and the circuit 305 may include a region overlapping with the pixel array 300. Such a structure can reduce the area of the imaging device.

In the imaging device of one embodiment of the present invention, a circuit having two or more functions among the functions of the circuit 201 and the circuit 301 to the circuit 305 may be used alternatively. Moreover, a circuit other than the circuit 201 and the circuit 301 to the circuit 305 may also be used. Furthermore, one or more of the functions of the circuit 201 and the circuit 301 to the circuit 305 may be replaced by a software operation. Some of the circuit 201 and the circuit 301 to the circuit 305 may be placed outside the imaging device.

The pixel array 300 can have an imaging function and an arithmetic function. The circuit 201 and the circuit 301 can each have an arithmetic function. The circuit 302 can have an arithmetic function or a data conversion function, and can output data to a wiring 311. The circuit 303 and the circuit 304 can each have a selection function. The circuit 305 can have a function of supplying a potential (weight or the like) to a pixel. As the circuit having a selection function, a shift register, a decoder, or the like can be used.

The pixel array 300 includes a plurality of pixel blocks 200 arranged in a matrix. The circuit 201 is electrically connected to the plurality of pixel blocks 200 arranged in the column direction. Each of the pixel blocks 200 is electrically connected to the circuit 201 through a wiring 113.

Figure 2:
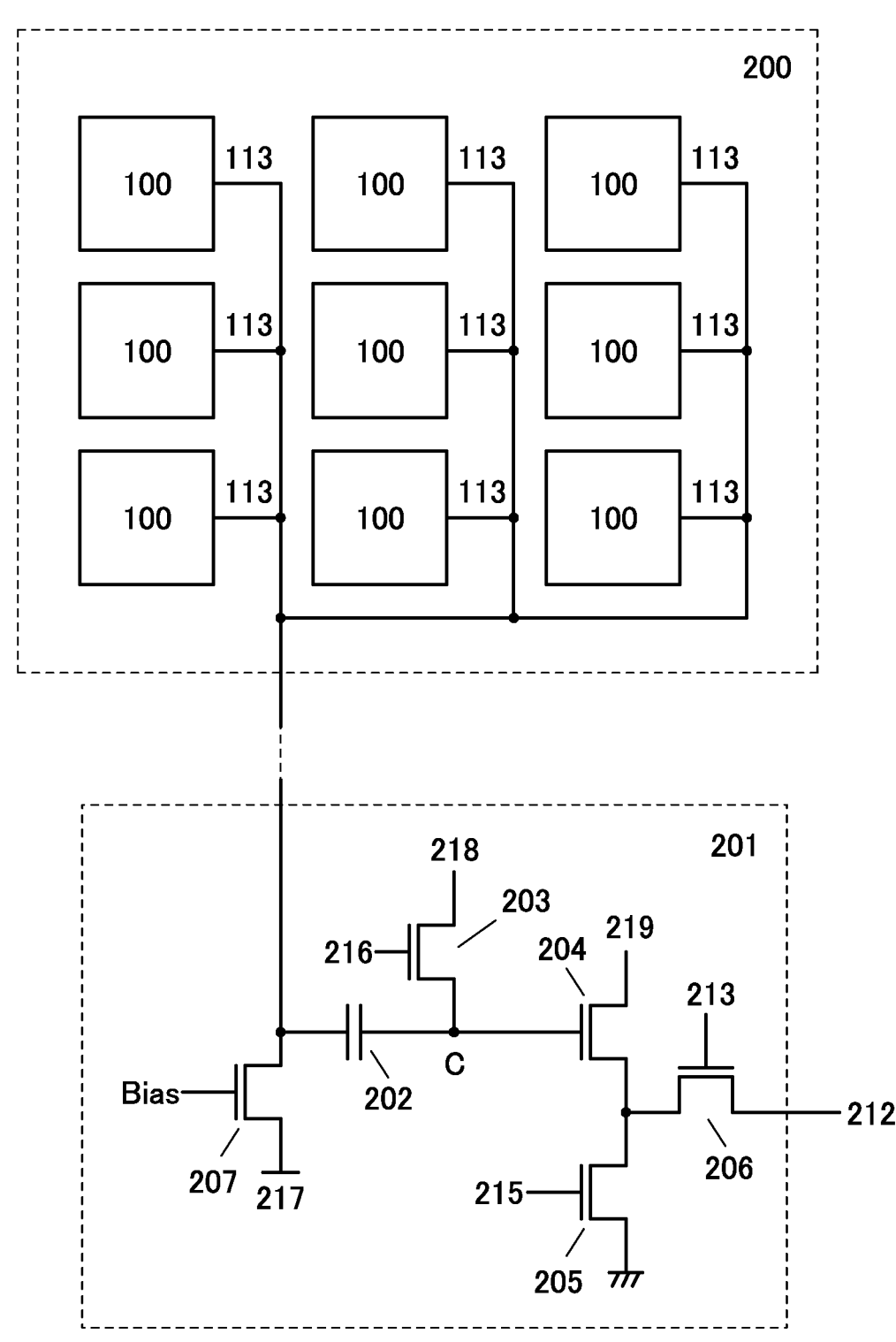
FIG. 2 is a diagram illustrating a pixel block and a circuit.

FIG. 2 shows a block diagram of the pixel block 200. FIG. 2 also shows a circuit diagram of the circuit 201. The pixel block 200 includes a plurality of pixels 100 arranged in a matrix, and each of the pixels 100 is electrically connected to the circuit 201 through the wiring 113. Note that the circuit 201 can also be provided in the pixel block 200.

The pixels 100 have a function of obtaining image data and generate data obtained by adding the image data and a weight coefficient. Note that the pixels 100 included in the pixel block 200 are arranged in three rows and three columns in FIG. 2, but one embodiment of the present invention is not limited to this. The pixels included in the pixel block 200 can be arranged in two rows and two columns, four rows and four columns, or the like. Alternatively, the number of pixels in the horizontal direction and the number of pixels in the vertical direction may differ from each other. Furthermore, some pixels may be shared by adjacent pixel blocks.

Figure 3:
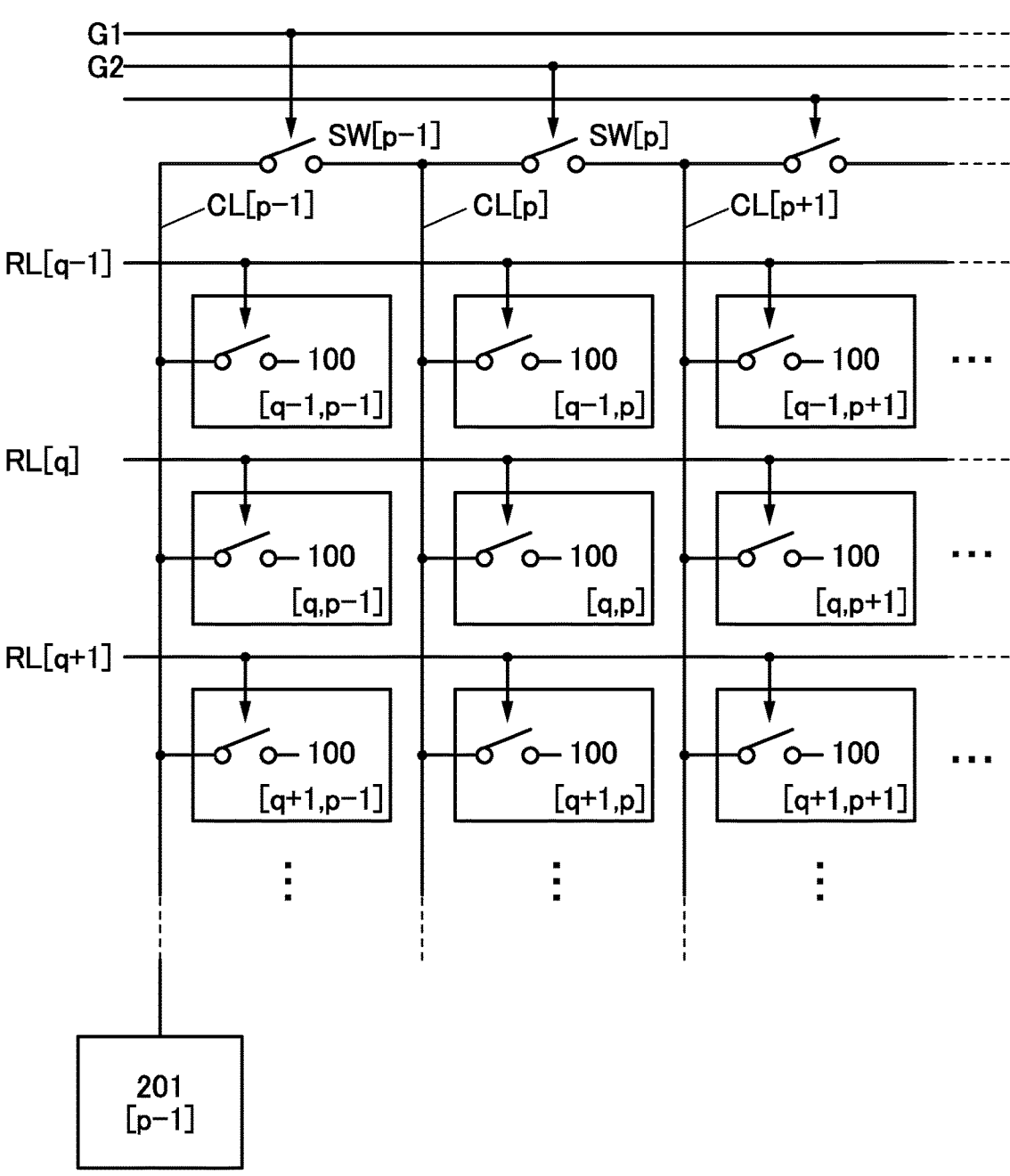
FIG. 3 is a diagram illustrating a pixel block.

For example, when a structure illustrated in FIG. 3 is employed, the number of pixels 100 included in the pixel block 200 can be variable. FIG. 3 illustrates the plurality of pixels 100 arranged in a [q−1]-th row to a [q+1] row and a [p−1]-th column to a [p+1]-th column (p and q are each an integer greater than or equal to 2). A selection switch is provided in each pixel 100, and "ON"/"OFF" of the selection switch is controlled by a selection signal supplied to each of row wirings RL[q−1] to RL[q+1]. The selection switch is electrically connected to any of column wirings CL[p−1] to CL[p+1]. At least one of the column wirings is electrically connected to the circuit 201.

A conduction switch SW[p−1] is provided between the column wirings CL[p−1] and CL[p], and a conduction switch SW[p] is provided between the column wirings CL[p] and CL[p+1]. By selection signals supplied to a signal line G1 and a signal line G2, "ON"/"OFF" of the conduction switches is controlled. When the selection switch is turned "ON", electrical continuity can be established between adjacent column wirings.

For example, when signals for turning "ON" the selection switches are supplied to the row wirings RL[q−1] and RL[q] and a signal for turning "ON" the conduction switch SW[p−

1] is supplied to the signal line G1, the pixels 100 arranged in two rows and two columns (a pixel 100[$q$-1, $p$-1], a pixel 100[$q$-1, $p$], a pixel 100[$q$, $p$-1] and a pixel 100[$q$, $p$]) are selected. In addition, electrical continuity is established between the column wiring CL[$p$-1] and the column wiring CL[$p$]. Thus, the above pixels 100 arranged in two rows and two columns are electrically connected to the circuit 201.

Furthermore, when a signal for turning "ON" the selection switch is supplied to the row wiring RL[$q$+1] and a signal for turning "ON" the conduction switch SW[$p$] is supplied to the signal line G2, the pixels 100 arranged in three rows and three columns are electrically connected to the circuit 201.

The pixel block 200 and the circuit 201 can operate as a product-sum operation circuit.

Structure Example 1 of Pixel Circuit

Figure 4:
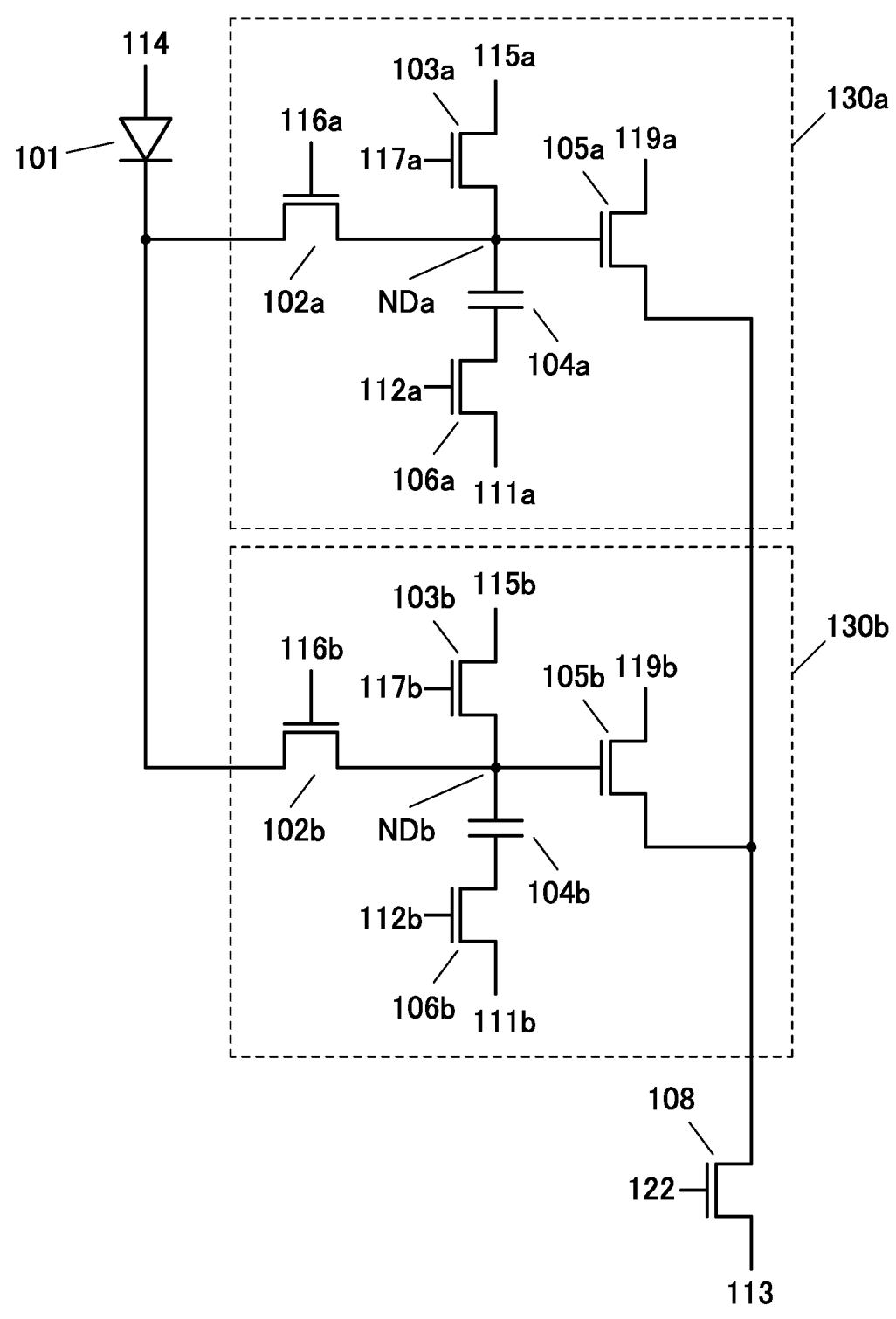
FIG. 4 is a diagram illustrating a pixel.

FIG. 4 shows a circuit diagram of the pixel 100. The pixel 100 includes a photoelectric conversion device 101, a circuit 130$a$, a circuit 130$b$, and a transistor 108. The photoelectric conversion device 101 is electrically connected to the transistor 108 through the circuit 130$a$. Moreover, the photoelectric conversion device 101 is electrically connected to the transistor 108 through the circuit 130$b$.

As the photoelectric conversion device 101, a photodiode can be used. In order to increase the light detection sensitivity under low illuminance conditions, an avalanche photodiode can be suitably used.

The circuit 130$a$ and the circuit 130$b$ each have a function of generating first data by supplying a weight with use of a filter to image data of an image obtained by the photoelectric conversion device 101, and retaining the first data. In an n-th frame, one of the circuit 130$a$ and the circuit 130$b$ has a function of supplying a weight with use of a filter to image data obtained in the n-th frame (n is an integer greater than or equal to 2), and generating first data of the n-th frame. In the n-th frame, the other of the circuit 130$a$ and the circuit 130$b$ has a function of supplying a weight with use of a filter to retained image data of an n−1-th frame, and generating first data of the n−1-th frame.

The imaging device which is one embodiment of the present invention can generate second data from the first data of the n-th frame, which is generated from the image data obtained in the n-th frame, and the first data of the n−1-th frame, which is generated from the image data obtained in the n−1-th frame. The second data can be favorably used as image data for interpolation between frames, for example.

Figure 5:
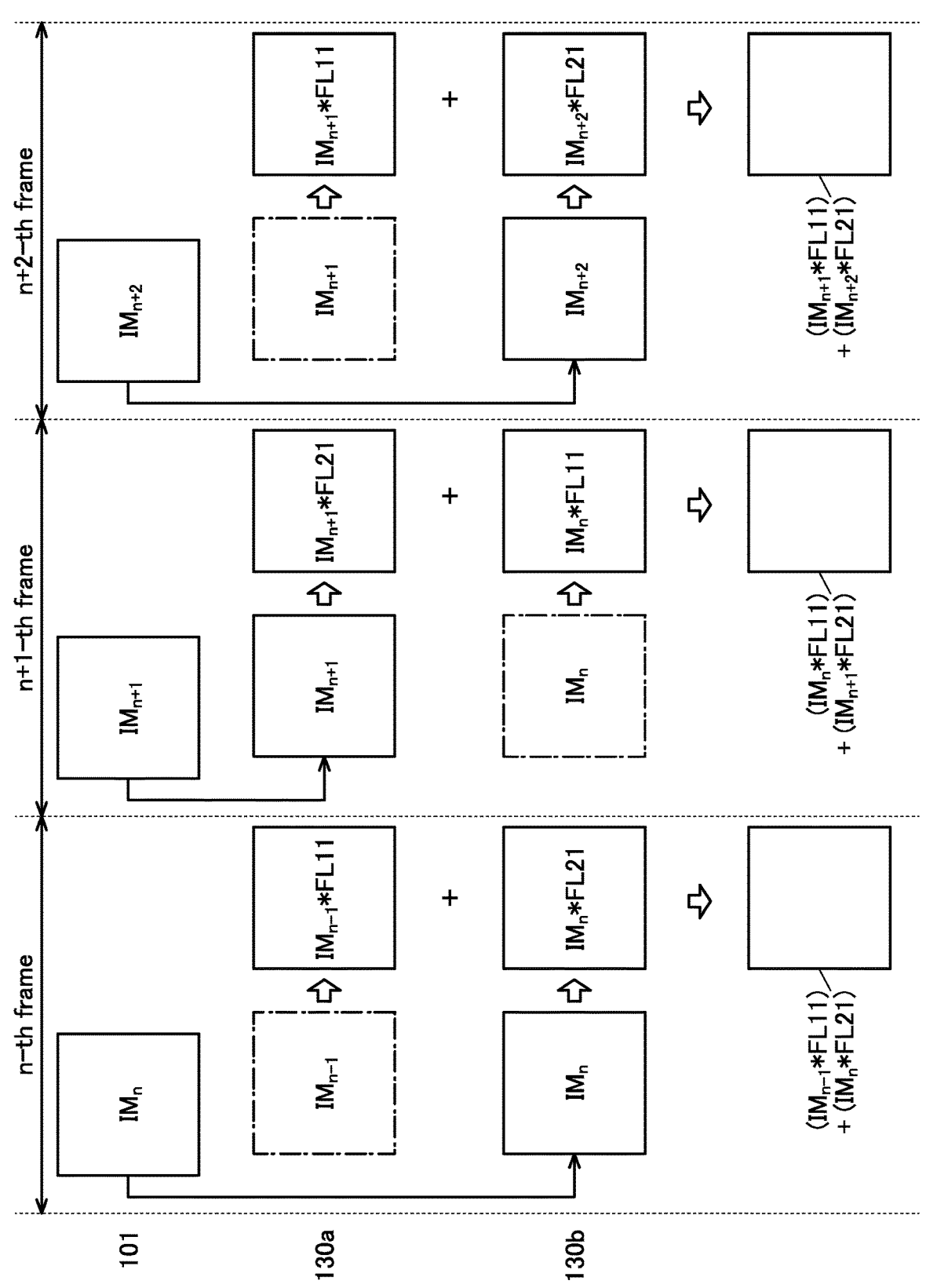
FIG. 5 is a conceptual diagram showing an operation of an imaging device.

FIG. 5 shows a conceptual diagram of an operation of the imaging device which is one embodiment of the present invention. FIG. 5 shows operations in three frames, the n-th frame to an n+2-th frame, as an example.

In the n-th frame, the photoelectric conversion device 101 is operated to obtain image data $IM_n$. In the n-th frame, the circuit 130$b$ supplies a weight with use of a second filter FL21 to the image data $IM_n$ to generate first data $IM_n$*FL21. In the n-th frame, the circuit 130$a$ supplies a weight with use of a first filter FL11 to retained image data $IM_{n-1}$ obtained in the n−1-th frame to generate first data $IM_{n-1}$*FL11. Then, the first data $IM_n$*FL21 of the n-th frame is added to the first data $IM_{n-1}$*FL11 of the n−1-th frame, whereby second data $(IM_{n-1}$*FL11$)+(IM_n$*FL21$)$ is generated. The generated second data $(IM_{n-1}$*FL11$)+(IM_n$*FL21$)$ is output from the pixel 100.

In the n-th frame, a weight is supplied with use of the second filter FL21 to the image data $IM_n$ obtained in the n-th frame, and a weight is supplied with use of the first filter FL11 to the image data $IM_{n-1}$ obtained in the n−1-th frame, which is the previous frame.

Note that in this specification and the like, first data generated by supplying a weight with use of a filter to image data is sometimes denoted using "*". For example, first data generated by supplying a weight with use of the first filter FL11 to the image data $IM_n$ is sometimes denoted by first data $IM_n$*FL11. Moreover, second data generated from first data is sometimes denoted using "+". For example, second data generated by adding first data $IM_{n+1}$*FL21 to the first data $IM_n$*FL11 is sometimes denoted by second data $(IM_n$*FL11$)+(IM_{n+1}$*FL21$)$.

In the n+1-th frame, the photoelectric conversion device 101 is operated to obtain image data $IM_{n+1}$. In the n+1-th frame, the circuit 130$a$ supplies a weight with use of the second filter FL21 to the image data $IM_{n+1}$ to generate first data $IM_{n+1}$*FL21. In the n+1-th frame, the circuit 130$b$ supplies a weight with use of the first filter FL11 to the retained image data $IM_n$ obtained in the n-th frame to generate first data $IM_n$*FL11. Then, the first data $IM_{n+1}$*FL21 of the n+1-th frame is added to the first data $IM_n$*FL11 of the n-th frame, whereby second data $(IM_n$*FL11$)+(IM_{n+1}$*FL21$)$ is generated. The generated second data $(IM_n$*FL11$)+(IM_{n+1}$*FL21$)$ is output from the pixel 100.

In the n+1-th frame, a weight is supplied with use of the second filter FL21 to the image data $IM_{n+1}$ obtained in the n+1-th frame, and a weight is supplied with use of the first filter FL11 to the image data $IM_n$ obtained in the n-th frame, which is the previous frame.

In the n+2-th frame, the photoelectric conversion device 101 is operated to obtain image data $IM_{n+2}$. In the n+2-th frame, the circuit 130$b$ supplies a weight with use of the second filter FL21 to the image data $IM_{n+2}$ to generate first data $IM_{n+2}$*FL21. In the n+2-th frame, the circuit 130$a$ supplies a weight with use of the first filter FL11 to the retained image data $IM_{n+1}$ obtained in the n+1-th frame to generate first data $IM_{n+1}$*FL11. Then, the first data $IM_{n+2}$*FL21 of the n+2-th frame is added to the first data $IM_{n+1}$*FL11 of the n+1-th frame, whereby second data $(IM_{n+1}$*FL11$)+(IM_{n+2}$*FL21$)$ is generated. The generated second data $(IM_{n+1}$*FL11$)+(IM_{n+2}$*FL21$)$ is output from the pixel 100.

In the n+2-th frame, a weight is supplied with use of the second filter FL21 to the image data $IM_{n+2}$ obtained in the n+2-th frame, and a weight is supplied with use of the first filter FL11 to the image data $IM_{n+1}$ obtained in the n+1-th frame, which is the previous frame.

In each of the frames, a weight is supplied with use of the second filter FL21 to image data obtained in the present frame, and a weight is supplied with use of the first filter FL11 to image data obtained in the previous frame.

Also in the subsequent frames, operations similar to the above can be performed.

Here, the size (number of pixels) of each of the first filter FL11 and the second filter FL21 can be, for example, two rows and two columns, three rows and three columns, or four rows and four columns. The size (number of pixels) of each of the first filter FL11 and the second filter FL21 in a horizontal direction and the size (number of pixels) in a vertical direction may differ from each other. The size (number of pixels) of each of the first filter FL11 and the second filter FL21 can be the same as the number of pixels included in the pixel block 200. For example, in the case where the pixel block 200 includes pixels arranged in three rows and three columns, the first filter FL11 and the second filter FL21 each having a size of three rows and three columns can be used. Components (weights) included in the first filter FL11 and the second filter FL21 may have the same structure or different structures.

Although FIG. 5 shows the example in which the circuit 130$a$ and the circuit 130$b$ each use one kind of filter, one embodiment of the present invention is not limited thereto. The circuit 130$a$ and the circuit 130$b$ may each use a plurality of kinds of filters. In the case of using a plurality of kinds of filters, components (weights) included in the filters can have different structures. By using a plurality of kinds of filters including different components (weights), a plurality of kinds of feature values can be extracted from obtained image data, leading to high-accuracy image processing. For example, by using second data as image data for interpolation between frames, a smooth moving image can be obtained, whereby an imaging device capable of capturing a high-quality moving image can be provided. In particular, even when the frame frequency is low, a smooth moving image can be obtained.

Figure 6:
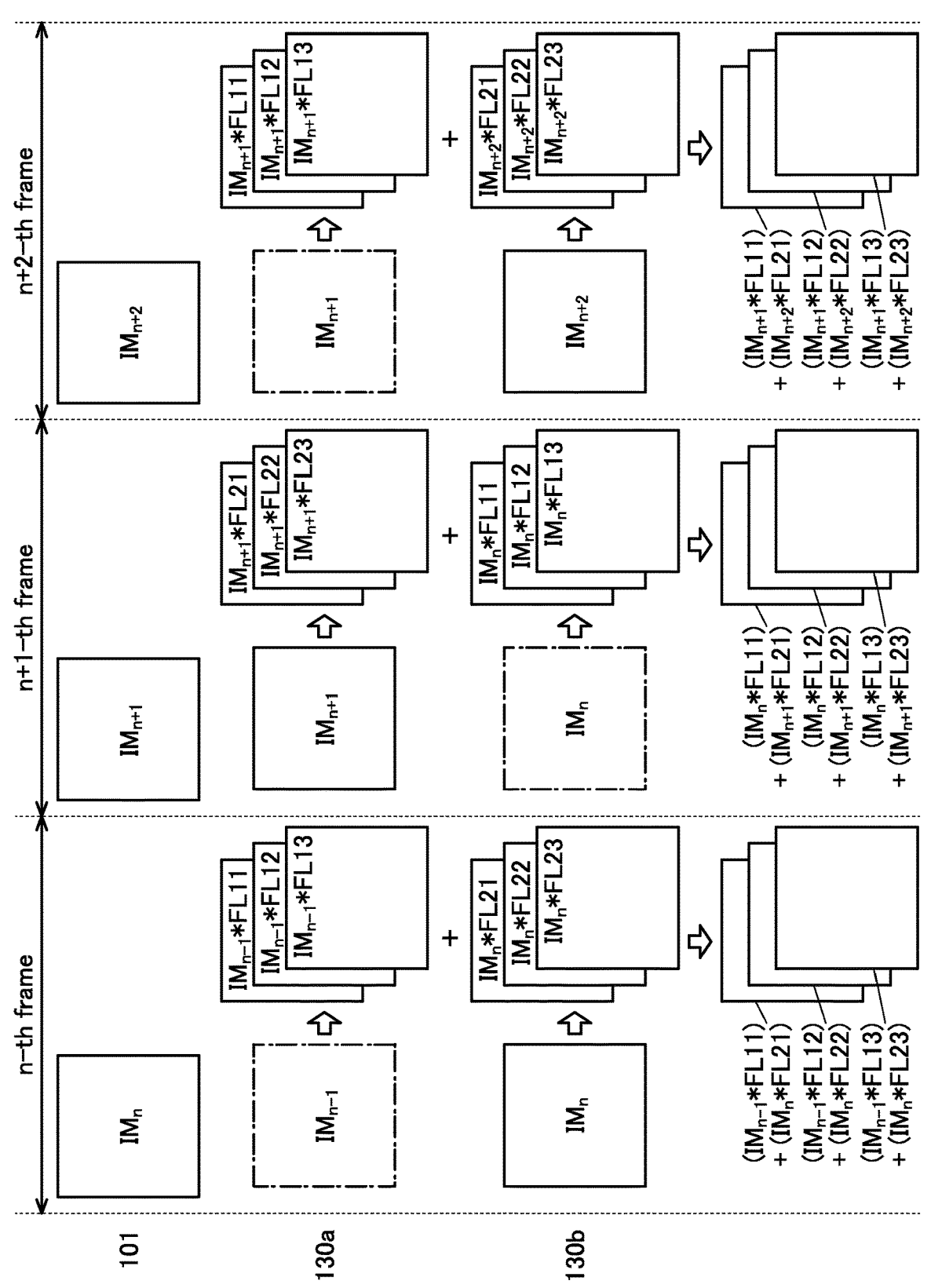
FIG. 6 is a conceptual diagram showing an operation of an imaging device.

FIG. 6 shows an example in which the circuit 130$a$ and the circuit 130$b$ each use three kinds of filters. FIG. 6 shows operations in three frames, the n-th frame to the n+2-th frame, as an example.

In the n-th frame, the photoelectric conversion device 101 is operated to obtain image data $IM_n$. In the n-th frame, the circuit 130$b$ supplies weights with use of the second filter FL21, a fourth filter FL22, and a sixth filter FL23 to the image data $IM_n$ to generate first data $IM_n$*FL21, first data $IM_n$*FL22, and first data $IM_n$*FL23. In the n-th frame, the circuit 130$a$ supplies weights with use of the first filter FL11, a third filter FL12, and a fifth filter FL13 to retained image data $IM_{n-1}$ obtained in the n−1-th frame to generate first data $IM_{n-1}$*FL11, first data $IM_{n-1}$*FL12, and first data $IM_{n-1}$*FL13.

The first data $IM_n$*FL21 of the n-th frame is added to the first data $IM_{n-1}$*FL11 of the n−1-th frame, whereby second data $(IM_{n-1}$*FL11$)+(IM_n$*FL21$)$ is generated. The first data $IM_n$*FL22 of the n-th frame is added to the first data $IM_{n-1}$*FL12 of the n−1-th frame, whereby second data $(IM_{n-1}$*FL12$)+(IM_n$*FL22$)$ is generated. The first data $IM_n$*FL23 of the n-th frame is added to the first data $IM_{n-1}$*FL13 of the n−1-th frame, whereby second data $(IM_{n-1}$*FL13$)+(IM$*FL23$)$ is generated. The generated second data $(IM_{n-1}$*FL11$)+(IM_n$*FL21$)$, second data $(IM_{n-1}$*FL12$)+(IM_n$*FL22$)$, and second data $(IM_{n-1}$*FL13$)+(IM_n$*FL23$)$ are output from the pixel 100.

In the n-th frame, weights are supplied with use of the second filter FL21, the fourth filter FL22, and the sixth filter FL23 to the image data $IM_n$ obtained in the n-th frame, and weights are supplied with use of the first filter FL11, the third filter FL12, and the fifth filter FL13 to the image data $IM_{n-1}$ obtained in the n−1-th frame, which is the previous frame.

In the n+1-th frame, the photoelectric conversion device 101 is operated to obtain image data $IM_{n+1}$. In the n+1-th frame, the circuit 130$a$ supplies weights with use of the second filter FL21, the fourth filter FL22, and the sixth filter FL23 to the image data $IM_{n+1}$ to generate first data $IM_{n+1}$*FL21, first data $IM_{n+1}$*FL22, and first data $IM_{n+1}$*FL23. In the n+1-th frame, the circuit 130$b$ supplies weights with use of the first filter FL11, the third filter FL12, and the fifth filter FL13 to the retained image data $IM_n$ obtained in the n-th frame to generate first data $IM_n$*FL11, first data $IM_n$*FL12, and first data $IM_n$*FL13.

The first data $IM_{n+1}$*FL21 of the n+1-th frame is added to the first data $IM_n$*FL11 of the n-th frame, whereby second data $(IM_n$*FL11$)+(IM_{n+1}$*FL21$)$ is generated. The first data $IM_{n+1}$*FL22 of the n+1-th frame is added to the first data $IM_n$*FL12 of the n-th frame, whereby second data $(IM_n$*FL12$)+(IM_{n+1}$*FL22$)$ is generated. The first data $IM_{n+1}$*FL23 of the n+1-th frame is added to the first data $IM_n$*FL13 of the n-th frame, whereby second data $(IM_n$*FL13$)+(IM_{n+1}$*FL23$)$ is generated. The generated second data $(IM_n$*FL11$)+(IM_{n+1}$*FL21$)$, second data $(IM_n$*FL12$)+(IM_{n+1}$*FL22$)$, and second data $(IM_n$*FL13$)+(IM_{n+1}$*FL23$)$ are output from the pixel 100.

In the n+1-th frame, weights are supplied with use of the second filter FL21, the fourth filter FL22, and the sixth filter FL23 to the image data $IM_{n+1}$ obtained in the n+1-th frame, and weights are supplied with use of the first filter FL11, the third filter FL12, and the fifth filter FL13 to the image data $IM_n$ obtained in the n-th frame, which is the previous frame.

In the n+2-th frame, the photoelectric conversion device 101 is operated to obtain image data $IM_{n+2}$. In the n+2-th frame, the circuit 130$b$ supplies weights with use of the second filter FL21, the fourth filter FL22, and the sixth filter FL23 to the image data $IM_{n+2}$ to generate first data $IM_{n+2}$*FL21, first data $IM_{n+2}$*FL22, and first data $IM_{n+2}$*FL23. In the n+2-th frame, the circuit 130$a$ supplies weights with use of the first filter FL11, the third filter FL12, and the fifth filter FL13 to the retained image data $IM_{n+1}$ obtained in the n+1-th frame to generate first data $IM_{n+1}$*FL11, first data $IM_{n+1}$*FL12, and first data $IM_{n+1}$*FL13.

The first data $IM_{n+2}$*FL21 of the n+2-th frame is added to the first data $IM_{n+1}$*FL11 of the n+1-th frame, whereby second data $(IM_{n+1}$*FL11$)+(IM_{n+2}$*FL12$)$ is generated. The first data $IM_{n+2}$*FL22 of the n+2-th frame is added to the first data $IM_{n+1}$*FL12 of the n+1-th frame, whereby second data $(IM_{n+1}$*FL12$)+(IM_{n+2}$*FL12$)$ is generated. The first data $IM_{n+2}$*FL23 of the n+2-th frame is added to the first data $IM_{n+1}$*FL13 of the n+1-th frame, whereby second data $(IM_{n+1}$*FL13$)+(IM_{n+2}$*FL23$)$ is generated. Second data $(IM_{n+1}$*FL11$)+(IM_{n+2}$*FL21$)$, second data $(IM_{n+1}$*FL12$)+(IM_{n+2}$*FL22$)$, and the second data $(IM_{n+1}$*FL13$)+(IM_{n+2}$*FL23$)$, which are generated, are output from the pixel 100.

In the n+2-th frame, weights are supplied with use of the second filter FL21, the fourth filter FL22, and the sixth filter FL23 to the image data $IM_{n+2}$ obtained in the n+2-th frame, and weights are supplied with use of the first filter FL11, the third filter FL12, and the fifth filter FL13 to the image data $IM_{n+1}$ obtained in the n+1-th frame, which is the previous frame.

In each of the frames, weights are supplied with use of the second filter FL21, the fourth filter FL22, and the sixth filter FL23 to image data obtained in the present frame, and weights are supplied with use of the first filter FL11, the third filter FL12, and the fifth filter FL13 to image data obtained in the previous frame.

Also in the subsequent frames, operations similar to the above can be performed.

The structures of the circuit 130$a$ and the circuit 130$b$ will be described with reference to FIG. 4.

The circuit 130$a$ includes a transistor 102$a$, a transistor 103$a$, a capacitor 104$a$, a transistor 105$a$, and a transistor 106$a$. One electrode of the photoelectric conversion device 101 is electrically connected to one of a source and a drain of the transistor 102$a$. The other of the source and the drain of the transistor 102$a$ is electrically connected to one of a source and a drain of the transistor 103$a$, one electrode of the capacitor 104$a$, and a gate of the transistor 105$a$. One of a source and a drain of the transistor 105$a$ is electrically connected to one of a source and a drain of the transistor 108. The other electrode of the capacitor 104$a$ is electrically connected to one of a source and a drain of a transistor 106$b$.

The other electrode of the photoelectric conversion device 101 is electrically connected to a wiring 114. The other of the source and the drain of the transistor 108 is electrically connected to the wiring 113. A gate of the transistor 108 is electrically connected to a wiring 122.

A gate of the transistor 102a is electrically connected to a wiring 116a. The other of the source and the drain of the transistor 103a is electrically connected to a wiring 115a. A gate of the transistor 103a is electrically connected to a wiring 117a. The other of the source and the drain of the transistor 105a is electrically connected to a wiring 119a. The other of the source and the drain of the transistor 106a is electrically connected to a wiring 111a. A gate of the transistor 106a is electrically connected to a wiring 112a.

Here, a point where the other of the source and the drain of the transistor 102a, the one of the source and the drain of the transistor 103a, the one electrode of the capacitor 104a, and the gate of the transistor 105a are electrically connected is referred to as a node NDa.

The wiring 114 and the wiring 115a can each have a function of a power supply line. For example, the wiring 114 can function as a low potential power supply line, and the wiring 115a can function as a high potential power supply line. The wiring 112a, the wiring 116a, the wiring 117a, and the wiring 122 can function as signal lines for controlling the electrical conduction of the respective transistors. The wiring 111a can function as a wiring for supplying a potential corresponding to a weight coefficient to the pixel 100. The wiring 113 can function as a wiring which electrically connects the pixel 100 and the circuit 201. The wiring 119a can function as a low potential power supply line (e.g., a GND wiring).

Note that an amplifier circuit or a gain control circuit may be electrically connected to the wiring 113.

The transistor 102a can have a function of controlling the potential of the node NDa. The transistor 103a can have a function of initializing the potential of the node NDa. The transistor 105a can have a function of controlling a current fed by the circuit 201 in accordance with the potential of the node NDa (a current flowing from a wiring 217 to the wiring 119a). The transistor 106a can have a function of supplying the potential corresponding to the weight coefficient to the node NDa. The transistor 108 can have a function of selecting a pixel.

In FIG. 4, the connection direction of a pair of electrodes of the photoelectric conversion device 101 may be reversed. In that case, the wiring 114 functions as a high potential power supply line and the wiring 115a functions as a low potential power supply line.

Transistors using a metal oxide in their channel formation regions (OS transistors) are preferably used as the transistor 102a and the transistor 103a. The OS transistor has a feature of an extremely low off-state current. When OS transistors are used as the transistor 102a and the transistor 103a, the charge retention period of the node NDa can be lengthened greatly. Moreover, a global shutter mode in which a charge accumulation operation is performed in all the pixels at the same time can be used without complicating the circuit structure and operation method. Furthermore, while image data is retained at the node NDa, an arithmetic operation using the image data can be performed a plurality of times.

Meanwhile, it is sometimes desired that the transistor 105a have excellent amplifying characteristics. Transistors having high mobility capable of a high-speed operation are sometimes preferably used as the transistor 106a and transistor 108. Accordingly, transistors using silicon in their channel formation regions (Si transistors) may be used as the transistor 105a, the transistor 106a, and the transistor 108.

Note that without limitation to the above, an OS transistor and a Si transistor may be freely used in combination. Alternatively, all the transistors may be OS transistors. Alternatively, all the transistors may be Si transistors. Examples of the Si transistor include a transistor including amorphous silicon and a transistor including crystalline silicon (microcrystalline silicon, low-temperature polysilicon, or single crystal silicon).

The potential of the node NDa in the pixel 100 is the potential obtained by subtracting a potential (image data) generated by photoelectric conversion by the photoelectric conversion device 101 from a reset potential supplied from the wiring 115a. The potential of the node NDa is determined by capacitive coupling of the potential corresponding to a weight coefficient supplied from the wiring 111a. Consequently, a current corresponding to data in which a given weight coefficient is added to the image data can be made flow through the transistor 105a. Note that in the case where the connection direction of the pair of electrodes of the photoelectric conversion device 101 in FIG. 4 is reversed, the potential of the node NDa is determined by the potential obtained by adding a potential (image data) generated by photoelectric conversion by the photoelectric conversion device 101 to a reset potential supplied from the wiring 115a.

The circuit 130b can have the same structure as the circuit 130a. The circuit 130b includes a transistor 102b, a transistor 103b, a capacitor 104b, a transistor 105b, and the transistor 106b. The transistor 102b, the transistor 103b, the capacitor 104b, the transistor 105b, and the transistor 106b can be referred to for the description of the transistor 102a, the transistor 103a, the capacitor 104a, the transistor 105a, and the transistor 106a, respectively; thus, the detailed description thereof is omitted.

Note that in this specification and the like, the transistor 102a and the transistor 102b are collectively referred to as a transistor 102 in some cases. The transistor 103a and the transistor 103b are collectively referred to as a transistor 103 in some cases. The capacitor 104a and the capacitor 104b are collectively referred to as a capacitor 104 in some cases. The transistor 105a and the transistor 105b are collectively referred to as a transistor 105 in some cases. The transistor 106a and the transistor 106b are collectively referred to as a transistor 106 in some cases. The circuit 130a and the circuit 130b are collectively referred to as a circuit 130 in some cases.

A wiring 111b, a wiring 112b, a wiring 115b, a wiring 116b, a wiring 117b, and a wiring 119b can be referred to for the description of the wiring 111a, the wiring 112a, the wiring 115a, the wiring 116a, the wiring 117a, and the wiring 119a, respectively; thus, the detailed description thereof is omitted. Similarly, a node NDb can be referred to for the description of the node NDa; thus, the detailed description thereof is omitted. Note that the wiring 115a and the wiring 115b can be a common wiring. The wiring 119a and the wiring 119b can be a common wiring. With use of a common wiring, the number of wirings is reduced and the area occupied by the wiring in the pixel can be reduced, so that a high-resolution imaging device can be obtained.

<Circuit 201>

As illustrated in FIG. 2, the pixels 100 are electrically connected to each other through the wirings 113. The circuit 201 can perform an arithmetic operation using the sum of the currents flowing through the transistors 105 of the pixels 100.

The circuit 201 includes a capacitor 202, a transistor 203, a transistor 204, a transistor 205, a transistor 206, and a transistor 207. The transistor 207 functions as a voltage converter circuit. An appropriate analog potential (Bias) is applied to a gate of the transistor 207.

One electrode of the capacitor 202 is electrically connected to one of a source and a drain of the transistor 203 and a gate of the transistor 204. One of a source and a drain of the transistor 204 is electrically connected to one of a source and a drain of the transistor 205 and one of a source and a drain of the transistor 206. The other electrode of the capacitor 202 is electrically connected to the wiring 113 and one of a source and a drain of the transistor 207.

Here, a point where the one electrode of the capacitor 202, the one of the source and the drain of the transistor 203, and the gate of the transistor 204 are connected is referred to as a node C.

The other of the source and the drain of the transistor 203 is electrically connected to a wiring 218. The other of the source and the drain of the transistor 204 is electrically connected to a wiring 219. The other of the source and the drain of the transistor 205 is electrically connected to a reference power supply line such as a GND wiring. The other of the source and the drain of the transistor 206 is electrically connected to a wiring 212. The other of the source and the drain of the transistor 207 is electrically connected to the wiring 217. A gate of the transistor 203 is electrically connected to a wiring 216. A gate of the transistor 205 is electrically connected to a wiring 215. A gate of the transistor 206 is electrically connected to a wiring 213.

The wiring 217, the wiring 218, and the wiring 219 can each have a function of a power supply line. For example, the wiring 218 can have a function of a wiring for supplying a reset potential (Vr) for reading. The wiring 217 and the wiring 219 can function as high potential power supply lines. The wiring 213, the wiring 215, and the wiring 216 can function as signal lines for controlling the conduction of the respective transistors. The wiring 212 is an output line and can be electrically connected to the circuit 301 illustrated in FIG. 1, for example.

The transistor 203 can have a function of resetting the potential of the node C to the potential of the wiring 218. The transistor 204 and the transistor 205 can have a function of source follower circuits. The transistor 206 can have a function of controlling a reading operation. Note that the circuit 201 has a function of a correlated double sampling circuit (CDS circuit), and can be replaced with a circuit with another structure that has the function.

In one embodiment of the present invention, offset components other than the product of image data (X) and a weight coefficient (W) are eliminated, and the product of the image data (X) and the weight coefficient (W) (WX) is extracted. WX can be calculated using data obtained from the same pixel when light exposure is performed (imaging is performed) and when light exposure is not performed (imaging is not performed), and data obtained by supplying the weight to these data.

The total amount of currents ($I_p$) flowing through the pixels 100 when light exposure is performed is $k\Sigma(-X-V_{th})^2$, and the total amount of currents ($I_p$) flowing through the pixels 100 when weights are supplied is $k\Sigma(W-X-V_{th})^2$. The total amount of currents ($I_{ref}$) flowing through the pixels 100 when light exposure is not performed is $k\Sigma(0-V_{th})^2$, and the total amount of currents ($I_{ref}$) flowing through the pixels 100 when weights are supplied is $k\Sigma(W-V_{th})^2$. Here, k is a constant and $V_{th}$ is the threshold voltage of the transistor 105.

First, a difference (data A) between the data with light exposure and the data obtained by supplying a weight to the data is calculated. The difference is $k\Sigma((-X-V_{th})^2-(W-X-V_{th})^2)=k\Sigma(-W^2+2W\cdot X+2W\cdot V_{th})$.

Next, a difference (data B) between the data without light exposure and the data obtained by supplying a weight to the data is calculated. The difference is $k\Sigma((0-V_{th})^2-(W-V_{th})^2)=k\Sigma(-W^2+2W\cdot V_{th})$.

Then, a difference between the data A and the data B is calculated. The difference is $k\Sigma(-W^2+2W\cdot X+2W\cdot V_{th}-(-W^2+2W\cdot V_{th}))=k\Sigma(2\ W\cdot X)$. That is, offset components other than the product of the image data (X) and the weight coefficient (W) can be eliminated.

The circuit 201 can read out the data A and the data B. Note that the calculation of the difference between the data A and the data B can be performed by the circuit 301, for example.

The case where the connection direction of the pair of electrodes of the photoelectric conversion device 101 in FIG. 4 is reversed is described.

The total amount of currents ($I_p$) flowing through the pixels 100 when light exposure is performed is $k\Sigma(X-V_{th})^2$, and the total amount of currents ($I_p$) flowing through the pixels 100 when weights are supplied is $k\Sigma(W+X-V_{th})^2$. The total amount of currents ($I_{ref}$) flowing through the pixels 100 when light exposure is not performed is $k\Sigma(0-V_{th})^2$, and the total amount of currents ($I_{ref}$) flowing through the pixels 100 when weights are supplied is $k\Sigma(W-V_{th})^2$.

First, a difference (data A) between the data with light exposure and the data obtained by supplying a weight to the data is calculated. The difference is $k\Sigma((X-V_{th})^2-(W+X-V_{th})^2)=k\Sigma(-W^2-2W\cdot X+2W\cdot V_{th})$.

Next, a difference (data B) between the data without light exposure and the data obtained by supplying a weight to the data is calculated. The difference is $k\Sigma((0-V_{th})^2-(W-V_{th})^2)=k\Sigma(-W^2+2\ W\cdot V_{th})$.

Then, a difference between the data A and the data B is calculated. The difference is $k\Sigma(-W^2-2W\cdot X+2W\cdot V_{th}-(-W^2+2W\cdot V_{th}))=k\Sigma(-2W\cdot X)$. Offset components other than the product of the image data (X) and the weight coefficient (W) can be eliminated even in the case where the connection direction of the pair of electrodes of the photoelectric conversion device 101 in FIG. 4 is reversed.

A transistor using a metal oxide in its channel formation region (an OS transistor) is preferably used as the transistor 203. When an OS transistor is used as the transistor 203, the charge retention period of the node C can be lengthened greatly.

Transistors having high mobility capable of a high-speed operation are sometimes preferably used as the transistor 204 and transistor 205. Accordingly, Si transistors may be used as the transistor 204 and transistor 205.

Note that without limitation to the above, an OS transistor and a Si transistor may be freely used in combination. Alternatively, all the transistors may be OS transistors. Alternatively, all the transistors may be Si transistors.

<Imaging Operation 1>

Figure 7:
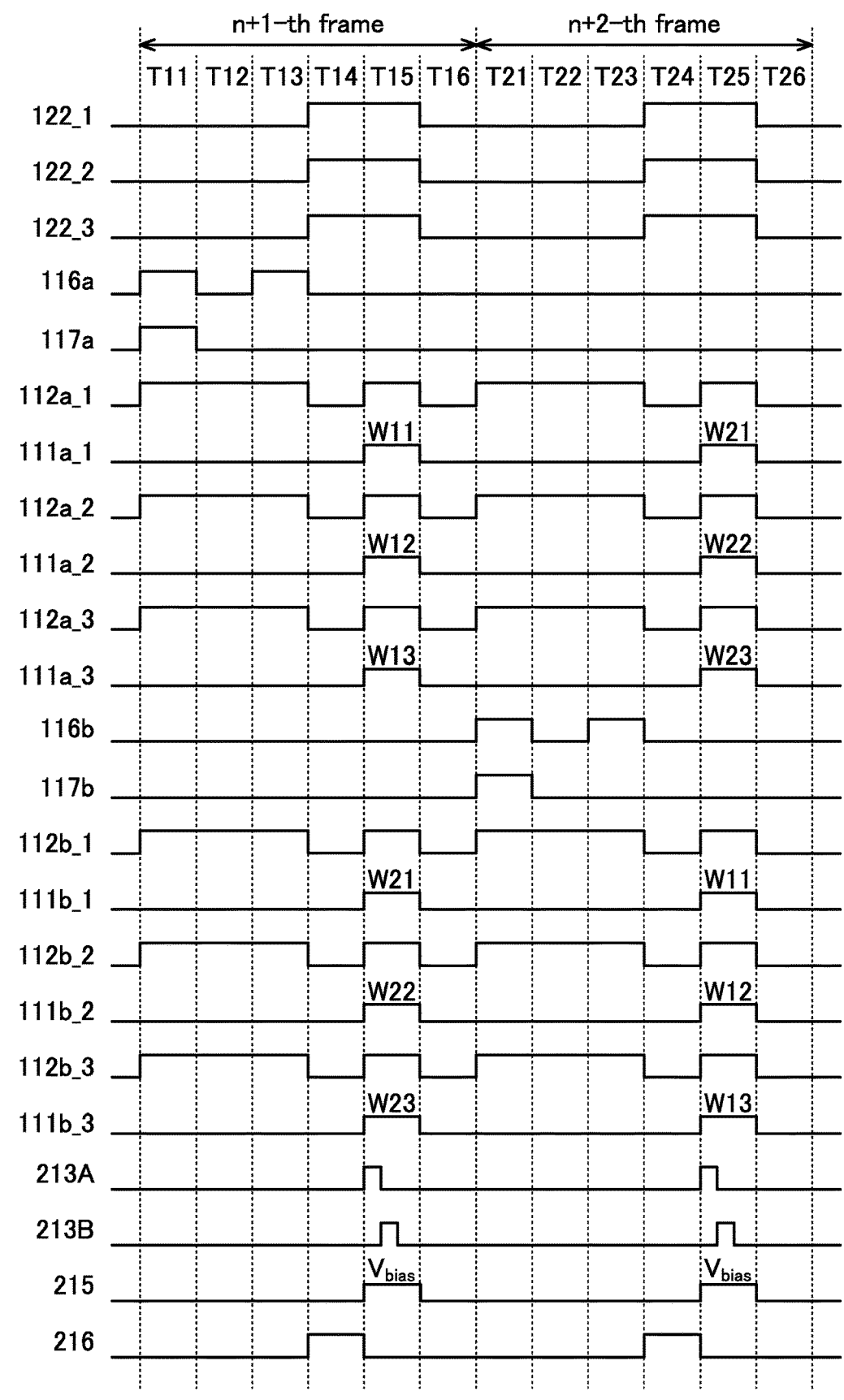
FIG. 7 is a timing chart showing operations of a pixel block and a circuit.

FIG. 7 is a timing chart showing an operation of calculating the difference (data A) between the data with light exposure and the data obtained by supplying weights to the data in the pixel block 200 and the circuit 201. For convenience, the timings of changing signals are matched in the chart; however, in reality, the timings are preferably shifted in consideration of the delay inside the circuit. In the following description, a high potential is represented by "H", and a low potential is represented by "L".

Here, the operation of the n+1-th frame shown in FIG. 5 is described with reference to FIG. 7.

First, in a period T11, the potential of the wiring 116a is set to "H" and the potential of the wiring 117a is set to "H", so that the nodes NDa in the pixels 100 have reset potentials. Furthermore, the potentials of a wiring 111a_1 to a wiring 111a_3 (the wirings 111a in the first row to the third row) are set to "L" and the potentials of a wiring 112a_1 to a wiring 112a_3 (the wirings 112a in the first row to the third row) are set to "H", so that weight coefficients 0 are written. Similarly, the potentials of a wiring 111b_1 to a wiring 111b_3 (the wirings 111b in the first row to the third row) are set to "L" and the potentials of a wiring 112b_1 to a wiring 112b_3 (the wirings 112b in the first row to the third row) are set to "H", so that weight coefficients 0 are written.

In a period T12, the potential of the wiring 116a is set to "L", the potential of the wiring 117a is set to "L", and a light exposure operation is performed with the photoelectric conversion device 101.

In a period T13, the potential of the wiring 116a is set to "H" and a potential generated in the photoelectric conversion device 101 is transferred, so that the potential $X_{n+1}$ (image data) of the n+1-th frame is written to each of the nodes NDa. The period T11 to the period T13 correspond to a period for obtaining data with light exposure of the n+1-th frame. Each of the nodes NDb retains the potential $X_n$ (image data) of the n-th frame, which is the previous frame.

In a period T14, the potentials of a wiring 122_1, a wiring 122_2, and a wiring 122_3 are set to "H", so that all of the pixels 100 in the pixel block are selected. Here, the wiring 122_1 represents the wiring 122 of the pixel 100 in the first row, the wiring 122_2 represents the wiring 122 of the pixel 100 in the second row, and the wiring 122_3 represents the wiring 122 of the pixel 100 in the third row. At this time, a current corresponding to the potential $X_{n+1}$ flows to the transistor 105a in each of the pixels 100. A current based on the potential $X_n$ flows to the transistor 105b. Moreover, the potential of the wiring 216 is set to "H", so that the potential Vr of the wiring 218 is written to the node C and the potential of the node C is initialized to the potential Vr.

In a period T15, the potential of the wiring 111a_1 is set to a potential corresponding to a weight coefficient W11 (a weight added to the pixels in the first row), and the potential of the wiring 112a_1 is set to "H", so that the weight coefficient W11 is added to the nodes NDa of the pixels 100 in the first row by capacitive coupling of the capacitors 104a.

The potential of the wiring 111a_2 is set to a potential corresponding to a weight coefficient W12 (a weight added to the pixels in the second row), and the potential of the wiring 112a_2 is set to "H", so that the weight coefficient W12 is added to the nodes NDa of the pixels 100 in the second row by capacitive coupling of the capacitors 104a.

The potential of the wiring 111a_3 is set to a potential corresponding to a weight coefficient W13 (a weight added to the pixels in the third row), and the potential of the wiring 112a_3 is set to "H", so that the weight coefficient W13 is added to the nodes NDa of the pixels 100 in the third row by capacitive coupling of the capacitors 104a. Note that the weight coefficient W11, the weight coefficient W12, and the weight coefficient W13 are the components of the first filter FL11.

The potential of the wiring 111b_1 is set to a potential corresponding to a weight coefficient W21 (a weight added to the pixels in the first row), and the potential of the wiring

112b_1 is set to "H", so that the weight coefficient W21 is added to the nodes NDb of the pixels 100 in the first row by capacitive coupling of the capacitors 104b.

The potential of the wiring 111b_2 is set to a potential corresponding to a weight coefficient W22 (a weight added to the pixels in the second row), and the potential of the wiring 112b_2 is set to "H", so that the weight coefficient W22 is added to the nodes NDb of the pixels 100 in the second row by capacitive coupling of the capacitors 104b.

The potential of the wiring 111b_3 is set to a potential corresponding to a weight coefficient W23 (a weight added to the pixels in the third row), and the potential of the wiring 112b_3 is set to "H", so that the weight coefficient W23 is added to the nodes NDb of the pixels 100 in the third row by capacitive coupling of the capacitors 104b. Note that the weight coefficient W21, the weight coefficient W22, and the weight coefficient W23 are the components of the second filter FL21.

Since the period T14, the potentials of the wiring 1221, the wiring 1222, and the wiring 122_3 are set to "H", so that all of the pixels 100 in the pixel block 200 are selected. At this time, in the pixels 100 in the first row, a current corresponding to the potential W11+$X_{n+1}$ flows to the transistors 105a and a current corresponding to the potential W21+$X_n$ flows to the transistors 105b. In the pixels 100 in the second row, a current corresponding to the potential W12+$X_{n+1}$ flows to the transistors 105a and a current corresponding to the potential W22+$X_n$ flows to the transistors 105b. In the pixels 100 in the third row, a current corresponding to the potential W13+$X_{n+1}$ flows to the transistors 105a and a current corresponding to the potential W23+$X_n$ flows to the transistors 105b.

Here, the potential of the other electrode of the capacitor 202 changes in accordance with the current flowing through the wiring 113, and an amount Y of change is added to the potential Vr of the node C by capacitive coupling. Therefore, the potential of the node C becomes "Vr+Y". Here, given that Vr=0, Y is the difference itself, which means that the data A is calculated.

The potential of the wiring 213 is set to "H" and the potential of the wiring 215 is set to an appropriate analog potential such as "$V_{bias}$", so that the circuit 201 can output a signal potential in accordance with the data A of the pixel blocks 200 in the first row by a source follower operation (hereinafter, this operation is also referred to as reading).

In FIG. 7, the wiring 213 included in the circuit 201 electrically connected to the plurality of pixel blocks 200 in the first column is denoted by a wiring 213A, and the wiring 213 included in the circuit 201 electrically connected to the plurality of pixel blocks 200 in the second column is denoted by a wiring 213B. The same applies to the third and subsequent columns, so that these columns are not shown. In the period T15, the wiring 213A, the wiring 213B, and the like are sequentially set to "H" and reading from the pixel blocks 200 is performed. Although FIG. 7 shows an example in which the wiring 213A and the wiring 213B are set to "H" in this order, one embodiment of the present invention is not limited thereto. The wirings 213 are each configured to be set to "H" in a period in the period T15.

Note that in this specification and the like, the wiring 213A, the wiring 213B, and the like are collectively referred to as a wiring 213 in some cases.

The operation in the period T15 corresponds to a period in the n+1-th frame, in which the data A is generated on the basis of data with imaging and the data A is output to the circuit 301 (reading is performed).

In a period T16, the potentials of the wiring 1221, the wiring 1222, the wiring 1223, the wiring 112*a*_1, the wiring 112*a*_2, the wiring 112*a*_3, the wiring 112*b*_1, the wiring 112*b*_2, the wiring 112*b*_3, the wiring 213A, the wiring 213B, and the wiring 215 are set to "L".

The above is the description of the operation of the n+1-th frame.

Next, the operation of the n+2-th frame shown in FIG. 5 is described with reference to FIG. 7. Note that the description of the portions common to the n+1-th frame (the period T11 to the period T16) described above is omitted, and different portions are mainly described.

First, in a period T21, the potential of the wiring 116*b* is set to "H" and the potential of the wiring 117*b* is set to "H", so that the nodes NDb in the pixels 100 have reset potentials. Furthermore, the potentials of the wiring 111*a*_1 to the wiring 111*a*_3 are set to "L" and the potentials of the wiring 112*a*_1 to the wiring 112*a*_3 are set to "H", so that weight coefficients 0 are written. Similarly, the potentials of the wiring 111*b*_1 to the wiring 111*b*_3 are set to "L" and the potentials of the wiring 112*b*_1 to the wiring 112*b*_3 are set to "H", so that weight coefficients 0 are written.

In a period T22, the potential of the wiring 116*b* is set to "L", the potential of the wiring 117*b* is set to "L", and a light exposure operation is performed with the photoelectric conversion device 101.

In a period T23, the potential of the wiring 116*b* is set to "H" and a potential generated in the photoelectric conversion device 101 is transferred, so that the potential $X_{n+2}$ (image data) of the n+2-th frame is written to each of the nodes NDb. The period T21 to the period T23 correspond to a period in which data with light exposure of the n+2-th frame is obtained. Each of the nodes NDa retains the potential $X_{n+1}$ (image data) of the n+1-th frame, which is the previous frame.

In a period T24, the potentials of the wiring 122_1, the wiring 122_2, and the wiring 122_3 are set to "H", so that all of the pixels 100 in the pixel block are selected. At this time, a current corresponding to the potential $X_{n+1}$ flows to the transistor 105*a* in each of the pixels 100. A current based on the potential $X_{n+2}$ flows to the transistor 105*b*. Moreover, the potential of the wiring 216 is set to "H", so that the potential Vr of the wiring 218 is written to the node C and the potential of the node C is initialized to the potential Vr.

In a period T25, the potential of the wiring 111*a*_1 is set to a potential corresponding to the weight coefficient W21 (the weight added to the pixels in the first row), and the potential of the wiring 112*a*_1 is set to "H", so that the weight coefficient W21 is added to the nodes NDa of the pixels 100 in the first row by capacitive coupling of the capacitors 104*a*.

The potential of the wiring 111*a*_2 is set to a potential corresponding to the weight coefficient W22 (the weight added to the pixels in the second row), and the potential of the wiring 112*a*_2 is set to "H", so that the weight coefficient W22 is added to the nodes NDa of the pixels 100 in the second row by capacitive coupling of the capacitors 104*a*.

The potential of the wiring 111*a*_3 is set to a potential corresponding to the weight coefficient W23 (the weight added to the pixels in the third row), and the potential of the wiring 112*a*_3 is set to "H", so that the weight coefficient W23 is added to the nodes NDa of the pixels 100 in the third row by capacitive coupling of the capacitors 104*a*.

The potential of the wiring 111*b*_1 is set to a potential corresponding to the weight coefficient W11 (the weight added to the pixels in the first row), and the potential of the wiring 112*b*_1 is set to "H", so that the weight coefficient W11 is added to the nodes NDb of the pixels 100 in the first row by capacitive coupling of the capacitors 104*b*.

The potential of the wiring 111*b*_2 is set to a potential corresponding to the weight coefficient W12 (the weight added to the pixels in the second row), and the potential of the wiring 112*b*_2 is set to "H", so that the weight coefficient W12 is added to the nodes NDb of the pixels 100 in the second row by capacitive coupling of the capacitors 104*b*.

The potential of the wiring 111*b*_3 is set to a potential corresponding to the weight coefficient W13 (the weight added to the pixels in the third row), and the potential of the wiring 112*b*_3 is set to "H", so that the weight coefficient W13 is added to the nodes NDb of the pixels 100 in the third row by capacitive coupling of the capacitors 104*b*.

Since the period T24, the potentials of the wiring 1221, the wiring 1222, and the wiring 122_3 are set to "H", so that all of the pixels 100 in the pixel block 200 are selected. At this time, in the pixels 100 in the first row, a current corresponding to the potential $W21+X_{n+1}$ flows to the transistors 105*a* and a current corresponding to the potential $W11+X_{n+2}$ flows to the transistors 105*b*. In the pixels 100 in the second row, a current corresponding to the potential $W22+X_{n+1}$ flows to the transistors 105*a* and a current corresponding to the potential $W12+X_{n+2}$ flows to the transistors 105*b*. In the pixels 100 in the third row, a current corresponding to the potential $W23+X_{n+1}$ flows to the transistors 105*a* and a current corresponding to the potential $W13+X_{n+2}$ flows to the transistors 105*b*.

Here, the potential of the other electrode of the capacitor 202 changes in accordance with the current flowing through the wiring 113, and an amount Y of change is added to the potential Vr of the node C by capacitive coupling. Therefore, the potential of the node C becomes "Vr+Y". Here, given that Vr=0, Y is the difference itself, which means that the data A is calculated.

The potential of the wiring 213 is set to "H" and the potential of the wiring 215 is set to an appropriate analog potential such as "$V_{bias}$", so that the circuit 201 can output a signal potential in accordance with the data A of the pixel blocks 200 in the first row by a source follower operation.

The operation in the period T25 corresponds to a period in the n+2-th frame, in which the data A is generated on the basis of data with imaging and the data A is output to the circuit 301 (reading is performed).

In a period T26, the potentials of the wiring 1221, the wiring 1222, the wiring 1223, the wiring 112*a*_1, the wiring 112*a*_2, the wiring 112*a*_3, the wiring 112*b*_1, the wiring 112*b*_2, the wiring 112*b*_3, the wiring 213A, the wiring 213B, and the wiring 215 are set to "L".

The above is the description of the operation of the n+2-th frame.

Also in the subsequent frames, operations similar to the above can be performed.

Figure 8:
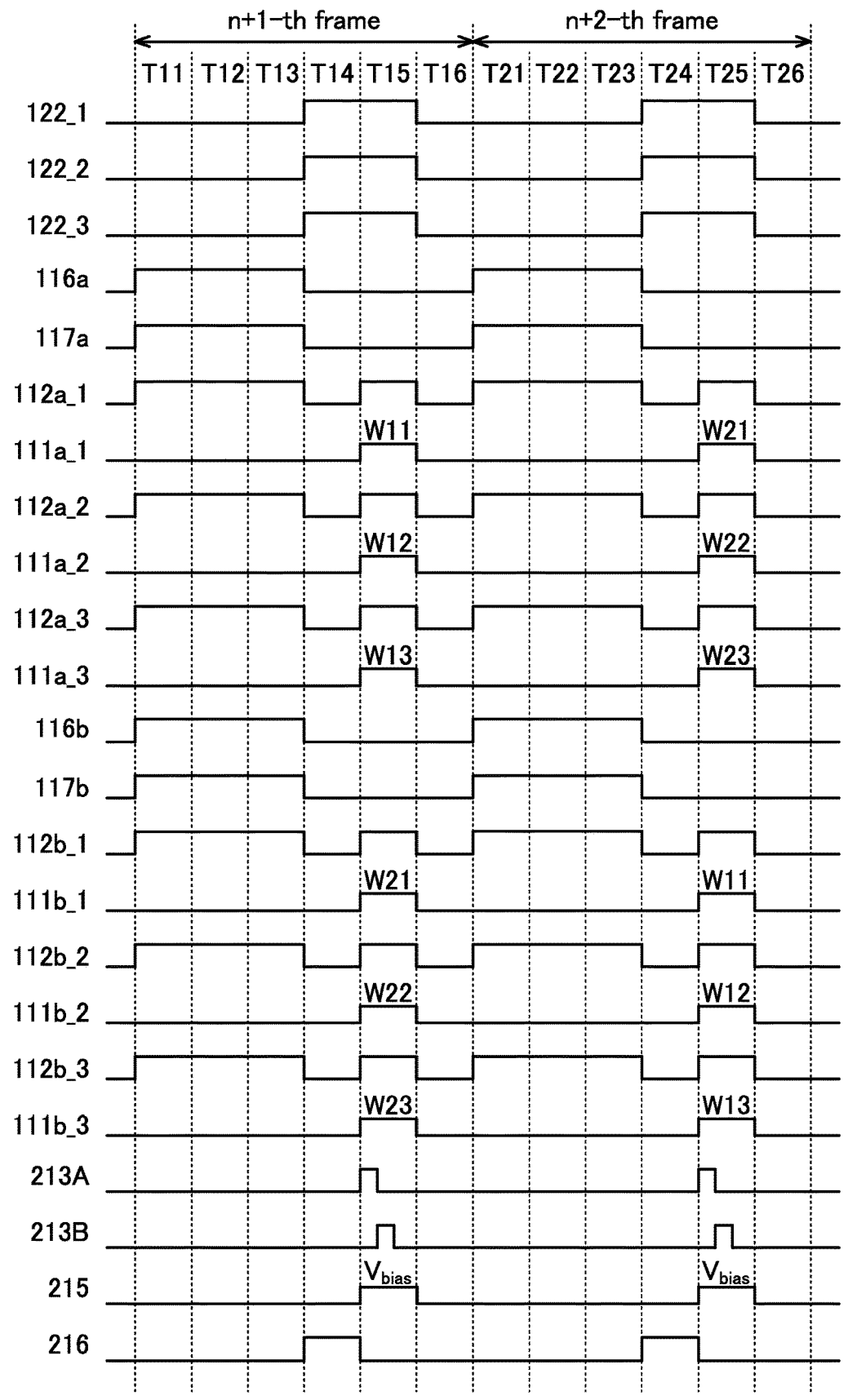
FIG. 8 is a timing chart showing operations of a pixel block and a circuit.

FIG. 8 is a timing chart showing an operation of calculating the difference (data B) between the data without light exposure and the data obtained by supplying weights to the data in the pixel block 200 and the circuit 201. Note that the data B is obtained as needed. For example, the obtained data B may be stored in a memory, and if the input weight is not changed, the data B may be read from the memory. Note that a plurality of pieces of data B corresponding to a plurality of weights may be stored in the memory. Either the data A or the data B may be obtained first.

Here, the operation of the n+1-th frame is described with reference to FIG. 8. Note that the description of the portions common to FIG. 7 described above is omitted, and different portions are mainly described.

First, in the period T11 to the period T13, the potential of the wiring 116a is set to "H" and the potential of the wiring 117a is set to "H", so that the nodes NDa in the pixels 100 have reset potentials. Similarly, the potential of the wiring 116b is set to "H" and the potential of the wiring 117b is set to "H", so that the nodes NDb in the pixels 100 have reset potentials. That is, in the periods, the potentials of the nodes NDa and the nodes NDb are the reset potentials regardless of the operation of the photoelectric conversion devices 101. At the end of the period T13, the potentials of the wiring 116a, the wiring 117a, the wiring 116b, and the wiring 117b are set to "L".

In the period T11, the potentials of the wiring 111a_1, the wiring 111a_2, and the wiring 111a_3 are set to "L" and the wiring 112a_1, the wiring 112a_2, and the wiring 112a_3 are set to "H", so that weight coefficients 0 are written. This operation is performed during a period in which the potentials of the nodes NDa are the reset potentials.

Similarly, the potentials of the wiring 111b_1, the wiring 111b_2, and the wiring 111b_3 are set to "L" and the wiring 112b_1, the wiring 112b_2, and the wiring 112b_3 are set to "H", so that weight coefficients 0 are written. This operation is performed during a period in which the potentials of the nodes NDb are the reset potentials.

In the period T14, the potentials of the wiring 1221, the wiring 1222, and the wiring 122_3 are set to "H", so that all of the pixels 100 in the pixel block 200 are selected. At this time, a current corresponding to the reset potential flows to the transistor 105a in each of the pixels 100. Moreover, the potential of the wiring 216 is set to "H", so that the potential Vr of the wiring 218 is written to the node C. The operation in the period T14 corresponds to obtainment of the data without light exposure, and the data is initialized to the potential Vr of the node C.

In the period T15, the potential of the wiring 111a_1 is set to a potential corresponding to the weight coefficient W11 (the weight added to the pixels in the first row), and the potential of the wiring 112a_1 is set to "H", so that the weight coefficient W11 is added to the nodes NDa of the pixels 100 in the first row by capacitive coupling of the capacitors 104a.

The potential of the wiring 111a_2 is set to a potential corresponding to the weight coefficient W12 (the weight added to the pixels in the second row), and the potential of the wiring 112a_2 is set to "H", so that the weight coefficient W12 is added to the nodes NDa of the pixels 100 in the second row by capacitive coupling of the capacitors 104a.

The potential of the wiring 111a_3 is set to a potential corresponding to the weight coefficient W13 (the weight added to the pixels in the third row), and the potential of the wiring 112a_3 is set to "H", so that the weight coefficient W13 is added to the nodes NDa of the pixels 100 in the third row by capacitive coupling of the capacitors 104a.

The potential of the wiring 111b_1 is set to a potential corresponding to the weight coefficient W21 (the weight added to the pixels in the first row), and the potential of the wiring 112b_1 is set to "H", so that the weight coefficient W21 is added to the nodes NDb of the pixels 100 in the first row by capacitive coupling of the capacitors 104b.

The potential of the wiring 111b_2 is set to a potential corresponding to the weight coefficient W22 (the weight added to the pixels in the second row), and the potential of the wiring 112b_2 is set to "H", so that the weight coefficient W22 is added to the nodes NDb of the pixels 100 in the second row by capacitive coupling of the capacitors 104b.

The potential of the wiring 111b_3 is set to a potential corresponding to the weight coefficient W23 (the weight added to the pixels in the third row), and the potential of the wiring 112b_3 is set to "H", so that the weight coefficient W23 is added to the nodes NDb of the pixels 100 in the third row by capacitive coupling of the capacitors 104b.

Since the period T14, the potentials of the wiring 1221, the wiring 1222, and the wiring 122_3 are set to "H", so that all of the pixels 100 in the pixel block 200 are selected. At this time, in the pixels 100 in the first row, a current corresponding to the potential W11+0 flows to the transistors 105a and a current corresponding to the potential W21+0 flows to the transistors 105b. In the pixels 100 in the second row, a current corresponding to the potential W12+0 flows to the transistors 105a and a current corresponding to the potential W22+0 flows to the transistors 105b. In the pixels 100 in the third row, a current corresponding to the potential W13+0 flows to the transistors 105a and a current corresponding to the potential W23+0 flows to the transistors 105b.

Here, the potential of the other electrode of the capacitor 202 changes in accordance with the current flowing through the wiring 113, and an amount Z of change is added to the potential Vr of the node C by capacitive coupling. Therefore, the potential of the node C becomes "Vr+Z". Here, given that Vr=0, Z is the difference itself, which means that the data B is calculated.

The potentials of the wiring 213A, the wiring 213B, and the like are sequentially set to "H" and the potential of the wiring 215 is set to an appropriate analog potential ($V_{Bias}$) or the like, so that the circuit 201 can output a signal potential in accordance with the data B of the pixel blocks 200 in the first row by a source follower operation.

The operation in the period T15 corresponds to a period in which the data B is generated on the basis of data without imaging and the data B is output to the circuit 301 (reading is performed).

In the period T16, the potentials of the wiring 1221, the wiring 122_2, the wiring 1223, the wiring 112a_1, the wiring 112a_2, the wiring 112a_3, the wiring 112b_1, the wiring 112b_2, the wiring 112b_3, the wiring 213A, the wiring 213B, and the wiring 215 are set to "L".

The data A and the data B output from the circuit 201 through the above operation are input to the circuit 301. Calculation of the difference between the data A and the data B is performed in the circuit 301, so that unnecessary offset components other than the product of the image data (potential X) and the weight coefficient (potential W) can be eliminated. The circuit 301 may have a structure in which the difference is calculated by utilizing a memory circuit and software processing, other than the structure including an arithmetic circuit such as the circuit 201.

Note that in the above operations, the potential of the node C of the circuit 201 is initialized to the potential "Vr" both in the operation of obtaining the data A and the operation of obtaining the data B. Then, "(Vr+Y)–(Vr+Z)"="Y–Z" in the following difference calculation, so that the component of the potential "Vr" is eliminated. As described above, the other unnecessary offset components are also eliminated, so that the product of the image data (potential X) and the weight coefficient (potential W) can be extracted.

The above is the description of the operation of the n+1-th frame.

Next, the operation of the n+2-th frame is described with reference to FIG. 8. Note that the description of the portions common to the n+1-th frame (the period T11 to the period T16) described above is omitted, and different portions are mainly described.

First, in the period T21 to the period T23, the potential of the wiring 116*a* is set to "H" and the potential of the wiring 117*a* is set to "H", so that the nodes NDa in the pixels 100 have reset potentials. Similarly, the potential of the wiring 116*b* is set to "H" and the potential of the wiring 117*b* is set to "H", so that the nodes NDb in the pixels 100 have reset potentials. At the end of the period T23, the potentials of the wiring 116*a*, the wiring 117*a*, the wiring 116*b*, and the wiring 117*b* are set to "L".

In the period T21, the potentials of the wiring 111*a*_1, the wiring 111*a*_2, and the wiring 111*a*_3 are set to "L" and the wiring 112*a*_1, the wiring 112*a*_2, and the wiring 112*a*_3 are set to "H", so that weight coefficients 0 are written. Similarly, the potentials of the wiring 111*b*_1, the wiring 111*b*_2, and the wiring 111*b*_3 are set to "L" and the wiring 112*b*_1, the wiring 112*b*_2, and the wiring 112*b*_3 are set to "H", so that weight coefficients 0 are written.

In the period T24, the potentials of the wiring 1221, the wiring 1222, and the wiring 122_3 are set to "H", so that all of the pixels 100 in the pixel block 200 are selected. At this time, a current corresponding to the reset potential flows to the transistor 105*b* in each of the pixels 100. Moreover, the potential of the wiring 216 is set to "H", so that the potential Vr of the wiring 218 is written to the node C. The operation in the period T24 corresponds to obtainment of the data without light exposure, and the data is initialized to the potential Vr of the node C.

In the period T25, the potential of the wiring 111*a*_1 is set to a potential corresponding to the weight coefficient W21, and the potential of the wiring 112*a*_1 is set to "H", so that the weight coefficient W21 is added to the nodes NDa of the pixels 100 in the first row by capacitive coupling of the capacitors 104*a*.

The potential of the wiring 111*a*_2 is set to a potential corresponding to the weight coefficient W22, and the potential of the wiring 112*a*_2 is set to "H", so that the weight coefficient W22 is added to the nodes NDa of the pixels 100 in the second row by capacitive coupling of the capacitors 104*a*.

The potential of the wiring 111*a*_3 is set to a potential corresponding to the weight coefficient W23, and the potential of the wiring 112*a*_3 is set to "H", so that the weight coefficient W23 is added to the nodes NDa of the pixels 100 in the third row by capacitive coupling of the capacitors 104*a*.

The potential of the wiring 111*b*_1 is set to a potential corresponding to the weight coefficient W11, and the potential of the wiring 112*b*_1 is set to "H", so that the weight coefficient W11 is added to the nodes NDb of the pixels 100 in the first row by capacitive coupling of the capacitors 104*b*.

The potential of the wiring 111*b*_2 is set to a potential corresponding to the weight coefficient W12, and the potential of the wiring 112*b*_2 is set to "H", so that the weight coefficient W12 is added to the nodes NDb of the pixels 100 in the second row by capacitive coupling of the capacitors 104*b*.

The potential of the wiring 111*b*_3 is set to a potential corresponding to the weight coefficient W13, and the potential of the wiring 112*b*_3 is set to "H", so that the weight coefficient W13 is added to the nodes NDb of the pixels 100 in the third row by capacitive coupling of the capacitors 104*b*.

Since the period T24, the potentials of the wiring 1221, the wiring 1222, and the wiring 122_3 are set to "H", so that all of the pixels 100 in the pixel block 200 are selected. At this time, in the pixels 100 in the first row, a current corresponding to the potential W21+0 flows to the transistors 105*a* and a current corresponding to the potential W11+0 flows to the transistors 105*b*. In the pixels 100 in the second row, a current corresponding to the potential W22+0 flows to the transistors 105*a* and a current corresponding to the potential W12+0 flows to the transistors 105*b*. In the pixels 100 in the third row, a current corresponding to the potential W23+0 flows to the transistors 105*a* and a current corresponding to the potential W13+0 flows to the transistors 105*b*.

Here, the potential of the other electrode of the capacitor 202 changes in accordance with the current flowing through the wiring 113, and an amount Z of change is added to the potential Vr of the node C by capacitive coupling. Therefore, the potential of the node C becomes "Vr+Z". Here, given that Vr=0, Z is the difference itself, which means that the data B is calculated.

The potentials of the wiring 213A, the wiring 213B, and the like are sequentially set to "H" and the potential of the wiring 215 is set to an appropriate analog potential ($V_{bias}$) or the like, so that the circuit 201 can output a signal potential in accordance with the data B of the pixel blocks 200 in the first row by a source follower operation.

The operation in the period T25 corresponds to a period in which the data B is generated on the basis of data without imaging and the data B is output to the circuit 301 (reading is performed).

In the period T26, the potentials of the wiring 122_1, the wiring 122_2, the wiring 122_3, the wiring 112*a*_1, the wiring 112*a*_2, the wiring 112*a*_3, the wiring 112*b*_1, the wiring 112*b*_2, the wiring 112*b*_3, the wiring 213A, the wiring 213B, and the wiring 215 are set to "L".

The data A and the data B output from the circuit 201 through the above operation are input to the circuit 301. Calculation of the difference between the data A and the data B is performed in the circuit 301, so that unnecessary offset components other than the product of the image data (potential X) and the weight coefficient (potential W) can be eliminated.

The above is the description of the operation of the n+2-th frame.

Also in the subsequent frames, operations similar to the above can be performed.

This operation corresponds to the initial operation of a neural network performing inference or the like. Thus, at least one arithmetic operation can be performed in the imaging device before an enormous amount of image data is taken out to the outside, so that a load reduction, higher-speed processing, and reduction in power consumption in an arithmetic operation in the outside, input and output of data, or the like are achieved.

As an operation other than the operation described above, the potential of the node C of the circuit 201 may be initialized to different potentials in the operation of obtaining the data A and in the operation of obtaining the data B. For example, the potential is initialized to a potential "Vr1" in the operation of obtaining the data A and to a potential "Vr2" in the operation of obtaining the data B. In this case, "(Vr1+Y)−(Vr2+Z)"="(Vr1−Vr2)+(Y−Z)" in the following difference calculation. "Y−Z" is extracted as the product of the image data (potential X) and the weight coefficient (potential W) as in the above operation, and "Vr1−Vr2" is added. Here, "Vr1−Vr2" corresponds to a bias used for threshold value adjustment in the arithmetic operation in a middle layer of the neural network.

As an operation different from the above, the potential of the wiring 215 may be varied between the case where imaging is performed and the case where imaging is not performed. For example, the potential of the wiring 215 is set to a potential "$V_{bias}1$" in the operation of obtaining the data A and the potential of the wiring 215 is set to a potential "$V_{bias}2$" in the operation of obtaining the data B. Moreover, the potential of the node C is initialized to the potential "Vr" both in the operation of obtaining the data A and the operation of obtaining the data B. In this case, "$(Vr+Y-V_{bias}1)-(Vr+Z-V_{bias}2)$"="$(V_{bias}2-V_{bias}1)+(Y-Z)$" in the following difference calculation. "Y–Z" is extracted as the product of the image data (potential X) and the weight coefficient (potential W) as in the above operation, and "$V_{bias}2-V_{bias}1$" is added. Here, "$V_{bias}2-V_{bias}1$" corresponds to a bias used for threshold value adjustment in the arithmetic operation in a middle layer of the neural network.

The weight has a function of a filter of a convolutional neural network (CNN), for example, and may additionally have a function of amplifying or attenuating data. For example, when the weight coefficient (W) in the operation of obtaining the data A is set to the product of data obtained by the filter processing and an amplified amount, data corrected to a brighter image can be extracted. The data B is data without imaging and thus can also be referred to as black level data. Thus, the operation of calculating the difference between the data A and the data B can be an operation of promoting visualization of an image taken in a dark place. That is, luminance correction using a neural network can be performed.

As described above, a bias can be generated by the operation in the imaging device in one embodiment of the present invention. Furthermore, a functional weight can be added in the imaging device. Thus, a load in an arithmetic operation performed in the outside or the like can be reduced and the imaging device can be employed for a variety of usages. For example, part of processing in inference of a subject, correction of the resolution of image data, correction of luminance, generation of a color image from a monochrome image, generation of a three-dimensional image from a two-dimensional image, restoration of defected information, generation of a moving image from a still image, correction of an out-of-focus image, or the like can be performed in the imaging device.

<Imaging Operation 2>

With reference to FIG. 9 to FIG. 12, an example is described in which the circuit 130a and the circuit 130b each use three kinds of filters.

Figure 9:
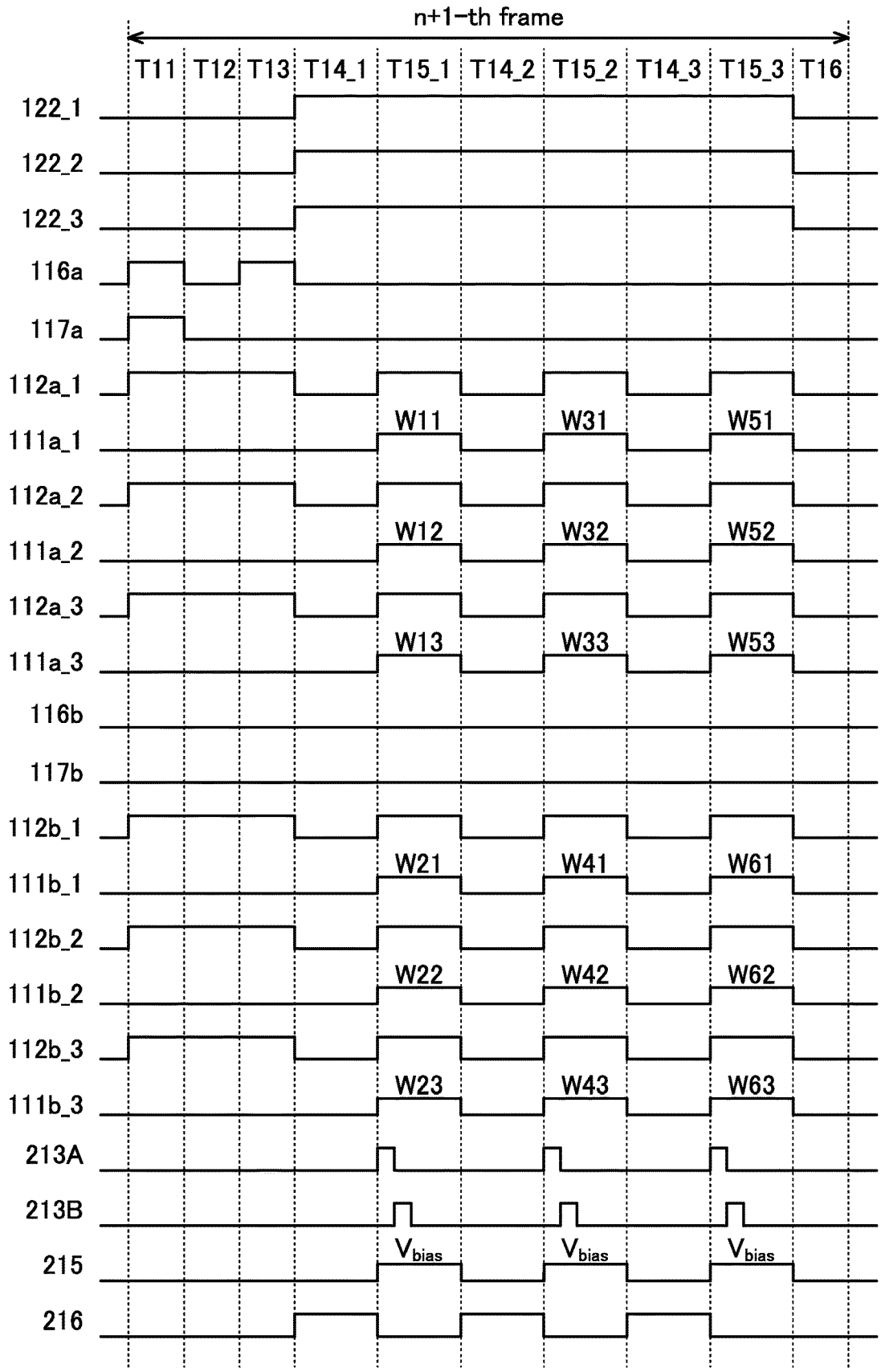
FIG. 9 is a timing chart showing operations of a pixel block and a circuit.
Figure 10:
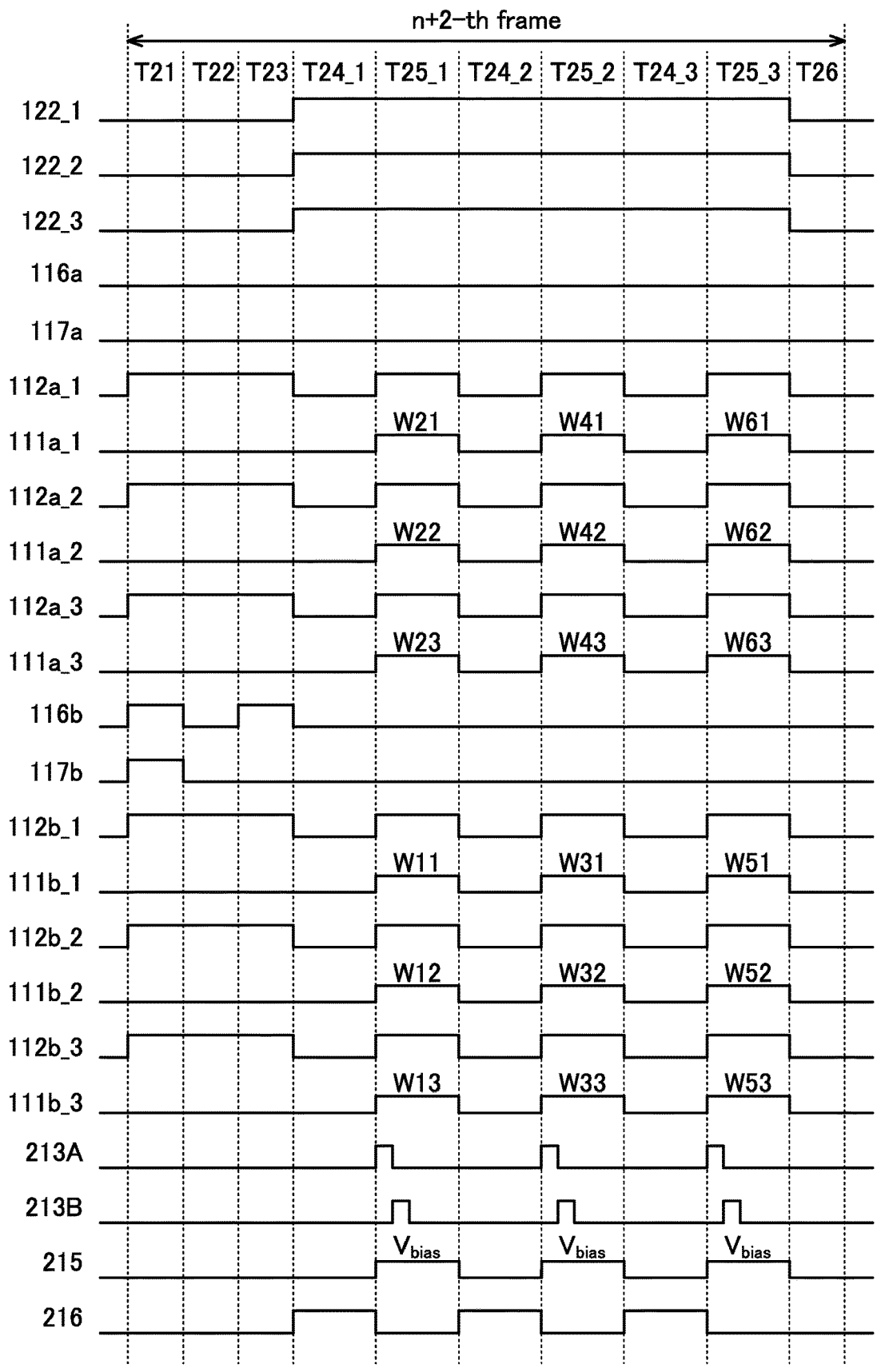
FIG. 10 is a timing chart showing operations of a pixel block and a circuit.

FIG. 9 and FIG. 10 are timing charts showing an operation of calculating the difference (data A) between the data with light exposure and the data obtained by supplying weights to the data in the pixel block 200 and the circuit 201. Note that the description of the portions common to FIG. 7 described above is omitted, and different portions are mainly described.

The operation of the n+1-th frame is described with reference to FIG. 9. Note that FIG. 9 corresponds to the operation of the n+1-th frame shown in FIG. 7.

The description of FIG. 7 can be referred to for the period T11 to the period T13; thus, the detailed description thereof is omitted.

The description of the period T14 to the period T15 of FIG. 7 can be referred to for a period T14_1 to a period T15_1; thus, the detailed description thereof is omitted. In the period T14_1 to the period T15_1, a weight is supplied with use of the first filter FL11 to image data $IM_{n+1}$ obtained in the n+1-th frame in the circuit 130a, and a weight is supplied with use of the second filter FL21 to retained image data $IM_n$ obtained in the n-th frame in the circuit 130b. In the period T14_1 to the period T15_1, the data A in the case of using the first filter FL11 and the second filter FL21 in the n+1-th frame is calculated.

In a period T14_2, the potentials of the wiring 112a_1, the wiring 112a_2, the wiring 112a_3, the wiring 112b_1, the wiring 112b_2, and the wiring 112b_3 are set to "L". At this time, a current corresponding to the potential $X_{n+1}$ flows to the transistor 105a in each of the pixels 100. A current based on the potential $X_n$ flows to the transistor 105b. Moreover, the potential of the wiring 216 is set to "H", so that the potential Vr of the wiring 218 is written to the node C and the potential of the node C is initialized to the potential Vr.

In a period T15_2, the potential of the wiring 111a_1 is set to a potential corresponding to a weight coefficient W31 (a weight added to the pixels in the first row), and the potential of the wiring 112a_1 is set to "H", so that the weight coefficient W31 is added to the nodes NDa of the pixels 100 in the first row by capacitive coupling of the capacitors 104a.

The potential of the wiring 111a_2 is set to a potential corresponding to a weight coefficient W32 (a weight added to the pixels in the second row), and the potential of the wiring 112a_2 is set to "H", so that the weight coefficient W32 is added to the nodes NDa of the pixels 100 in the second row by capacitive coupling of the capacitors 104a.

The potential of the wiring 111a_3 is set to a potential corresponding to a weight coefficient W33 (a weight added to the pixels in the third row), and the potential of the wiring 112a_3 is set to "H", so that the weight coefficient W33 is added to the nodes NDa of the pixels 100 in the third row by capacitive coupling of the capacitors 104a. Note that the weight coefficient W31, the weight coefficient W32, and the weight coefficient W33 are the components of the third filter FL12.

The potential of the wiring 111b_1 is set to a potential corresponding to a weight coefficient W41 (a weight added to the pixels in the first row), and the potential of the wiring 112b_1 is set to "H", so that the weight coefficient W41 is added to the nodes NDb of the pixels 100 in the first row by capacitive coupling of the capacitors 104b.

The potential of the wiring 111b_2 is set to a potential corresponding to a weight coefficient W42 (a weight added to the pixels in the second row), and the potential of the wiring 112b_2 is set to "H", so that the weight coefficient W42 is added to the nodes NDb of the pixels 100 in the second row by capacitive coupling of the capacitors 104b.

The potential of the wiring 111b_3 is set to a potential corresponding to a weight coefficient W43 (a weight added to the pixels in the third row), and the potential of the wiring 112b_3 is set to "H", so that the weight coefficient W43 is added to the nodes NDb of the pixels 100 in the third row by capacitive coupling of the capacitors 104b. Note that the weight coefficient W41, the weight coefficient W42, and the weight coefficient W43 are the components of the fourth filter FL22.

In the pixels 100 in the first row, a current corresponding to the potential $W31+X_{n+1}$ flows to the transistors 105a and a current corresponding to the potential $W41+X_n$ flows to the transistors 105b. In the pixels 100 in the second row, a current corresponding to the potential $W32+X_{n+1}$ flows to the transistors 105a and a current corresponding to the potential $W42+X_n$ flows to the transistors 105b. In the pixels 100 in the third row, a current corresponding to the potential $W33+X_{n+1}$ flows to the transistors 105a and a current corresponding to the potential $W43+X_n$ flows to the transistors 105b.

In the period 14_2 to the period T15_2, a weight is supplied with use of the third filter FL12 to the image data $IM_{n+1}$ obtained in the n+1-th frame in the circuit 130a, and a weight is supplied with use of the fourth filter FL22 to the retained image data $IM_n$ obtained in the n-th frame in the circuit 130b. In the period T14_2 to the period T15_2, the data A in the case of using the third filter FL12 and the fourth filter FL22 is calculated.

Similarly, in a period T14_3 to a period T15_3, a weight is supplied with use of the fifth filter FL13 to the image data $IM_{n+1}$ obtained in the n+1-th frame in the circuit 130a, and a weight is supplied with use of the sixth filter FL23 to the retained image data $IM_n$ obtained in the n-th frame in the circuit 130b. In the period T14_3 to the period T15_3, the data A in the case of using the fifth filter FL13 and the sixth filter FL23 is calculated.

The description of FIG. 7 can be referred to for the period T16; thus, the detailed description thereof is omitted.

The above is the description of the operation of the n+1-th frame.

Here, the operation of the n+2-th frame is described with reference to FIG. 10. Note that FIG. 10 corresponds to the operation of the n+2-th frame shown in FIG. 7. Note that the description of the portions common to the n+1-th frame (the period T11 to the period T16) described above is omitted, and different portions are mainly described.

The description of FIG. 7 can be referred to for the period T21 to the period T23; thus, the detailed description thereof is omitted.

The description of the period T24 to the period T25 of FIG. 7 can be referred to for a period T24_1 to a period T25_1; thus, the detailed description thereof is omitted. In the period T24_1 to the period T25_1, a weight is supplied with use of the first filter FL11 to image data $IM_{n+2}$ obtained in the n+2-th frame in the circuit 130b, and a weight is supplied with use of the second filter FL21 to the retained image data $IM_{n+1}$ obtained in the n+1-th frame in the circuit 130a. In the period T24_1 to the period T25_1, the data A in the case of using the first filter FL11 and the second filter FL21 in the n+2-th frame is calculated.

In a period T24_2, a current corresponding to the potential $X_{n+1}$ flows to the transistor 105a in each of the pixels 100. A current based on the potential $X_{n+2}$ flows to the transistor 105b. Moreover, the potential of the wiring 216 is set to "H", so that the potential Vr of the wiring 218 is written to the node C and the potential of the node C is initialized to the potential Vr.

In a period T25_2, the potential of the wiring 111a_1 is set to a potential corresponding to the weight coefficient W41, and the potential of the wiring 112a_1 is set to "H", so that the weight coefficient W41 is added to the nodes NDa of the pixels 100 in the first row by capacitive coupling of the capacitors 104a.

The potential of the wiring 111a_2 is set to a potential corresponding to the weight coefficient W42, and the potential of the wiring 112a_2 is set to "H", so that the weight coefficient W42 is added to the nodes NDa of the pixels 100 in the second row by capacitive coupling of the capacitors 104a.

The potential of the wiring 111a_3 is set to a potential corresponding to the weight coefficient W43, and the potential of the wiring 112a_3 is set to "H", so that the weight coefficient W43 is added to the nodes NDa of the pixels 100 in the third row by capacitive coupling of the capacitors 104a.

The potential of the wiring 111b_1 is set to a potential corresponding to the weight coefficient W31, and the potential of the wiring 112b_1 is set to "H", so that the weight coefficient W31 is added to the nodes NDb of the pixels 100 in the first row by capacitive coupling of the capacitors 104b.

The potential of the wiring 111b_2 is set to a potential corresponding to the weight coefficient W32, and the potential of the wiring 112b_2 is set to "H", so that the weight coefficient W32 is added to the nodes NDb of the pixels 100 in the second row by capacitive coupling of the capacitors 104b.

The potential of the wiring 111b_3 is set to a potential corresponding to the weight coefficient W33, and the potential of the wiring 112b_3 is set to "H", so that the weight coefficient W33 is added to the nodes NDb of the pixels 100 in the third row by capacitive coupling of the capacitors 104b.

In the pixels 100 in the first row, a current corresponding to the potential $W41+X_{n+1}$ flows to the transistors 105a and a current corresponding to the potential $W31+X_{n+2}$ flows to the transistors 105b. In the pixels 100 in the second row, a current corresponding to the potential $W42+X_{n+1}$ flows to the transistors 105a and a current corresponding to the potential $W32+X_{n+2}$ flows to the transistors 105b. In the pixels 100 in the third row, a current corresponding to the potential $W43+X_{n+1}$ flows to the transistors 105a and a current corresponding to the potential $W33+X_{n+2}$ flows to the transistors 105b.

In the period T24_2 to the period T25_2, a weight is supplied with use of the third filter FL12 to the image data $IM_{n+2}$ obtained in the n+2-th frame in the circuit 130b, and a weight is supplied with use of the fourth filter FL22 to the retained image data $IM_{n+1}$ obtained in the n+1-th frame in the circuit 130a. In the period T24_2 to the period T25_2, the data A in the case of using the third filter FL12 and the fourth filter FL22 is calculated.

Similarly, in a period T24_3 to a period T25_3, a weight is supplied with use of the fifth filter FL13 to the image data $IM_{n+2}$ obtained in the n+2-th frame in the circuit 130b, and a weight is supplied with use of the sixth filter FL23 to the retained image data $IM_{n+1}$ obtained in the n+1-th frame in the circuit 130a. In the period T24_3 to the period T25_3, the data A in the case of using the fifth filter FL13 and the sixth filter FL23 is calculated.

The description of FIG. 7 can be referred to for the period T26; thus, the detailed description thereof is omitted.

The above is the description of the operation of the n+2-th frame.

Also in the subsequent frames, operations similar to the above can be performed.

Figure 11:
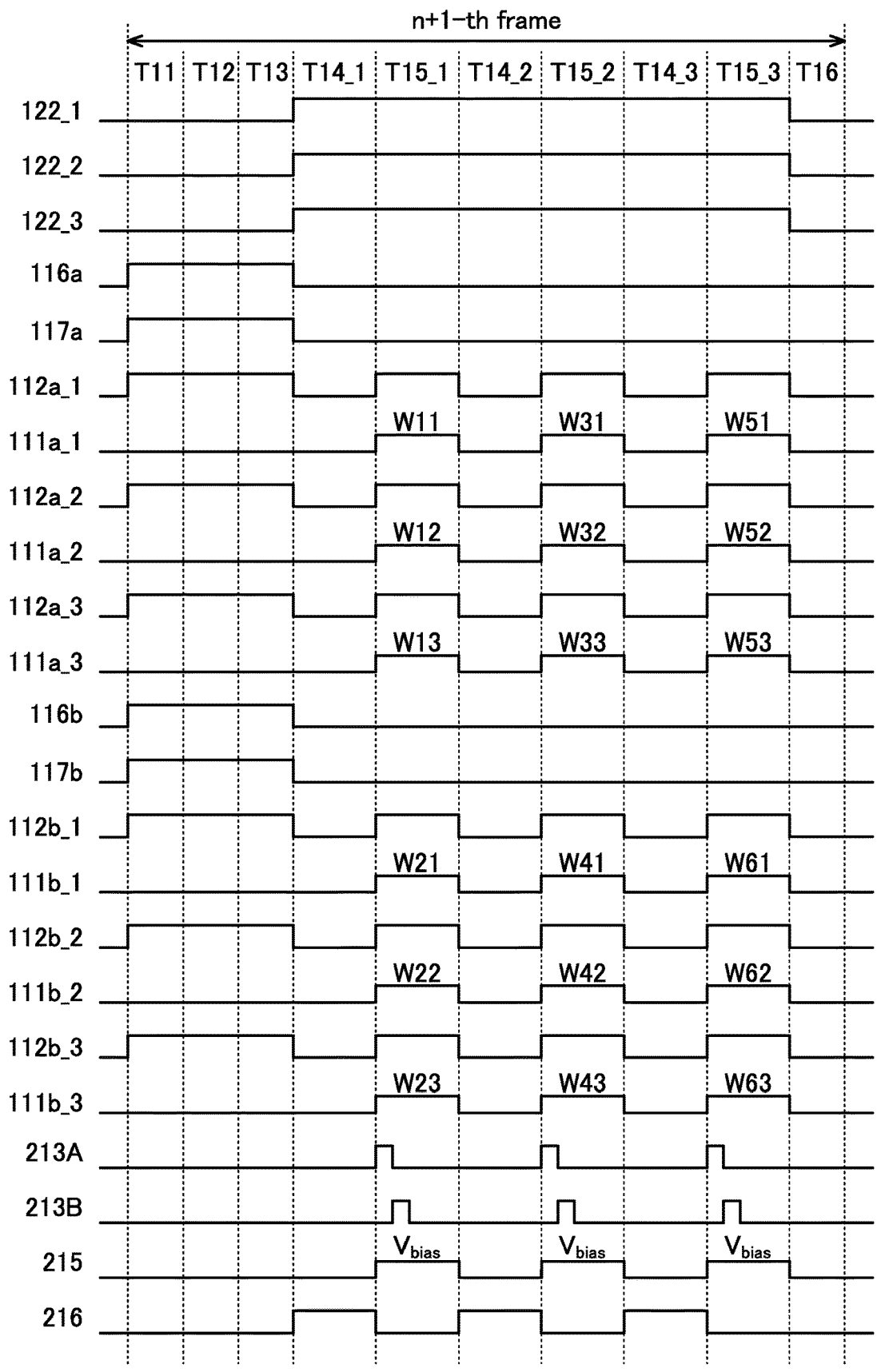
FIG. 11 is a timing chart showing operations of a pixel block and a circuit.
Figure 12:
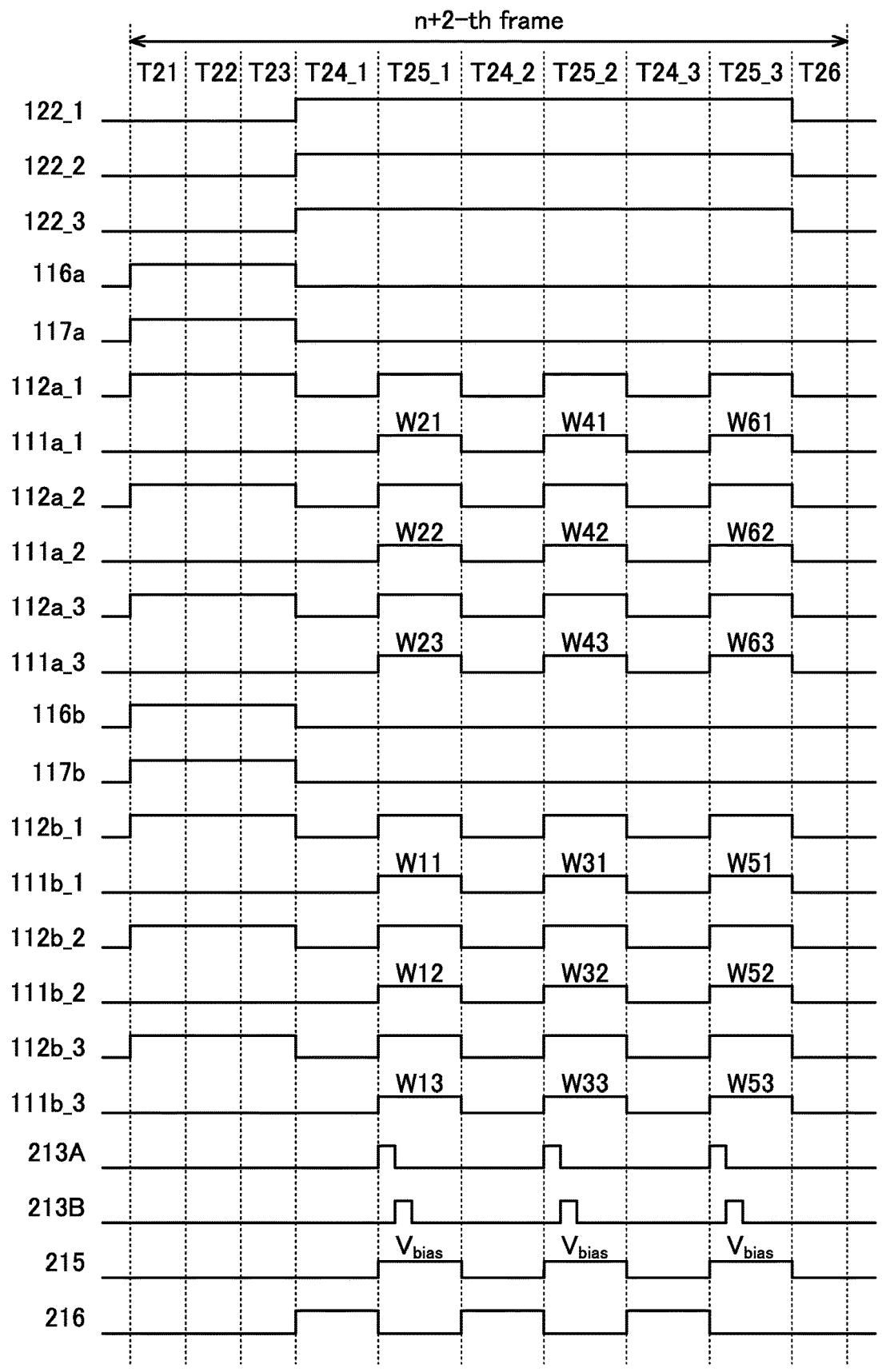
FIG. 12 is a timing chart showing operations of a pixel block and a circuit.

FIG. 11 and FIG. 12 are timing charts showing an operation of calculating the difference (data B) between the data without light exposure and the data obtained by supplying weights to the data in the pixel block 200 and the circuit 201. Note that the description of the portions common to FIG. 8 described above is omitted, and different portions are mainly described.

Here, the operation of the n+1-th frame is described with reference to FIG. 11. Note that FIG. 11 corresponds to the operation of the n+1-th frame shown in FIG. 8.

The description of FIG. 8 can be referred to for the period T11 to the period T13; thus, the detailed description thereof is omitted.

The description of the period T14 to the period T15 of FIG. 8 can be referred to for the period T14_1 to the period T15_1; thus, the detailed description thereof is omitted. In the period T14_1 to the period T15_1, the data B in the case of using the first filter FL11 and the second filter FL21 in the n+i-th frame is calculated.

In the period T14_2, the potentials of the wiring 112$a$_1, the wiring 112$a$_2, the wiring 112$a$_3, the wiring 112$b$_1, the wiring 112$b$_2, and the wiring 112$b$_3 are set to "L". At this time, a current corresponding to the reset potential flows to the transistor 105$a$ in each of the pixels 100. Moreover, the potential of the wiring 216 is set to "H", so that the potential Vr of the wiring 218 is written to the node C. The operation in the period T14 corresponds to obtainment of the data without light exposure, and the data is initialized to the potential Vr of the node C.

In the period T15_2, the potential of the wiring 111$a$_1 is set to a potential corresponding to the weight coefficient W31, and the potential of the wiring 112$a$_1 is set to "H", so that the weight coefficient W31 is added to the nodes NDa of the pixels 100 in the first row by capacitive coupling of the capacitors 104$a$.

The potential of the wiring 111$a$_2 is set to a potential corresponding to the weight coefficient W32, and the potential of the wiring 112$a$_2 is set to "H", so that the weight coefficient W32 is added to the nodes NDa of the pixels 100 in the second row by capacitive coupling of the capacitors 104$a$.

The potential of the wiring 111$a$_3 is set to a potential corresponding to the weight coefficient W33, and the potential of the wiring 112$a$_3 is set to "H", so that the weight coefficient W33 is added to the nodes NDa of the pixels 100 in the third row by capacitive coupling of the capacitors 104$a$.

The potential of the wiring 111$b$_1 is set to a potential corresponding to the weight coefficient W41, and the potential of the wiring 112$b$_1 is set to "H", so that the weight coefficient W41 is added to the nodes NDb of the pixels 100 in the first row by capacitive coupling of the capacitors 104$b$.

The potential of the wiring 111$b$_2 is set to a potential corresponding to the weight coefficient W42, and the potential of the wiring 112$b$_2 is set to "H", so that the weight coefficient W42 is added to the nodes NDb of the pixels 100 in the second row by capacitive coupling of the capacitors 104$b$.

The potential of the wiring 111$b$_3 is set to a potential corresponding to the weight coefficient W43, and the potential of the wiring 112$b$_3 is set to "H", so that the weight coefficient W43 is added to the nodes NDb of the pixels 100 in the third row by capacitive coupling of the capacitors 104$b$.

In the period T14_2 to the period T15_2, the data B in the case of using the third filter FL12 and the fourth filter FL22 is calculated.

Similarly, in the period T14_3 to the period T15_3, the data B in the case of using the fifth filter FL13 and the sixth filter FL23 is calculated.

The description of FIG. 8 can be referred to for the period T16; thus, the detailed description thereof is omitted.

The above is the description of the operation of the n+1-th frame.

Here, the operation of the n+2-th frame is described with reference to FIG. 12. Note that FIG. 12 corresponds to the operation of the n+2-th frame shown in FIG. 8.

The description of FIG. 8 can be referred to for the period T21 to the period T23; thus, the detailed description thereof is omitted.

The description of the period T24 to the period T25 of FIG. 8 can be referred to for a period T24_1 to a period T25_1; thus, the detailed description thereof is omitted. In the period T24_1 to the period T25_1, the data B in the case of using the first filter FL11 and the second filter FL21 in the n+2-th frame is calculated.

In the period T24_2, the potentials of the wiring 112$a$_1, the wiring 112$a$_2, the wiring 112$a$_3, the wiring 112$b$_1, the wiring 112$b$_2, and the wiring 112$b$_3 are set to "L". At this time, a current corresponding to the reset potential flows to the transistor 105$a$ in each of the pixels 100. Moreover, the potential of the wiring 216 is set to "H", so that the potential Vr of the wiring 218 is written to the node C. The operation in the period T14 corresponds to obtainment of the data without light exposure, and the data is initialized to the potential Vr of the node C.

In the period T25_2, the potential of the wiring 111$a$_1 is set to a potential corresponding to the weight coefficient W41, and the potential of the wiring 112$a$_1 is set to "H", so that the weight coefficient W41 is added to the nodes NDa of the pixels 100 in the first row by capacitive coupling of the capacitors 104$a$.

The potential of the wiring 111$a$_2 is set to a potential corresponding to the weight coefficient W42, and the potential of the wiring 112$a$_2 is set to "H", so that the weight coefficient W42 is added to the nodes NDa of the pixels 100 in the second row by capacitive coupling of the capacitors 104$a$.

The potential of the wiring 111$a$_3 is set to a potential corresponding to the weight coefficient W43, and the potential of the wiring 112$a$_3 is set to "H", so that the weight coefficient W43 is added to the nodes NDa of the pixels 100 in the third row by capacitive coupling of the capacitors 104$a$.

The potential of the wiring 111$b$_1 is set to a potential corresponding to the weight coefficient W31, and the potential of the wiring 112$b$_1 is set to "H", so that the weight coefficient W31 is added to the nodes NDb of the pixels 100 in the first row by capacitive coupling of the capacitors 104$b$.

The potential of the wiring 111$b$_2 is set to a potential corresponding to the weight coefficient W32, and the potential of the wiring 112$b$_2 is set to "H", so that the weight coefficient W32 is added to the nodes NDb of the pixels 100 in the second row by capacitive coupling of the capacitors 104$b$.

The potential of the wiring 111$b$_3 is set to a potential corresponding to the weight coefficient W33, and the potential of the wiring 112$b$_3 is set to "H", so that the weight coefficient W33 is added to the nodes NDb of the pixels 100 in the third row by capacitive coupling of the capacitors 104$b$.

In the period T24_2 to the period T25_2, the data B in the case of using the third filter FL12 and the fourth filter FL22 is calculated.

Similarly, in the period T24_3 to the period T25_3, the data B in the case of using the fifth filter FL13 and the sixth filter FL23 is calculated.

The description of FIG. 8 can be referred to for the period T26; thus, the detailed description thereof is omitted.

The above is the description of the operation of the n+2-th frame.

Also in the subsequent frames, operations similar to the above can be performed.

Although the example in which the circuit 130$a$ and the circuit 130$b$ each use three kinds of filters is shown here, one embodiment of the present invention is not limited thereto. The circuit 130$a$ and the circuit 130$b$ may each use two kinds or four or more kinds of filters. The circuit 130*a* and the circuit 130*b* may each use one kind of filter.

Structure Example 2 of Pixel Circuit

Figure 13:
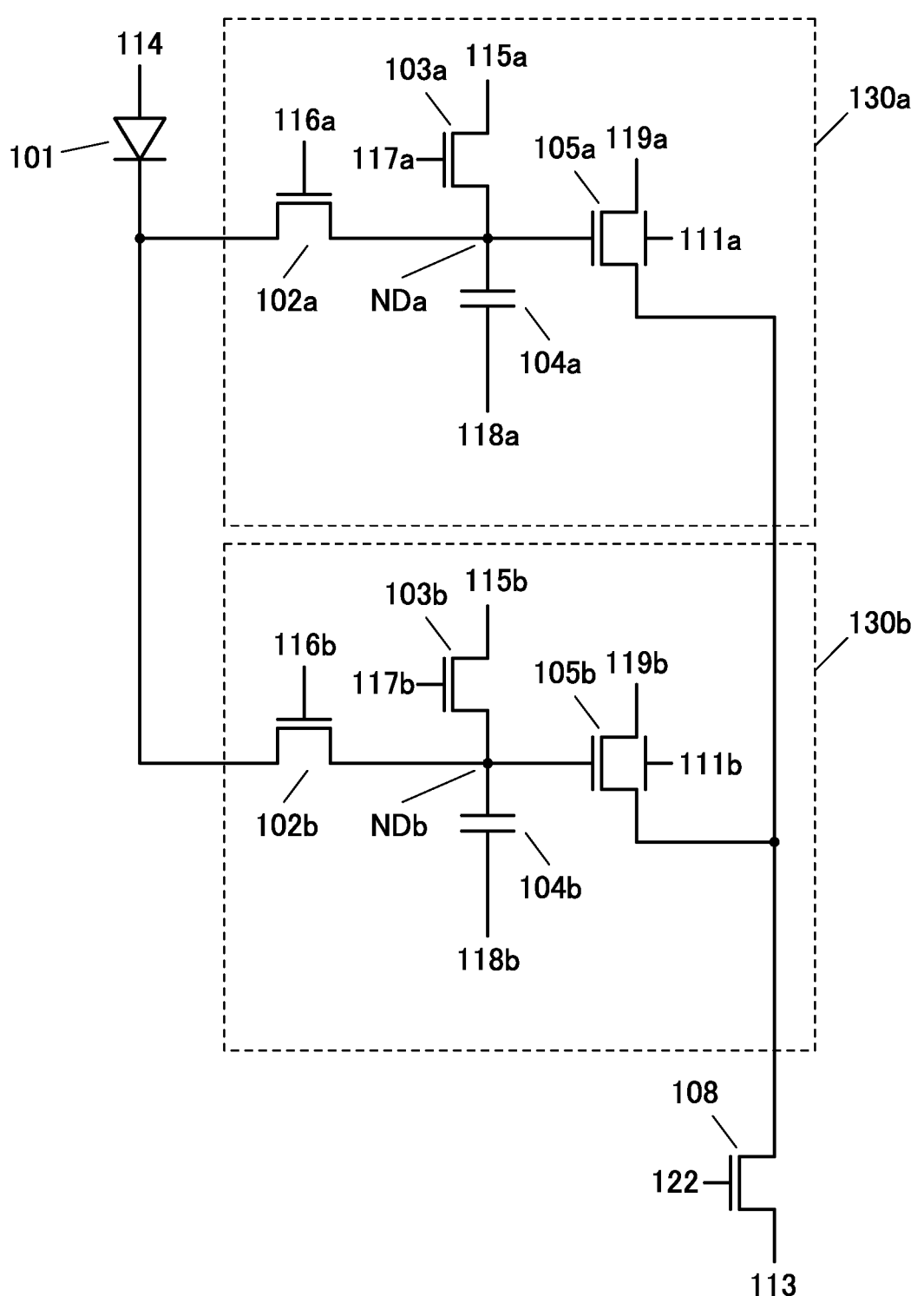
FIG. 13 is a diagram illustrating a pixel.

FIG. 13 shows a structure example different from that of the pixel 100 illustrated in FIG. 4.

The pixel 100 illustrated in FIG. 13 is different from the pixel 100 illustrated in FIG. 4 mainly in that the transistor 105*a* and the transistor 105*b* each include a back gate and the transistor 106*a* and the transistor 106*b* are not provided.

In the pixel 100 illustrated in FIG. 13, the back gate of the transistor 105*a* is electrically connected to the wiring 111*a* and supplied with a potential corresponding to a weight coefficient (W) from the wiring 111*a*. The threshold voltage ($V_{th}$) of the transistor 105*a* negatively shifts by the weight coefficient (W), and on-state current increases as in the case where a front gate is supplied with the weight coefficient (W). The back gate of the transistor 105*b* is electrically connected to the wiring 111*b* and supplied with a potential corresponding to a weight coefficient (W) from the wiring 111*b*. The threshold voltage ($V_{th}$) of the transistor 105*b* negatively shifts by the weight coefficient (W), and on-state current increases as in the case where a front gate is supplied with the weight coefficient (W). The difference between the data A and the data B is $k\Sigma(2W \cdot X)$ also in the pixel 100 illustrated in FIG. 13, and offset components other than the product of the image data (X) and the weight coefficient (W) can be eliminated. As the transistor 105*a* and the transistor 105*b* each including the back gate, OS transistors can be suitably used.

In the pixel 100 illustrated in FIG. 13, the other electrode of the capacitor 104*a* is electrically connected to a wiring 118*a*. The other electrode of the capacitor 104*b* is electrically connected to a wiring 118*b*. The wiring 118*a* and the wiring 118*b* each have a function of supplying a fixed potential. The wiring 118*a* may be common to either the wiring 115*a* or the wiring 119*b*. For example, the other electrode of the capacitor 104*a* can be electrically connected to the wiring 115*a*. Similarly, the wiring 118*b* may be common to either the wiring 115*b* or the wiring 119*b*. For example, the other electrode of the capacitor 104*b* can be electrically connected to the wiring 115*b*. With use of a common wiring, the number of wirings is reduced and the area occupied by the wiring in the pixel can be reduced, so that a high-resolution imaging device can be obtained.

The above description of FIG. 7 to FIG. 12 can be referred to for an imaging operation; thus, the detailed description thereof is omitted.

<Circuit 301 and Circuit 302>

Figures 14A, 14B:
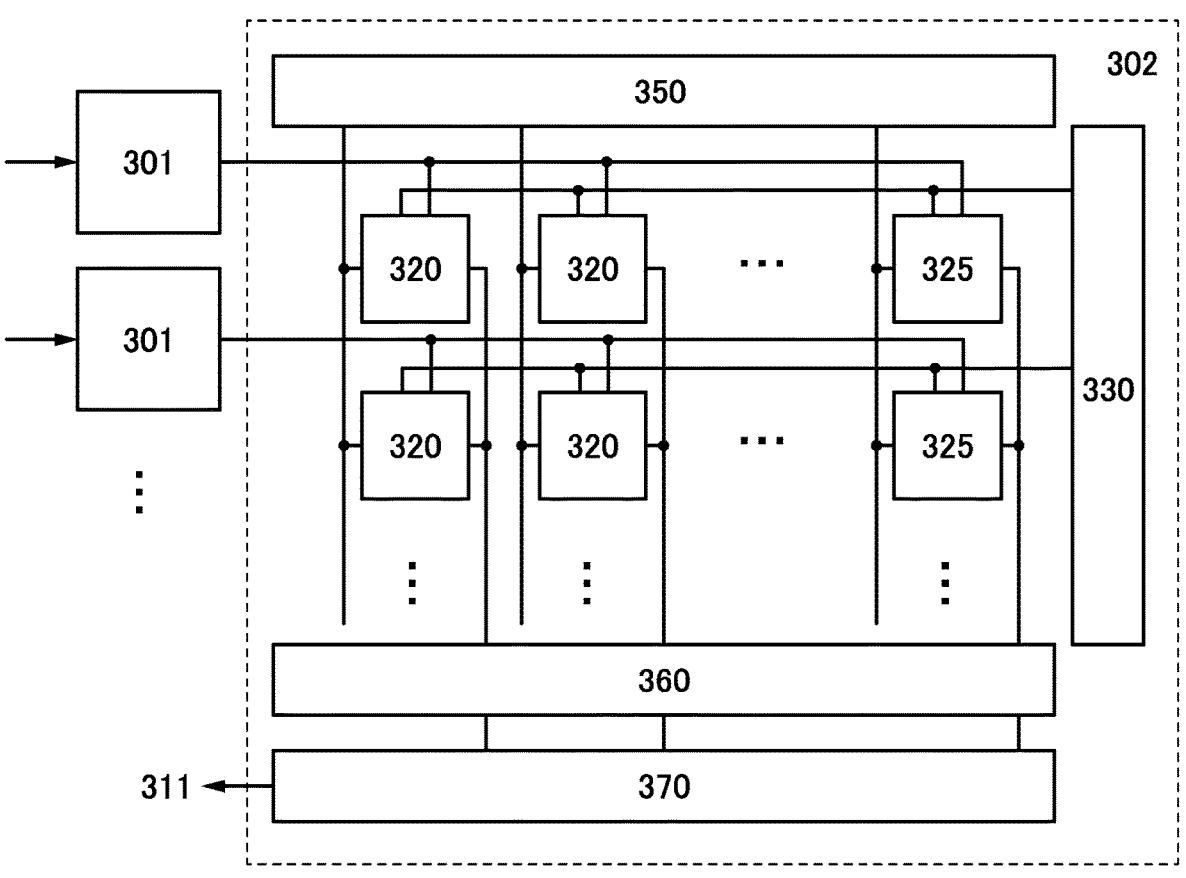
FIG. 14A and FIG. 14B are diagrams illustrating circuits.

FIG. 14A is a diagram illustrating the circuit 302 and the circuits 301 connected to the circuit 201. Product-sum operation result data output from the circuit 201 are sequentially input to the circuits 301. The circuits 301 may each have a variety of arithmetic functions in addition to the above-described function of calculating the difference between the data A and the data B. For example, the circuits 301 can have a structure similar to that of the circuit 201. Alternatively, the function of the circuits 301 may be replaced by software processing.

The circuits 301 may each include a circuit that performs an arithmetic operation of an activation function. A comparator circuit can be used as the circuit, for example. A comparator circuit outputs a result of comparing input data and a set threshold as binary data. In other words, the pixel blocks 200 and the circuits 301 can operate as part of elements in a neural network.

The circuit 301 may include an A/D converter. When image data is output to the outside from the pixel blocks 200 with or without undergoing a product-sum operation, the analog data can be converted into digital data by the circuits 301.

For example, in the pixel block 200 including the pixels 100 arranged in three rows and three columns, when the same weight (e.g., 0) is supplied to all the pixels 100 and the transistor 108 included in the pixel from which data is to be output is turned on, the sum of image data of the whole pixel block 200, the row-basis sum of image data, data from each pixel, or the like can be output from the pixel block 200.

In the case where the data output from the pixel blocks 200, which corresponds to image data of a plurality of bits, can be binarized by the circuits 301, the binarization can be rephrased as compression of image data.

Data output from the circuits 301 are sequentially input to the circuit 302. The circuit 302 can have a structure including a latch circuit, a shift register, and the like, for example. With this structure, parallel-serial conversion can be performed and data input in parallel can be output to a wiring 311 as serial data.

As illustrated in FIG. 14B, the circuit 302 may include a neural network. The neural network includes memory cells arranged in a matrix, and each memory cell retains a weight coefficient. Data output from the circuits 301 are input to corresponding memory cells 320, and a product-sum operation can be performed. Note that the number of memory cells illustrated in FIG. 14B is an example, and the number is not limited thereto. Data after the product-sum operation can be output to the wiring 311.

The connection destination of the wiring 311 is not limited in FIG. 14A and FIG. 14B. For example, it can be connected to a neural network, a memory device, a communication device, or the like.

The neural network illustrated in FIG. 14B includes the memory cells 320 and reference memory cells 325 which are arranged in a matrix, a circuit 330, a circuit 350, a circuit 360, and a circuit 370.

Figure 15:
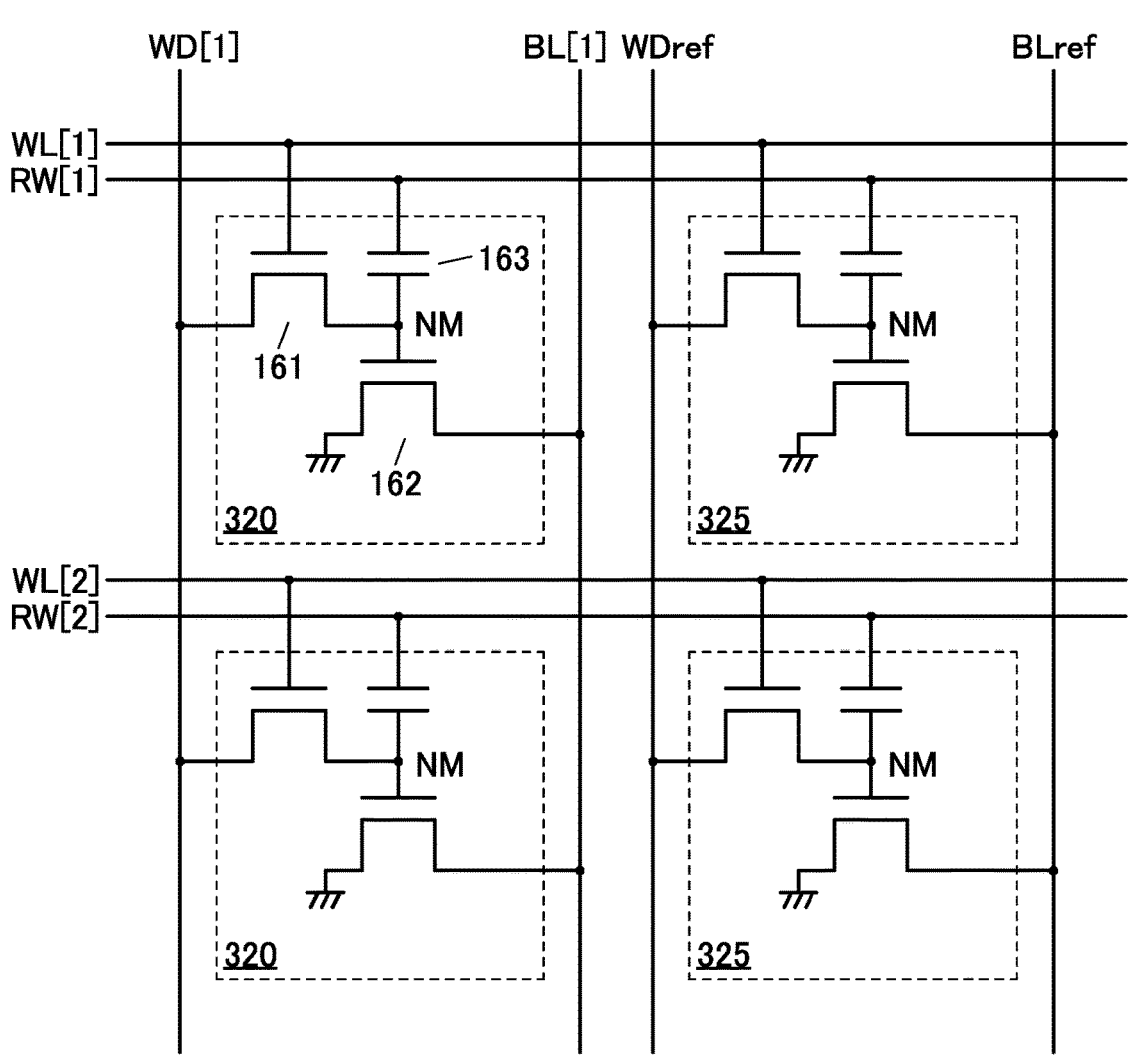
FIG. 15 is a diagram illustrating memory cells.

FIG. 15 illustrates an example of the memory cells 320 and the reference memory cells 325. The reference memory cells 325 are provided in an arbitrary one column. The memory cells 320 and the reference memory cells 325 have similar structures and each include a transistor 161, a transistor 162, and a capacitor 163.

One of a source and a drain of the transistor 161 is electrically connected to a gate of the transistor 162. The gate of the transistor 162 is electrically connected to one electrode of the capacitor 163. Here, a point where the one of the source and the drain of the transistor 161, the gate of the transistor 162, and the one electrode of the capacitor 163 are connected is referred to as a node NM.

A gate of the transistor 161 is electrically connected to a wiring WL. The other electrode of the capacitor 163 is electrically connected to a wiring RW. One of a source and a drain of the transistor 162 is electrically connected to a reference potential wiring such as a GND wiring.

In the memory cell 320, the other of the source and the drain of the transistor 161 is electrically connected to a wiring WD. The other of the source and the drain of transistor 162 is electrically connected to a wiring BL.

In the reference memory cell 325, the other of the source and the drain of the transistor 161 is electrically connected to a wiring WDref. The other of the source and the drain of the transistor 162 is electrically connected to a wiring BLref.

The wiring WL is electrically connected to the circuit 330. As the circuit 330, a decoder, a shift register, or the like can be used.

The wiring RW is electrically connected to the circuit 301. Binary data output from the circuit 301 is written to each memory cell. Note that a sequential circuit such as a shift register may be included between the circuit 301 and the memory cells.

The wiring WD and the wiring WDref are electrically connected to the circuit 350. As the circuit 350, a decoder, a shift register, or the like can be used. The circuit 350 may include a D/A converter or an SRAM. The circuit 350 can output a weight coefficient to be written to the node NM.

The wiring BL and the wiring BLref are electrically connected to the circuit 360. The circuit 360 can have a structure equivalent to that of the circuit 201. By the circuit 360, a signal of a product-sum operation result from which offset components are eliminated can be obtained.

The circuit 360 is electrically connected to the circuit 370. The circuit 370 can also be referred to as an activation function circuit. The activation function circuit has a function of performing an arithmetic operation for converting the signal input from the circuit 360 in accordance with a predefined activation function. As the activation function, for example, a sigmoid function, a tan h function, a softmax function, a ReLU function, a threshold function, or the like can be used. The signal converted by the activation function circuit is output to the outside as output data.

Figure 16A:
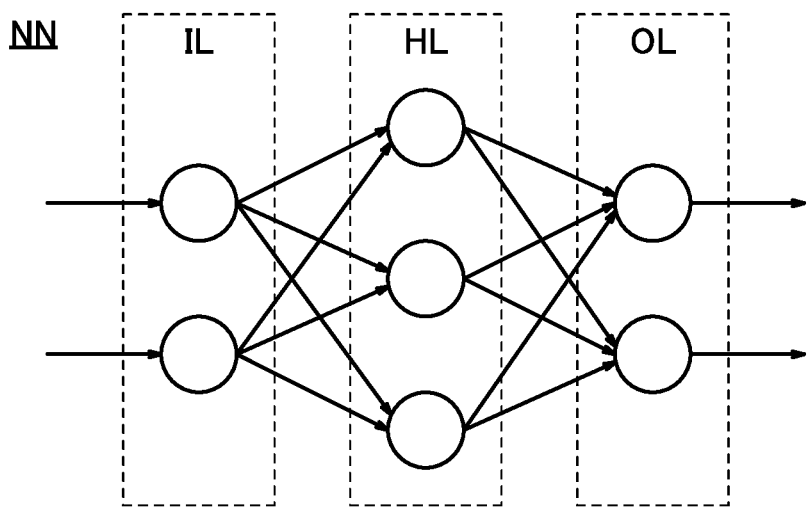
FIG. 16A and FIG. 16B are diagrams showing a structure example of a neural network.

As illustrated in FIG. 16A, a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as a DNN (deep neural network). Learning using a deep neural network can also be referred to as deep learning.

Input data is input to each neuron in the input layer IL. A signal output from a neuron in the previous layer or the subsequent layer is input to each neuron in the middle layer HL. To each neuron in the output layer OL, output signals of the neurons in the previous layer are input. Note that each neuron may be connected to all the neurons in the previous and subsequent layers (full connection), or may be connected to some of the neurons.

In the case of a convolutional neural network (CNN), the middle layer HL can be configured to include a layer in which convolutional processing is performed (a convolutional layer), a layer in which pooling processing is performed (a pooling layer), and a layer in which fully connected processing is performed (a fully connected layer). In the convolutional layer, feature extraction is performed by performing the convolutional processing. For the convolutional processing, one or a plurality of weight filters can be used. Note that the middle layer HL may include a normalization layer or the like other than the above. In the convolutional processing, processings such as padding and stride may be combined.

Figure 16B:
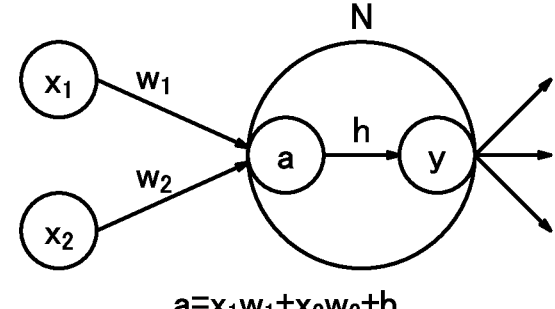

FIG. 16B illustrates an example of an arithmetic operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that the value $a=x_1w_1+x_2w_2+b$ is obtained. Then, the value a is converted with an activation function h, and an output signal y=ah is output from the neuron N.

In this manner, the arithmetic operation with the neurons includes the arithmetic operation that sums the products of the outputs and the weights of the neurons in the previous layer, that is, the product-sum operation ($x_1w_1+x_2w_2$ described above). This product-sum operation may be performed using a program on software or may be performed using hardware.

In one embodiment of the present invention, an analog circuit is used as hardware to perform a product-sum operation. In the case where an analog circuit is used as the product-sum operation circuit, the circuit scale of the product-sum operation circuit can be reduced, or higher processing speed and lower power consumption can be achieved by reduced frequency of access to a memory.

The product-sum operation circuit preferably has a structure including an OS transistor. An OS transistor is suitably used as a transistor included in an analog memory of the product-sum operation circuit because of its extremely low off-state current. Note that the product-sum operation circuit may be formed using both a Si transistor and an OS transistor.

This embodiment can be combined with the description of the other embodiments as appropriate.

Embodiment 2

In this embodiment, structure examples and the like of the imaging device of one embodiment of the present invention will be described.

Structure Example

Figures 17A, 17B, 17C, 17D:
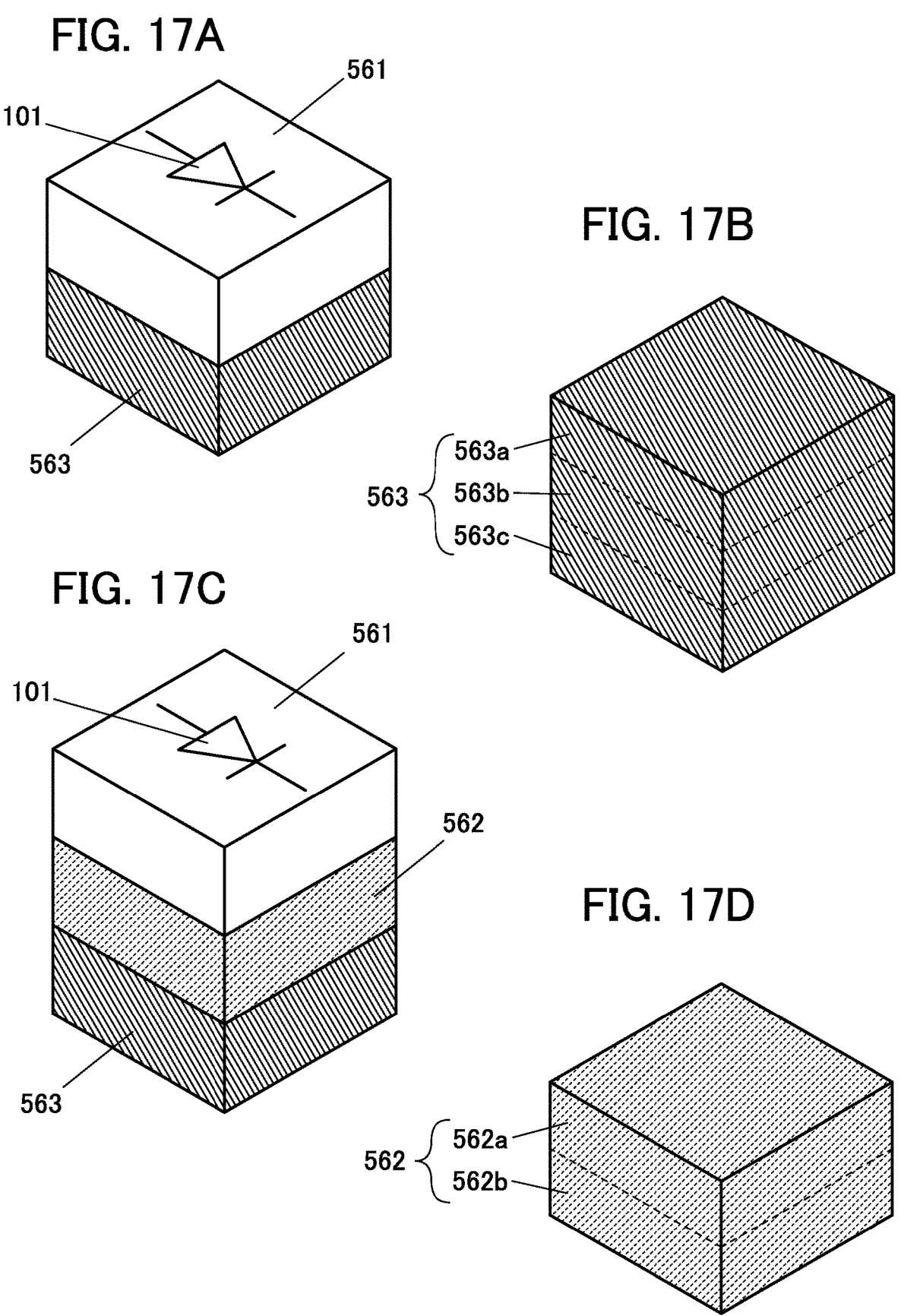
FIG. 17A to FIG. 17D are diagrams illustrating structures of a pixel of an imaging device.

FIG. 17A is a diagram illustrating a structure example of a pixel in an imaging device, and a stacked-layer structure of a layer 561 and a layer 563 can be employed.

The layer 561 includes the photoelectric conversion device 101. The photoelectric conversion device 101 can include a layer 565a and a layer 565b as illustrated in FIG. 18A. Note that a layer may be rephrased as a region, depending on the case.

The photoelectric conversion device 101 illustrated in FIG. 18A is a pn junction photodiode; for example, a p-type semiconductor can be used for the layer 565a, and an n-type semiconductor can be used for the layer 565b. Alternatively, an n-type semiconductor may be used for the layer 565a, and a p-type semiconductor may be used for the layer 565b.

The pn junction photodiode can be formed typically using single crystal silicon. A photodiode in which single crystal silicon is used for a photoelectric conversion layer has relatively wide spectral sensitivity to light from ultraviolet light to near-infrared light and can detect light of various wavelengths by being combined with an optical conversion layer described later.

Alternatively, a compound semiconductor may be used for the photoelectric conversion layer of the pn junction photodiode. As the compound semiconductor, gallium arsenic phosphide (GaAsP), gallium phosphide (GaP), indium gallium arsenide (InGaAs), lead sulfide (PbS), lead selenide (PbSe), indium arsenide (InAs), indium antimonide (InSb), or mercury cadmium telluride (HgCdTe) can be used, for example.

The compound semiconductor is preferably a compound semiconductor including a Group 13 element (e.g., aluminum, gallium, or indium) and a Group 15 element (e.g., nitrogen, phosphorus, arsenic, or antimony) (such a compound semiconductor is also referred to as a Group III-V compound semiconductor) or a compound semiconductor including a Group 12 element (e.g., magnesium, zinc, cadmium, or mercury) and a Group 16 element (e.g., oxygen, sulfur, selenium, or tellurium) (such a compound semiconductor is also referred to as a Group II-VI compound semiconductor).

The use of the compound semiconductor, which can change the bandgap depending on the combination of constituent elements and the atomic ratio of the elements, enables formation of a photodiode having sensitivity to a wide wavelength range from ultraviolet light to infrared light.

Note that the wavelength of ultraviolet light can be generally defined as the vicinity of 0.01 μm to the vicinity of 0.38 μm, the wavelength of visible light can be generally defined as the vicinity of 0.38 μm to the vicinity of 0.75 μm, the wavelength of near-infrared light can be generally defined as the vicinity of 0.75 μm to the vicinity of 2.5 μm, the wavelength of mid-infrared light can be generally defined as the vicinity of 2.5 μm to the vicinity of 4 μm, and the wavelength of far-infrared light can be generally defined as the vicinity of 4 μm to the vicinity of 1000 μm.

For example, to form a photodiode having sensitivity to light from ultraviolet light to visible light, GaP or the like can be used for the photoelectric conversion layer. To form a photodiode having sensitivity to light from ultraviolet light to near-infrared light, silicon, GaAsP, or the like described above can be used for the photoelectric conversion layer. Furthermore, to form a photodiode having sensitivity to light from visible light to mid-infrared light, InGaAs or the like can be used for the photoelectric conversion layer. To form a photodiode having sensitivity to light from near-infrared light to mid-infrared light, PbS, InAs, or the like can be used for the photoelectric conversion layer. To form a photodiode having sensitivity to light from mid-infrared light to far-infrared light, PbSe, InSb, HgCdTe, or the like can be used for the photoelectric conversion layer.

Note that the photodiodes using the above-described compound semiconductors may be pin junction photodiodes as well as pn junction photodiodes. Furthermore, the pn junction and the pin junction may have a heterojunction structure without being limited to a homojunction structure.

For example, in the heterojunction, a first compound semiconductor can be used as one layer of the pn junction structure, and a second compound semiconductor that is different from the first compound semiconductor can be used as the other layer. Furthermore, a first compound semiconductor can be used as any one or two layers of the pin junction structure, and a second compound semiconductor that is different from the first compound semiconductor can be used as the other layer(s). Note that one of the first compound semiconductor and the second compound semiconductor may be a semiconductor of a single element such as silicon.

Note that different materials may be used for different pixels in forming photoelectric conversion layers of photodiodes. With this structure, an imaging device which includes any two kinds of pixels or three kinds of pixels among a pixel that detects ultraviolet light, a pixel that detects visible light, a pixel that detects infrared light, and the like can be formed.

The photoelectric conversion device 101 included in the layer 561 may have a stacked-layer structure of a layer 566a, a layer 566b, a layer 566c, and a layer 566d as illustrated in FIG. 18B. The photoelectric conversion device 101 illustrated in FIG. 18B is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566d. For example, indium oxide, tin oxide, zinc oxide, indium tin oxide, gallium zinc oxide, indium gallium zinc oxide, graphene, or the like can be used. Note that a structure in which the layer 566d is omitted can also be employed.

A structure of a pn junction photodiode containing a selenium-based material in a photoelectric conversion layer can be used for the layer 566b and the layer 566c of the photoelectric conversion portion, for example. A selenium-based material, which is a p-type semiconductor, is preferably used for the layer 566b, and gallium oxide or the like, which is an n-type semiconductor, is preferably used for the layer 566c.

A photoelectric conversion device containing a selenium-based material has characteristics of high external quantum efficiency with respect to visible light. In the photoelectric conversion device, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As the selenium-based material, crystalline selenium (single crystal selenium or polycrystalline selenium) or amorphous selenium can be used. These selenium-based materials have sensitivity to light from ultraviolet light to visible light. Furthermore, a compound of copper, indium, and selenium (CIS), a compound of copper, indium, gallium, and selenium (CIGS), or the like can be used. These compounds have sensitivity to light from ultraviolet light to near-infrared light.

An n-type semiconductor is preferably formed using a material with a wide band gap and a light-transmitting property with respect to visible light. For example, zinc oxide, gallium oxide, indium oxide, tin oxide, or mixed oxide thereof can be used. In addition, these materials have a function of a hole-injection blocking layer, so that a dark current can be decreased.

The photoelectric conversion device 101 included in the layer 561 may have a stacked-layer structure of a layer 567a, a layer 567b, a layer 567c, a layer 567d, and a layer 567e as illustrated in FIG. 18C. The photoelectric conversion device 101 illustrated in FIG. 18C is an example of an organic photoconductive film; the layer 567a is a lower electrode, the layer 567e is an upper electrode having a light-transmitting property, and the layers 567b, 567c, and 567d correspond to a photoelectric conversion portion.

One of the layers 567b and 567d in the photoelectric conversion portion can be a hole-transport layer and the other can be an electron-transport layer. The layer 567c can be a photoelectric conversion layer.

For the hole-transport layer, molybdenum oxide can be used, for example. For the electron-transport layer, fullerene such as $C_{60}$ or $C_{70}$, or a derivative thereof can be used, for example.

As the photoelectric conversion layer, a mixed layer of an n-type organic semiconductor and a p-type organic semiconductor (bulk heterojunction structure) can be used. There are various organic semiconductors, and a material having sensitivity to light with an intended wavelength is selected as a photoelectric conversion layer.

For the layer 563 illustrated in FIG. 17A, a silicon substrate can be used, for example. The silicon substrate includes a Si transistor or the like. With the use of the Si transistor, as well as a pixel circuit, a circuit for driving the pixel circuit, a circuit for reading out an image signal, an image processing circuit, a neural network, a communication circuit, or the like can be formed. Furthermore, a CPU (Central Processing Unit), an MCU (Micro Controller Unit), a memory circuit such as a DRAM (Dynamic Random Access Memory), or the like may be formed. Note that the above-described circuits except the pixel circuit are each referred to as a functional circuit in this embodiment.

For example, some or all of the transistors included in the pixel circuits (the pixels 100) and the functional circuits (the circuit 201, the circuit 301, the circuit 302, the circuit 303, the circuit 304, the circuit 305, and the like) described in Embodiment 1 can be provided in the layer 563.

The layer 563 may be a stack of a plurality of layers as illustrated in FIG. 17B. Although FIG. 17B illustrates three layers 563a, 563b, and 563c as an example, a two-layer structure may be employed as well. Alternatively, the layer 563 may be a stack of four or more layers. These layers can be stacked by a bonding process, for example. With this structure, the pixel circuits and the functional circuits can be dispersed in a plurality of layers; thus, the pixel circuits and the functional circuits can be provided to overlap with each other, which enables a small-sized and high-performance imaging device to be manufactured.

The pixel may have a stacked-layer structure of the layer 561, a layer 562, and the layer 563 as illustrated in FIG. 17C.

The layer 562 can include OS transistors. One or more of the functional circuits described above may be formed using OS transistors. Alternatively, one or more of the functional circuits may be formed using Si transistors included in the layer 563 and the OS transistors included in the layer 562. Alternatively, the layer 563 may be a support substrate such as a glass substrate, and the functional circuits may be formed using the OS transistors included in the layer 562.

A normally-off CPU (also referred to as "Noff-CPU") can be formed using an OS transistor and a Si transistor, for example. Note that the Noff-CPU is an integrated circuit including a normally-off transistor, which is in a non-conduction state (also referred to as an off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the Noff-CPU can have a reduced power consumption without a significant decrease in operation speed.

The layer 562 may be a stack of a plurality of layers as illustrated in FIG. 17D. Although FIG. 17D illustrates two layers 562a and 562b as an example, a stack of three or more layers may be employed as well. These layers can be formed to be stacked over the layer 563, for example. Alternatively, the layers formed over the layer 563 and the layers formed over the layer 561 may be bonded to each other.

As a semiconductor material used for an OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium; and a CAAC-OS, a CAC-OS, each of which will be described later, or the like can be used, for example. A CAAC-OS has a crystal structure including stable atoms and is suitable for a transistor that is required to have high reliability, and the like. A CAC-OS has high mobility and is suitable for a transistor that operates at high speed, and the like.

In an OS transistor, a semiconductor layer has a large energy gap, and thus the OS transistor has an extremely low off-state current of several yoctoamperes per micrometer (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in the Si transistor, are less likely to occur in OS transistors.

A semiconductor layer in an OS transistor can be, for example, a film represented by an In-M-Zn-based oxide that contains indium, zinc, and M (one or more selected from metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide may be formed by an ALD (Atomic layer deposition) method.

It is preferable that the atomic ratio of metal elements of a sputtering target used for forming the In-M-Zn-based oxide by a sputtering method satisfy $In \geq M$ and $Zn \geq M$ The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer may vary from the above atomic ratio of metal elements in the sputtering target in a range of ±40%.

An oxide semiconductor with low carrier density is used for the semiconductor layer. For example, for the semiconductor layer, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

Note that the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to have normally-on characteristics. Hence, the nitrogen concentration (the concentration obtained by secondary ion mass spectrometry) in the semiconductor layer is preferably set to lower than or equal to $5\times10^{18}$ atoms/cm$^3$.

When hydrogen is contained in the oxide semiconductor contained in the semiconductor layer, hydrogen reacts with oxygen bonded to a metal atom to be water, and thus sometimes forms oxygen vacancies in the oxide semiconductor. When the channel formation region in the oxide semiconductor includes oxygen vacancies, the transistor sometimes has normally-on characteristics. In some cases, a defect in which hydrogen enters oxygen vacancies functions as a donor and generates electrons serving as carriers. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen enters oxygen vacancies can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is obtained by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, stable electrical characteristics can be given.

The semiconductor layer may have a non-single-crystal structure, for example. Examples of the non-single-crystal structure include CAAC-OS (C-Axis Aligned Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc be contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), and a mosaic pattern is formed. Then, $InO_{X1}$ or $In_{X2}Zn_{Y2}O_{Z2}$ forming the mosaic pattern is evenly distributed in the film (this composition is hereinafter also referred to as a cloud-like composition).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using $\theta/2\theta$ scan by an Out-of-plane method, which is one of X-ray diffraction (XRD) measurement methods. That is, it is found from the X-ray diffraction measurement that no alignment in the a-b plane direction and the c-axis direction is observed in a measured region.

In an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

For example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, in the CAC-OS, the region including $GaO_{X3}$ or the like as a main component and the region including $In_{X2}Zn_{Y2}O_{Z2}$ or $InO_{X1}$ as a main component are separated to form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility ($\mu$) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when the regions including $GaO_{X3}$ or the like as a main component are distributed in an oxide semiconductor, a leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility ($\mu$) can be achieved.

A semiconductor element using the CAC-OS has high reliability. Thus, the CAC-OS is suitably used as a constituent material of a variety of semiconductor devices.

<Stacked-Layer Structure 1>

Next, a stacked-layer structure of the imaging device will be described with reference to a cross-sectional view. Note that components such as insulating layers and conductive layers are described below as examples, and other components may be further included. Alternatively, some components described below may be omitted. A stacked-layer structure described below can be formed by a bonding process, a polishing process, or the like as needed.

Figure 19:
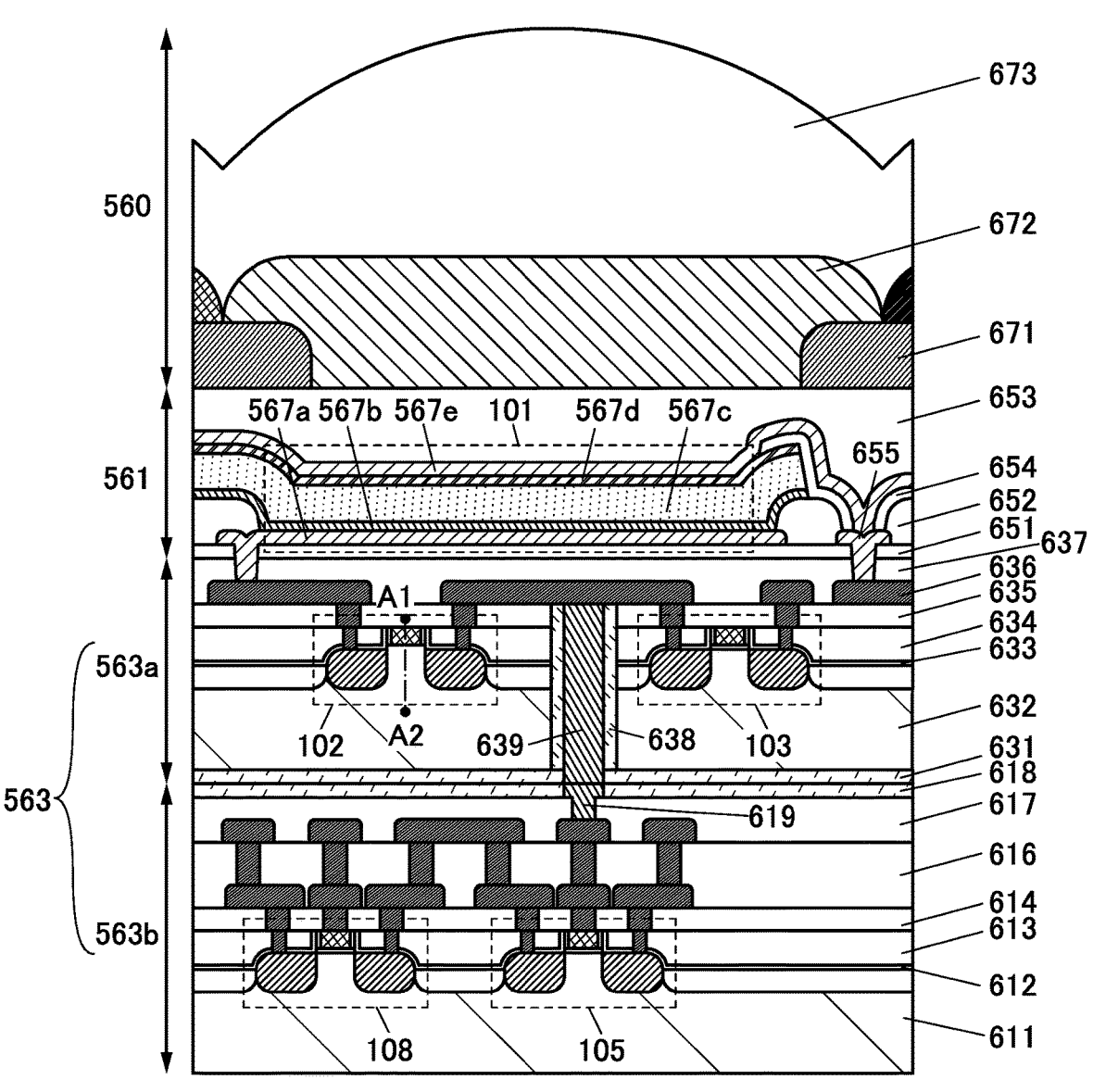
FIG. 19 is a cross-sectional view illustrating a pixel.

FIG. 19 is an example of a cross-sectional view of a stack including a layer 560, the layer 561, and the layer 563 and including a bonding surface between the layer 563a and the layer 563b of the layer 563.

<Layer 563b>

The layer 563b can include a functional circuit provided on a silicon substrate 611. Here, the transistor 105 and the transistor 108 each of which is included in the circuit 130 are illustrated as part of the functional circuit.

The silicon substrate 611 and an insulating layer 612, an insulating layer 613, an insulating layer 614, an insulating layer 616, an insulating layer 617, an insulating layer 618, and a conductive layer 619 are provided in the layer 563b. The insulating layer 612 functions as a protective film. The insulating layer 613, the insulating layer 614, the insulating layer 616, and the insulating layer 617 function as interlayer insulating films and planarization films. The insulating layer 618 and the conductive layer 619 function as bonding layers. The conductive layer 619 is electrically connected to a gate of the transistor 105.

As the protective film, for example, a silicon nitride film, a silicon oxide film, an aluminum oxide film, or the like can be used. As the interlayer insulating film and the planarization film, for example, an inorganic insulating film such as a silicon oxide film or an organic insulating film of an acrylic resin, a polyimide resin, or the like can be used. As the dielectric layer of the capacitor, a silicon nitride film, a silicon oxide film, an aluminum oxide film, or the like can be used. The bonding layers will be described later.

As a conductor that can be used for a wiring, an electrode, and a plug used for electrical connection between devices, a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like is selected and used as appropriate. The conductor is not limited to a single layer, and may be a plurality of layers including different materials.

<Layer 563a>

The layer 563a includes the components of the pixel 100. The layer 563a may further include the components of the functional circuit. Here, the transistor 102 and the transistor 103 included in the circuit 130 are illustrated as the components of the functional circuit.

A silicon substrate 632, an insulating layer 631, an insulating layer 633, an insulating layer 634, an insulating layer 635, an insulating layer 637, and an insulating layer 638 are provided in the layer 563a. In addition, a conductive layer 636 and a conductive layer 639 are provided.

The insulating layer 631 and the conductive layer 639 function as bonding layers. The insulating layers 634, 635, and 637 function as interlayer insulating films and planarization films. The insulating layer 633 functions as a protective film. The insulating layer 638 has a function of insulating the silicon substrate 632 from the conductive layer 639. The insulating layer 638 can be formed using a material similar to that for another insulating layer. The insulating layer 638 may be formed using the same material as that for the insulating layer 631.

The conductive layer 639 is electrically connected to the other of a source and a drain of the transistor 102 and one of a source and a drain of the transistor 103. The conductive layer 639 is electrically connected to the gate of the transistor 105 and the conductive layer 619. The conductive layer 636 is electrically connected to the wiring 114 (see FIG. 4).

Figure 20A:
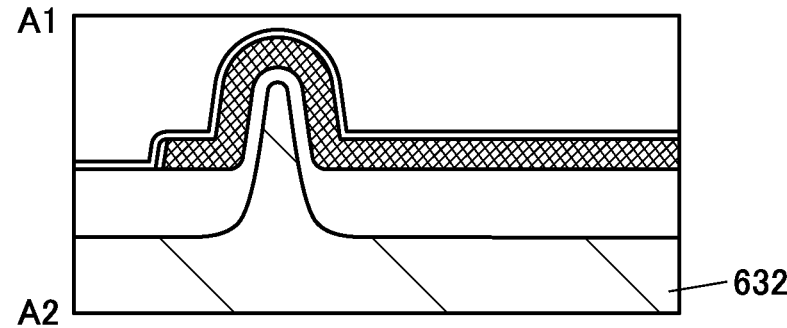
FIG. 20A to FIG. 20C are diagrams illustrating Si transistors.
Figure 20B:
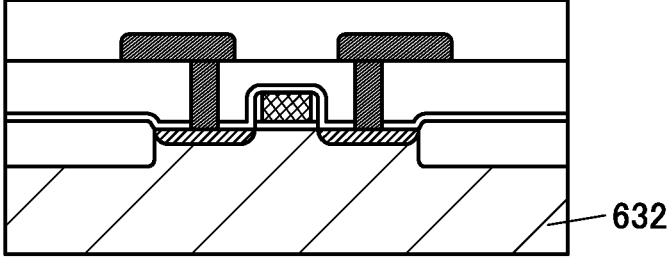

FIG. 19 illustrates fin-type Si transistors including channel formation regions in the silicon substrates (the silicon substrate 611 and the silicon substrate 632). FIG. 20A illustrates a cross section (a cross section along A1-A2 in the layer 563a in FIG. 19) in the channel width direction. Note that the Si transistors may each be a planar-type transistor as illustrated in FIG. 20B.

Figure 20C:
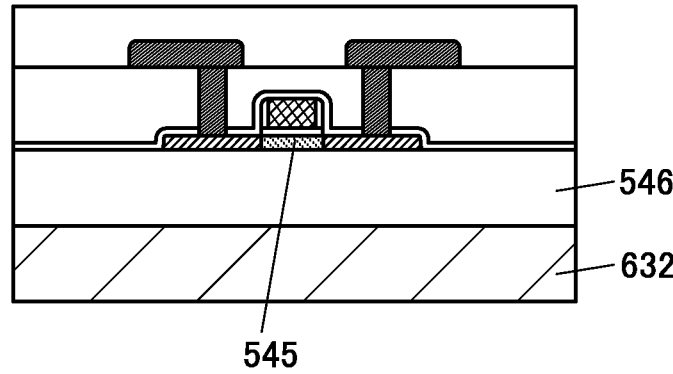

Alternatively, as illustrated in FIG. 20C, a transistor including a semiconductor layer 545 of a silicon thin film may be used. The semiconductor layer 545 can be single crystal silicon (SOI (Silicon on Insulator)) formed on an insulating layer 546 on the silicon substrate 632, for example.

<Layer 561>

The layer 561 includes the photoelectric conversion device 101. The photoelectric conversion device 101 can be formed over the layer 563a. FIG. 19 illustrates the photoelectric conversion device 101 having a structure in which the organic photoconductive film illustrated in FIG. 18C is used as the photoelectric conversion layer. Here, the layer 567a is a cathode, and the layer 567e is an anode.

An insulating layer 651, an insulating layer 652, an insulating layer 653, an insulating layer 654, and a conductive layer 655 are provided in the layer 561.

The insulating layer 651, the insulating layer 653, and the insulating layer 654 function as interlayer insulating films and planarization films. The insulating layer 654 is provided to cover an end portion of the photoelectric conversion device 101, and has a function of preventing a short circuit between the layer 567e and the layer 567a. The insulating layer 652 functions as an element isolation layer. An organic insulating film or the like is preferably used as the element isolation layer.

The layer 567a corresponding to the cathode of the photoelectric conversion device 101 is electrically connected to one of the source and the drain of the transistor 102 included in the layer 563a. The layer 567e corresponding to the anode of the photoelectric conversion device 101 is electrically connected to the conductive layer 636 included in the layer 563a through the conductive layer 655.

<Layer 560>

The layer 560 is formed over the layer 561. The layer 560 includes a light-blocking layer 671, an optical conversion layer 672, and a microlens array 673.

The light-blocking layer 671 can suppress entry of light into an adjacent pixel. As the light-blocking layer 671, a metal layer of aluminum, tungsten, or the like can be used. The metal layer and a dielectric film functioning as an anti-reflection film may be stacked.

Figure 26A:
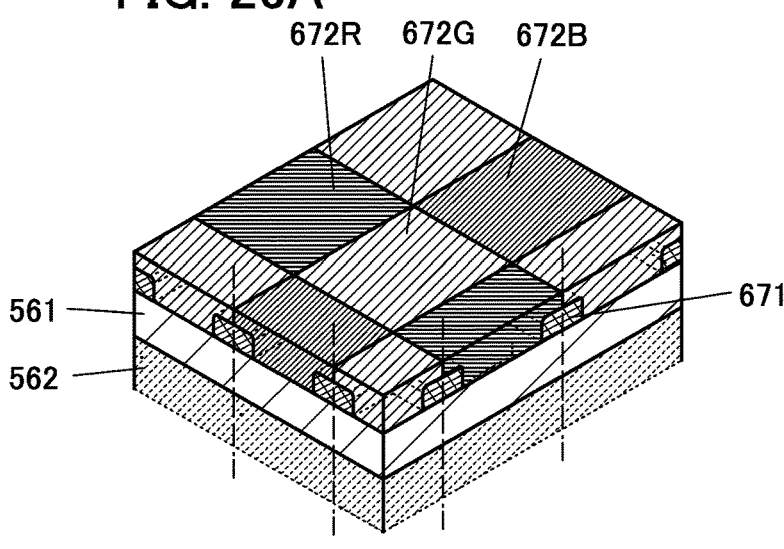
FIG. 26A to FIG. 26C are perspective views (cross-sectional views) illustrating pixels.

When the photoelectric conversion device 101 has sensitivity to visible light, a color filter can be used as the optical conversion layer 672. When colors of (red), G (green), B (blue), Y (yellow), C (cyan), M (magenta), and the like are assigned to the color filters of different pixels, a color image can be obtained. For example, as illustrated in a perspective view (including a cross section) of FIG. 26A, a color filter 672R (red), a color filter 672G (green), and a color filter 672B (blue) can be assigned to different pixels.

When a wavelength cut filter is used as the optical conversion layer 672 in the appropriate combination of the photoelectric conversion device 101 and the optical conversion layer 672, the imaging device can capture images in various wavelength regions.

For example, when an infrared filter that blocks light having a wavelength shorter than or equal to that of visible light is used as the optical conversion layer 672, an infrared imaging device can be obtained. When a filter that blocks light having a wavelength shorter than or equal to that of near infrared light is used as the optical conversion layer 672, a far-infrared imaging device can be obtained. When an ultraviolet filter that blocks light having a wavelength longer than or equal to that of visible light is used as the optical conversion layer 672, an ultraviolet imaging device can be obtained.

Note that different optical conversion layers may be provided in one imaging device.

Figure 26B:
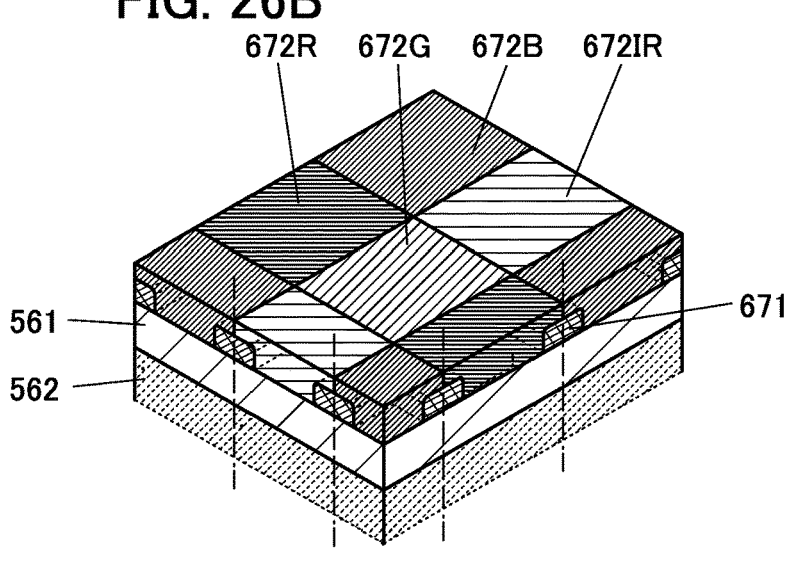

For example, as illustrated in FIG. 26B, the color filter 672R (red), the color filter 672G (green), the color filter 672B (blue), and an infrared filter 672IR can be assigned to different pixels. With this structure, a visible light image and an infrared light image can be obtained simultaneously.

Figure 26C:
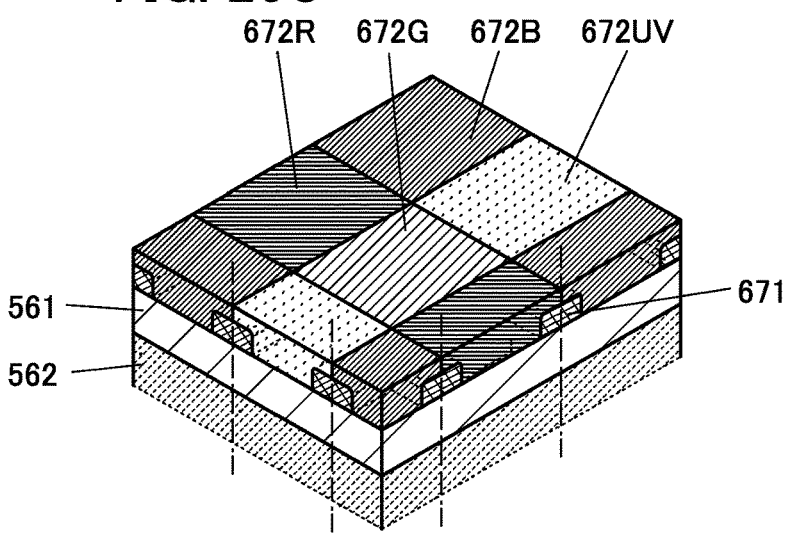

Alternatively, as illustrated in FIG. 26C, the color filter 672R (red), the color filter 672G (green), the color filter 672B (blue), and an ultraviolet filter 672UV can be assigned to different pixels. With this structure, a visible light image and an ultraviolet light image can be obtained simultaneously.

When a scintillator is used as the optical conversion layer 672, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion device 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, ZnO, or the like is dispersed can be used.

Imaging with the use of infrared light or ultraviolet light can provide the imaging device with an inspection function, a security function, a sensor function, or the like. For example, by imaging with the use of infrared light, non-destructive inspection of products, sorting of agricultural products (e.g., measuring of the sugar content), vein authentication, medical inspection, or the like can be performed. Furthermore, by imaging with the use of ultraviolet light, detection of ultraviolet light released from a light source or a frame can be performed, whereby a light source, a heat source, a production device, or the like can be controlled, for example.

The microlens array 673 is provided over the optical conversion layer 672. Light passing through an individual lens of the microlens array 673 goes through the optical conversion layer 672 directly under the lens, and the photoelectric conversion device 101 is irradiated with the light. With the microlens array 673, collected light can be incident on the photoelectric conversion device 101; thus, photoelectric conversion can be efficiently performed. The microlens array 673 is preferably formed using a resin, glass, or the like having a high light transmitting property with respect to light with an intended wavelength.

<Bonding>

Next, bonding of the layer 563b and the layer 563a will be described.

The insulating layer 618 and the conductive layer 619 are provided in the layer 563b. The conductive layer 619 includes a region embedded in the insulating layer 618. Furthermore, the surfaces of the insulating layer 618 and the conductive layer 619 are planarized to be level with each other.

The insulating layer 631 and the conductive layer 639 are provided in the layer 563a. The conductive layer 639 includes a region embedded in the insulating layer 631. Furthermore, the surfaces of the insulating layer 631 and the conductive layer 639 are planarized to be level with each other.

Here, a main component of the conductive layer 619 and a main component of the conductive layer 639 are preferably the same metal element. Furthermore, the insulating layer 618 and the insulating layer 631 are preferably formed of the same component.

For the conductive layer 619 and the conductive layer 639, Cu, Al, Sn, Zn, W, Ag, Pt, or Au can be used, for example. Preferably, Cu, Al, W, or Au is used for easy bonding. In addition, for the insulating layer 618 and the insulating layer 631, silicon oxide, silicon oxynitride, silicon nitride oxide, silicon nitride, titanium nitride, or the like can be used.

That is, the same metal material described above is preferably used for the conductive layer 619 and the conductive layer 639. Furthermore, the same insulating material described above is preferably used for the insulating layer 618 and the insulating layer 631. With this structure, bonding can be performed at the boundary between the layer 563b and the layer 563a.

Note that the conductive layer 619 and the conductive layer 639 may each have a multilayer structure of a plurality of layers; in that case, the outer layers (bonding surfaces) are formed of the same metal material. The insulating layer 618 and the insulating layer 631 may each have a multilayer structure of a plurality of layers; in that case, the outer layers (bonding surfaces) are formed of the same insulating material.

Through the above bonding, the electrical connection between the conductive layer 619 and the conductive layer 639 can be obtained. Moreover, the connection between the insulating layer 618 and the insulating layer 631 with mechanical strength can be obtained.

For bonding metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together can be used, for example. Both methods cause bonding at an atomic level, and therefore not only electrically but also mechanically excellent bonding can be obtained.

For bonding insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 563b and the layer 563a are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

The above bonding allows the components included in the layer 563b to be electrically connected to the components of the pixel 100 included in the layer 563a.

Variation Example of Stacked-Layer Structure 1

Figure 21:
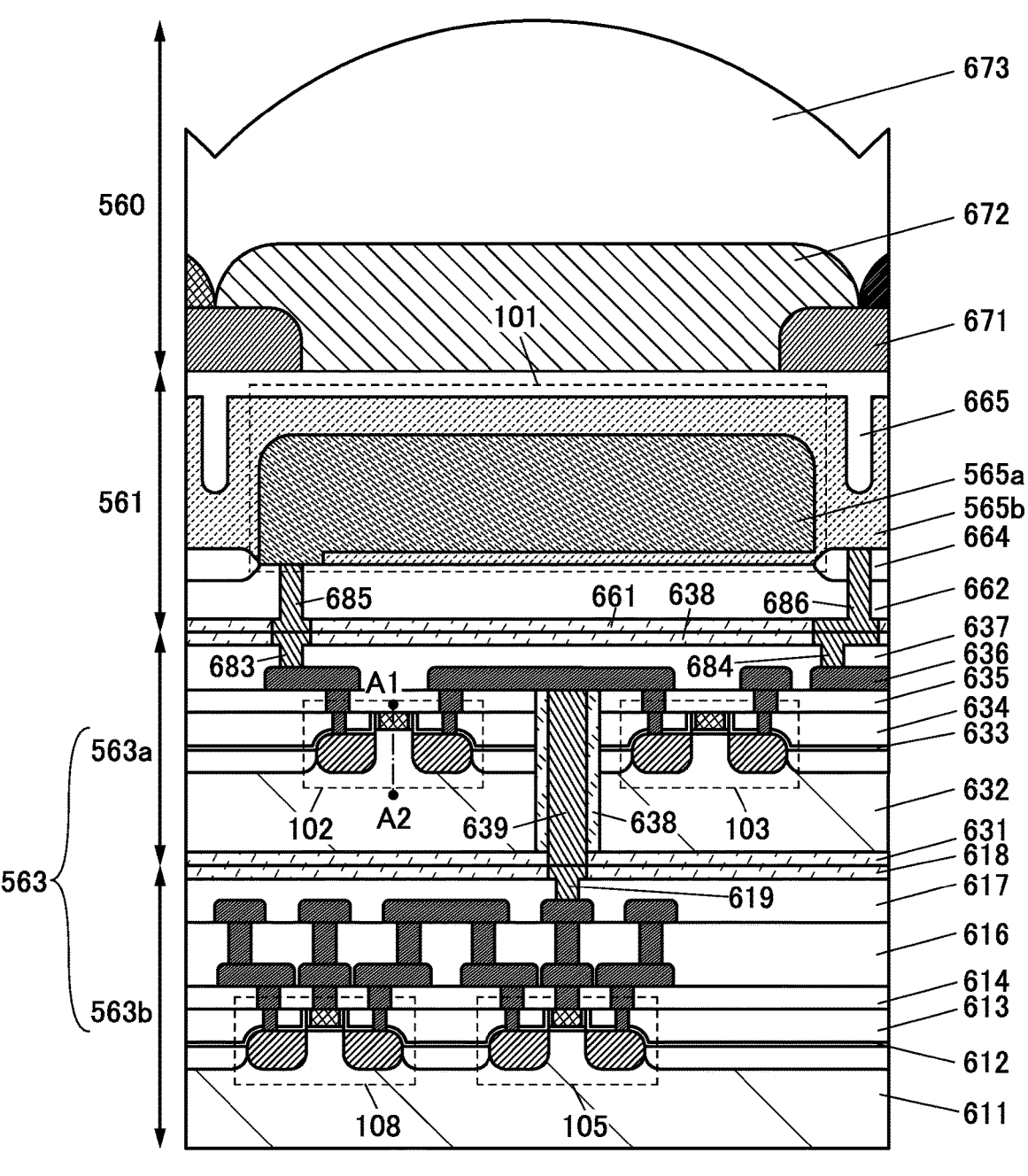
FIG. 21 is a cross-sectional view illustrating a pixel.

FIG. 21 is a variation example of the stacked-layer structure illustrated in FIG. 19 and differs from FIG. 19 in the structure of the photoelectric conversion device 101 included in the layer 561 and part of the structure of the layer 563*a*; a bonding surface is also included between the layer 561 and the layer 563*a*.

The layer 561 includes the photoelectric conversion device 101, an insulating layer 661, an insulating layer 662, an insulating layer 664, and an insulating layer 665, and a conductive layer 685 and a conductive layer 686.

The photoelectric conversion device 101 is a pn junction photodiode and includes the layer 565*b* corresponding to a p-type region and the layer 565*a* corresponding to an n-type region. Note that an example in which a pn junction photodiode is formed over a silicon substrate is described here. The photoelectric conversion device 101 is a pinned photodiode, which can suppress a dark current and reduce noise with the thin p-type region (part of the layer 565*b*) provided on the surface side (current extraction side) of the layer 565*a*.

The insulating layer 661, the conductive layer 685, and the conductive layer 686 function as bonding layers. The insulating layer 662 functions as an interlayer insulating film and a planarization film. The insulating layer 664 functions as an element isolation layer.

The silicon substrate is provided with a groove that separates pixels, and the insulating layer 665 is provided on the top surface of the silicon substrate and in the groove. The insulating layer 665 can suppress leakage of carriers generated in the photoelectric conversion device 101 to an adjacent pixel. The insulating layer 665 also has a function of suppressing entry of stray light. Therefore, color mixture can be suppressed with the insulating layer 665. Note that an anti-reflection film may be provided between the top surface of the silicon substrate and the insulating layer 665.

The insulating layer 664 can be formed by a LOCOS (LOCal Oxidation of Silicon) method. Alternatively, an STI (Shallow Trench Isolation) method or the like may be used to form the insulating layer 664. As the insulating layer 665, for example, an inorganic insulating film of silicon oxide, silicon nitride, or the like or an organic insulating film of a polyimide resin, an acrylic resin, or the like can be used. The insulating layer 665 may have a multilayer structure. A space may be provided in part of the insulating layer 665. The space may contain air or a gas such as an inert gas. Moreover, the space may be in a reduced pressure state.

The layer 565*a* (corresponding to the n-type region and the cathode) of the photoelectric conversion device 101 is electrically connected to the conductive layer 685. The layer 565*b* (corresponding to the p-type region and the anode) is electrically connected to the conductive layer 686. The conductive layer 685 and the conductive layer 686 each include a region embedded in the insulating layer 661. Furthermore, the surfaces of the insulating layer 661, the conductive layer 685, and the conductive layer 686 are planarized to be level with each other.

In the layer 563*a*, the insulating layer 638 is formed over the insulating layer 637. In addition, a conductive layer 683 electrically connected to one of the source and the drain of the transistor 102 and a conductive layer 684 electrically connected to the conductive layer 636 are formed.

The insulating layer 638, the conductive layer 683, and the conductive layer 684 function as bonding layers. The conductive layer 683 and the conductive layer 684 each include a region embedded in the insulating layer 638. Furthermore, the surfaces of the insulating layer 638, the conductive layer 683, and the conductive layer 684 are planarized to be level with each other.

Here, the conductive layer 683, the conductive layer 684, the conductive layer 685, and the conductive layer 686 are the same bonding layers as the conductive layer 619 and the conductive layer 639 that are described above. The insulating layer 638 and the insulating layer 661 are the same bonding layers as the insulating layer 618 and the insulating layer 631 that are described above.

Thus, when the conductive layer 683 and the conductive layer 685 are bonded to each other, the layer 565*a* (corresponding to the n-type region and the cathode) of the photoelectric conversion device 101 can be electrically connected to the one of the source and the drain of the transistor 102. In addition, when the conductive layer 684 and the conductive layer 686 are bonded to each other, the layer 565*b* (corresponding to the p-type region and the anode) of the photoelectric conversion device 101 can be electrically connected to the wiring 114 (see FIG. 4). When the insulating layer 638 and the insulating layer 661 are bonded to each other, electrical bonding and mechanical bonding of the layer 561 and the layer 563*a* can be performed.

Figure 22:
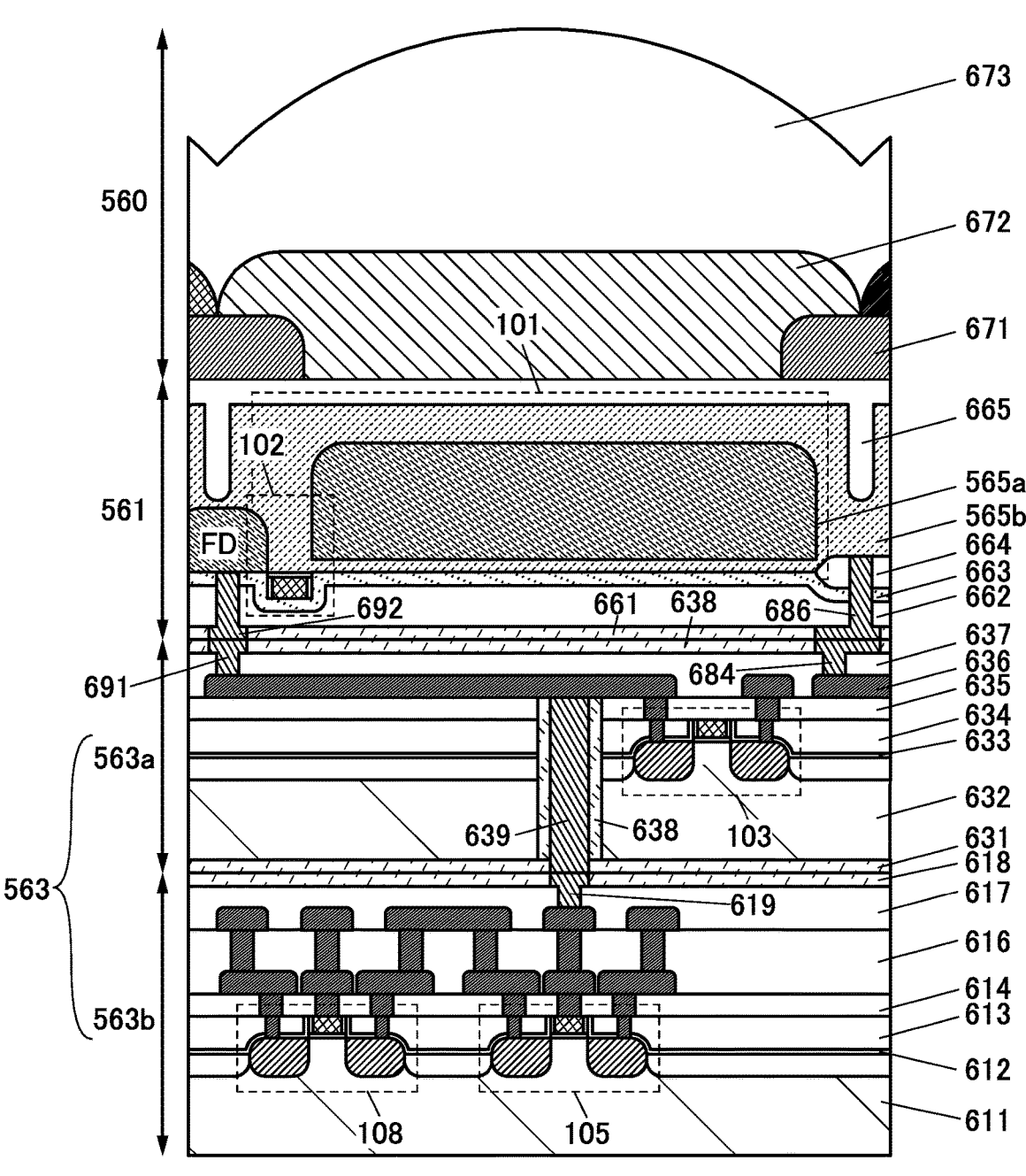
FIG. 22 is a cross-sectional view illustrating a pixel.

FIG. 22 is a variation example different from the above, and is a structure in which the transistor 102 is provided in the layer 561. In this structure, the one of the source and the drain of the transistor 102 is directly connected to the photoelectric conversion device 101 and the other of the source and the drain functions as a node FD. With this structure, electric charge accumulated in the photoelectric conversion device 101 can be completely transferred, so that an imaging device with little noise can be achieved. An insulating layer 663 functions as a protective film of the transistor 102.

Here, the other of the source and the drain of the transistor 102 included in the layer 561 is electrically connected to a conductive layer 692. One of the source and the drain of the transistor 103 included in the layer 563*a* is electrically connected to a conductive layer 691. The conductive layer 691 and the conductive layer 692 are bonding layers that are the same as the conductive layer 619 and the conductive layer 639 that are described above.

<Stacked-Layer Structure 2>

Figure 23:
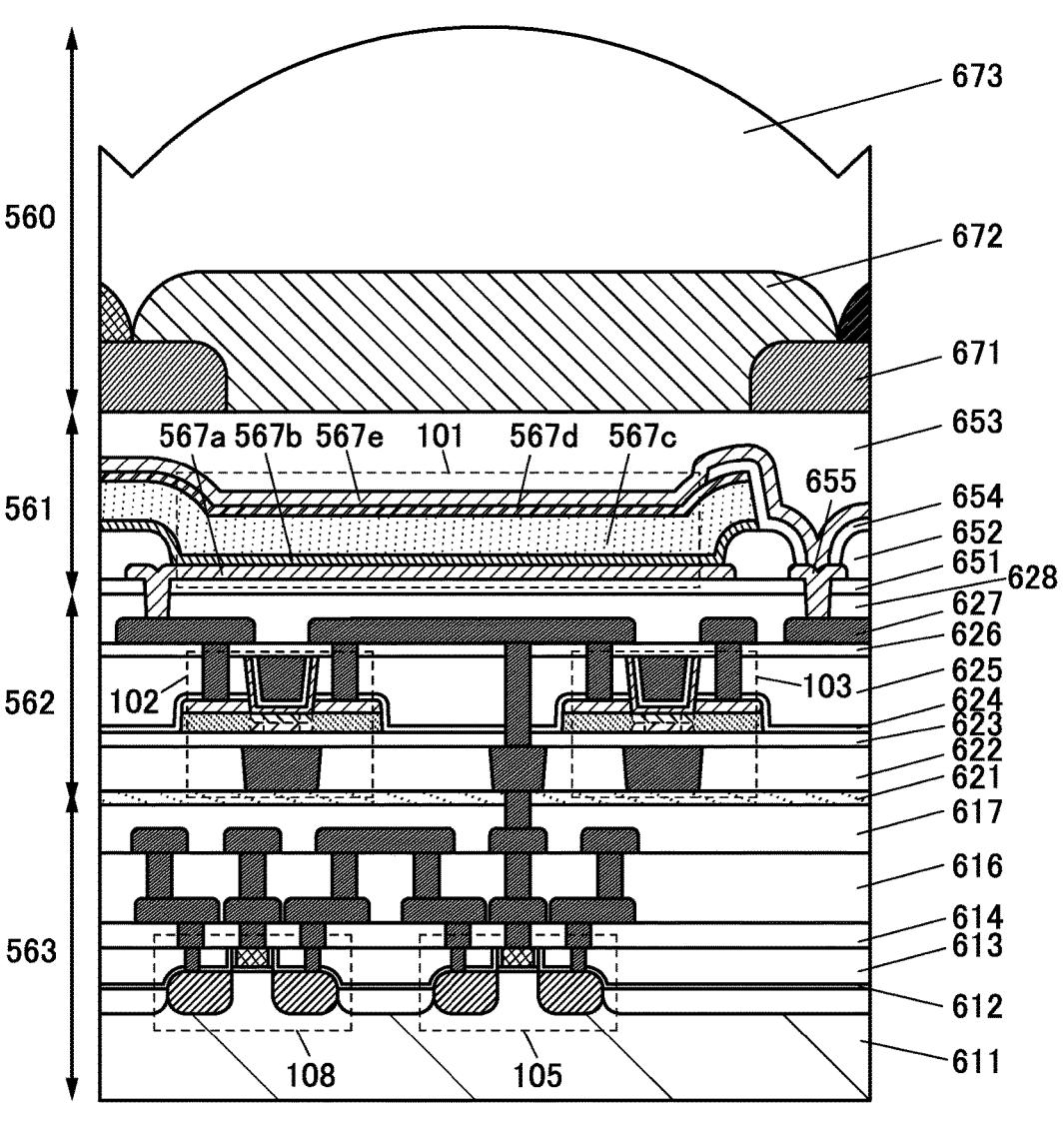
FIG. 23 is a cross-sectional view illustrating a pixel.

FIG. 23 is an example of a cross-sectional view of a stack including the layer 560, the layer 561, the layer 562, and the layer 563 and not including a bonding surface. Si transistors are provided in the layer 563. OS transistors are provided in the layer 562. Note that the structures of the layer 563, the layer 561, and the layer 560 are not described here because they are the same as the structures illustrated in FIG. 19.

<Layer 562>

The layer 562 is formed over the layer 563. The layer 562 includes OS transistors. Here, the transistor 102 and the transistor 103 are illustrated. In the cross-sectional view illustrated in FIG. 23, electrical connection between the transistors is not illustrated.

An insulating layer 621, an insulating layer 622, an insulating layer 623, an insulating layer 624, an insulating layer 625, an insulating layer 626, and an insulating layer 628 are provided in the layer 562. Moreover, a conductive layer 627 is provided. The conductive layer 627 can be electrically connected to the wiring 114 (see FIG. 4).

The insulating layer 621 functions as a blocking layer. The insulating layer 622, the insulating layer 623, the insulating layer 625, the insulating layer 626, and the insulating layer 628 function as interlayer insulating films and planarization films. The insulating layer 624 has a function of a protective film.

As the blocking layer, a film that has a function of preventing hydrogen diffusion is preferably used. In a Si device, hydrogen is necessary to terminate dangling bonds; however, hydrogen in the vicinity of an OS transistor is one factor of generating carriers in an oxide semiconductor layer, which leads to a decrease in reliability. Therefore, a hydrogen blocking film is preferably provided between a layer in which the Si device is formed and a layer in which the OS transistor is formed.

For the blocking film, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ) can be used.

The other of the source and the drain of the transistor 103 is electrically connected to the gate of the transistor 105 through a plug. Furthermore, the conductive layer 627 is electrically connected to the wiring 114 (see FIG. 4).

The one of the source and the drain of the transistor 102 is electrically connected to the cathode of the photoelectric conversion device 101 included in the layer 561. The conductive layer 627 is electrically connected to the anode of the photoelectric conversion device 101 included in the layer 561.

The details of an OS transistor are illustrated in FIG. 24A. The OS transistor illustrated in FIG. 24A has a self-aligned structure in which a source electrode 705 and a drain electrode 706 are formed through provision of an insulating layer over stacked layers of an oxide semiconductor layer and a conductive layer and provision of opening portions reaching the oxide semiconductor layer.

The OS transistor can include a gate electrode 701 and a gate insulating film 702 in addition to a channel formation region 708, a source region 703, and a drain region 704, which are formed in the oxide semiconductor layer. At least the gate insulating film 702 and the gate electrode 701 are provided in the opening portion. The opening portion may further be provided with an oxide semiconductor layer 707.

As illustrated in FIG. 24B, the OS transistor may have a self-aligned structure in which the source region 703 and the drain region 704 are formed in the semiconductor layer with the gate electrode 701 as a mask.

As illustrated in FIG. 24C, the OS transistor may be a non-self-aligned top-gate transistor including a region where the source electrode 705 or the drain electrode 706 overlaps with the gate electrode 701.

Although the OS transistor has a structure with a back gate 735, it may have a structure without a back gate. As illustrated in a cross-sectional view of the transistor in the channel width direction in FIG. 24D, the back gate 735 may be electrically connected to a front gate of the transistor, which is provided to face the back gate. Note that FIG. 24D illustrates an example of a B1-B2 cross section of the transistor in FIG. 24A, and the same applies to a transistor having any of the other structures. A structure where a fixed potential different from the potential supplied to the front gate is supplied to the back gate 735 may be employed.

Variation Example of Stacked-Layer Structure 2

Figure 25:
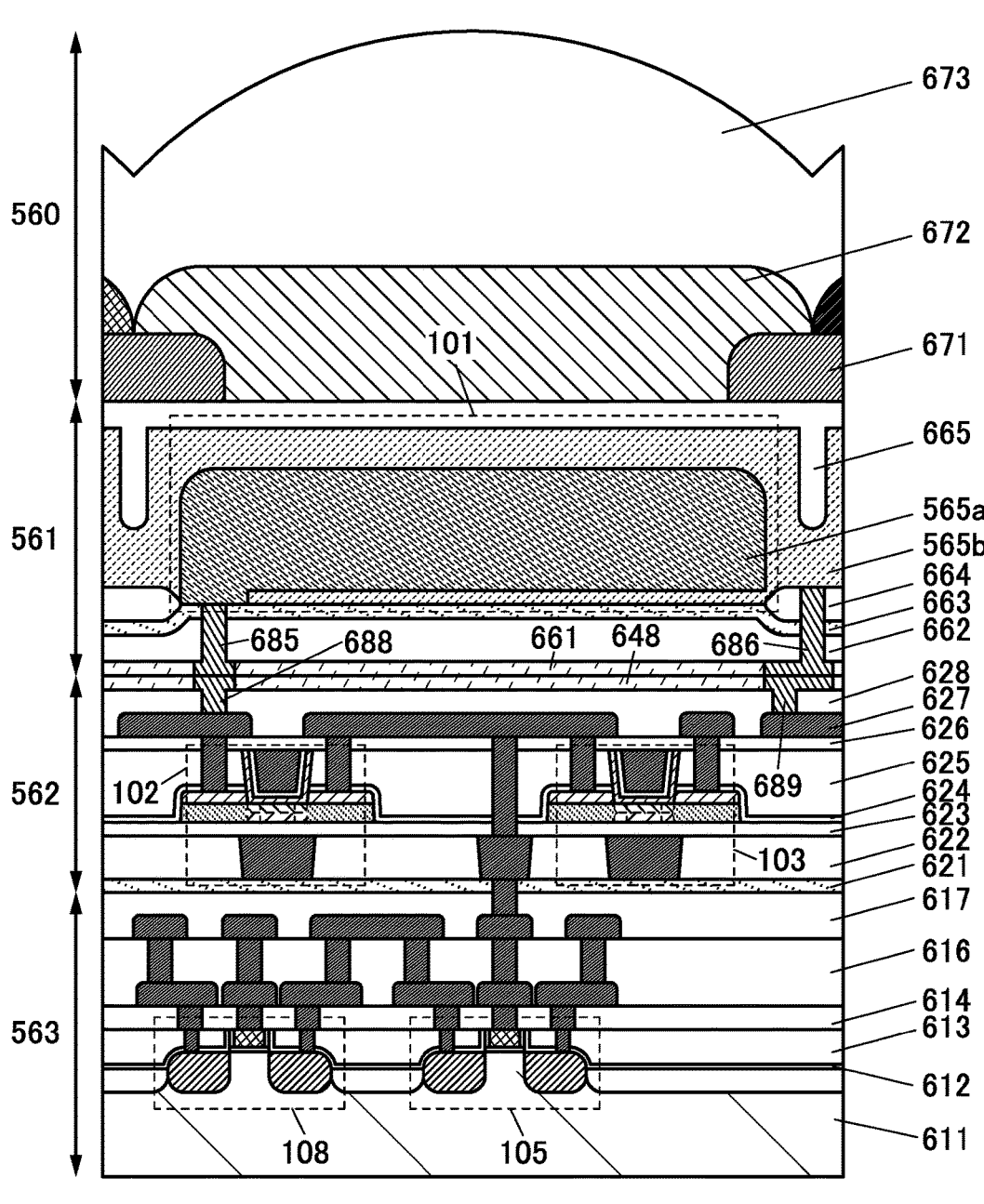
FIG. 25 is a cross-sectional view illustrating a pixel.

FIG. 25 is a variation example of the stacked-layer structure illustrated in FIG. 23 and differs from FIG. 23 in the structure of the photoelectric conversion device 101 included in the layer 561 and part of the structure of the layer 562; a bonding surface is included between the layer 561 and the layer 562.

The photoelectric conversion device 101 included in the layer 561 is a pn junction photodiode and has a structure similar to that illustrated in FIG. 21.

In the layer 562, an insulating layer 648 is formed over the insulating layer 628. In addition, a conductive layer 688 electrically connected to the one of the source and the drain of the transistor 102 and a conductive layer 689 electrically connected to the conductive layer 627 are formed.

The insulating layer 648, the conductive layer 688, and the conductive layer 689 function as bonding layers. The conductive layers 688 and 689 each include a region embedded in the insulating layer 648. Furthermore, the surfaces of the insulating layer 648, the conductive layer 683, and the conductive layer 684 are planarized to be level with each other.

Here, the conductive layer 688 and the conductive layer 689 are the same bonding layers as the conductive layer 619 and the conductive layer 639 that are described above. The insulating layer 648 is the same bonding layer as the insulating layer 618 and the insulating layer 631 that are described above.

Thus, when the conductive layer 688 and the conductive layer 685 are bonded to each other, the layer 565a (corresponding to the n-type region and the cathode) of the photoelectric conversion device can be electrically connected to the one of the source and the drain of the transistor 102. In addition, when the conductive layer 689 and the conductive layer 686 are bonded to each other, the layer 565b (corresponding to the p-type region and the anode) of the photoelectric conversion device can be electrically connected to the wiring 114 (see FIG. 4). When the insulating layer 648 and the insulating layer 661 are bonded to each other, electrical bonding and mechanical bonding of the layer 561 and the layer 562a can be performed.

In the case where a plurality of Si devices are stacked, a polishing step and a bonding step are required to be performed a plurality of times. Consequently, there are issues such as a large number of manufacturing steps, the need for a dedicated apparatus, and a low yield, and the manufacturing cost is high. An OS transistor can be formed to be stacked over a semiconductor substrate on which a device is formed, and thus a bonding step can be skipped.

Note that in this structure, the transistor 102 may be provided in the layer 561 as illustrated in FIG. 22.

<Package, Module>

FIG. 27A1 is an external perspective view of the top surface side of a package in which an image sensor chip is placed. The package includes a package substrate 410 to which an image sensor chip 450 (see FIG. 27A3) is fixed, a cover glass 420, an adhesive 430 for bonding them, and the like.

FIG. 27A2 is an external perspective view of the bottom surface side of the package. A BGA (Ball grid array) in which solder balls are used as bumps 440 on the bottom surface of the package is employed. Note that, other than the BGA, an LGA (Land grid array), a PGA (Pin Grid Array), or the like may be employed.

FIG. 27A3 is a perspective view of the package, in which parts of the cover glass 420 and the adhesive 430 are not illustrated. Electrode pads 460 are formed over the package substrate 410, and the electrode pads 460 and the bumps 440 are electrically connected to each other via through-holes. The electrode pads 460 are electrically connected to the image sensor chip 450 through wires 470.

FIG. 27B1 is an external perspective view of the top surface side of a camera module in which an image sensor chip is placed in a package with a built-in lens. The camera module includes a package substrate 411 to which an image sensor chip 451 (see FIG. 27B3) is fixed, a lens cover 421, a lens 435, and the like. Furthermore, an IC chip 490 (see FIG. 27B3) having functions of a driver circuit, a signal conversion circuit, and the like of an imaging device is provided between the package substrate 411 and the image sensor chip 451; thus, the structure as an SiP (System in package) is included.

FIG. 27B2 is an external perspective view of the bottom surface side of the camera module. A QFN (Quad flat no-lead package) structure in which lands 441 for mounting are provided on the bottom surface and side surfaces of the package substrate 411 is employed. Note that this structure is only an example, and a QFP (Quad flat package) or the above-mentioned BGA may also be provided.

FIG. 27B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above-described form can be easily mounted on a printed substrate or the like, and the image sensor chip can be incorporated in a variety of semiconductor devices and electronic devices.

This embodiment can be combined with the description of the other embodiments as appropriate.

Embodiment 3

As electronic devices that can use the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. FIG. 28A to FIG. 28F illustrate specific examples of these electronic devices.

FIG. 28A is an example of a portable information terminal, which includes a housing 981, a display portion 982, an operation button 983, an external connection port 984, a speaker 985, a microphone 986, a camera 987, and the like. The display portion 982 of the portable information terminal is provided with a touch sensor. A variety of operations such as making a call and inputting text can be performed by touch on the display portion 982 with a finger, a stylus, or the like. The imaging device of one embodiment of the present invention and the operation method thereof can be used in the portable information terminal.

The camera 987 includes the imaging device of one embodiment of the present invention, and distance information of an object can be obtained from an image captured with the camera 987. On the basis of the distance information, part of the image captured with the camera 987 can be processed. For example, image processing for blurring the foreground and background of a main object can be performed.

FIG. 28B is an information terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention and the operation method thereof can be used in the portable data terminal.

FIG. 28C is a surveillance camera, which includes a support base 951, a camera unit 952, a protection cover 953, and the like. By setting the camera unit 952 provided with a rotating mechanism and the like on a ceiling, an image of all of the surroundings can be taken. The imaging device of one embodiment of the present invention and the operation method thereof can be used for obtaining an image in the camera unit. Note that a surveillance camera is a name in common use and does not limit the use thereof. A device that has a function of a surveillance camera can also be called a camera or a video camera, for example.

FIG. 28D is a video camera, which includes a first housing 971, a second housing 972, a display portion 973, an operation key 974, a lens 975, a connection portion 976, a speaker 977, a microphone 978, and the like. The operation key 974 and the lens 975 are provided for the first housing 971, and the display portion 973 is provided for the second housing 972. The imaging device of one embodiment of the present invention and the operation method thereof can be used in the video camera.

FIG. 28E is a digital camera, which includes a housing 961, a shutter button 962, a microphone 963, a light-emitting portion 967, a lens 965, and the like. The imaging device of one embodiment of the present invention and the operation method thereof can be used in the digital camera.

FIG. 28F is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention and the operation method thereof can be used in the information terminal.

Figure 29:
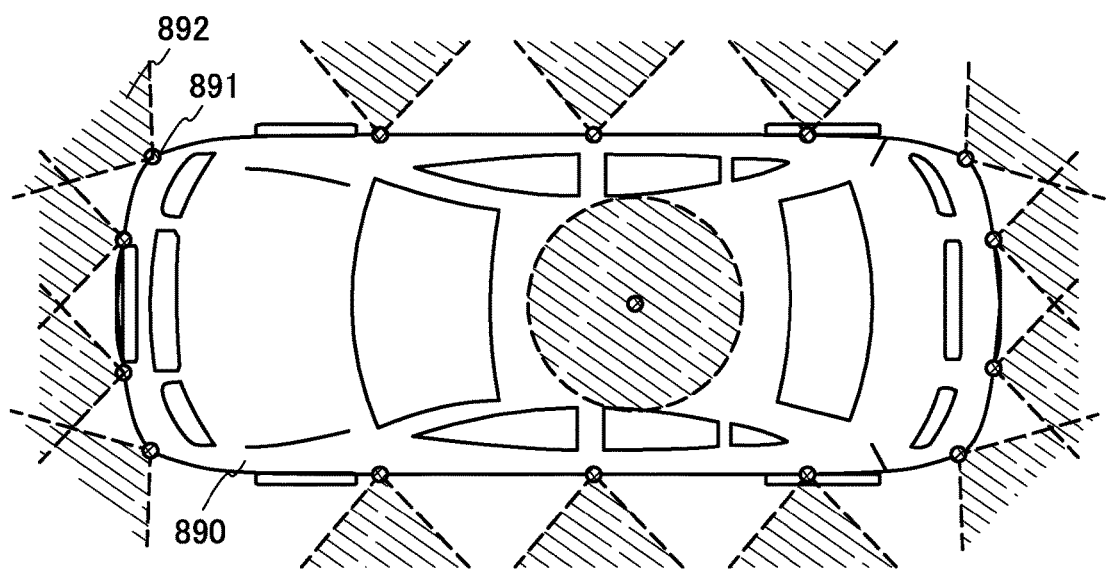
FIG. 29 is a diagram illustrating an automobile.

FIG. 29A illustrates an external view of an automobile as an example of a moving object. An automobile 890 includes a plurality of cameras 891 and the like, and can obtain information on the front, rear, left, and right sides and the upper side of the automobile 890. The imaging device of one embodiment of the present invention and the operation method thereof can be used in the cameras 891. The automobile 890 is also provided with various sensors such as an infrared radar, a millimeter wave radar, and a laser radar (not illustrated) and the like. The automobile 890 judges traffic conditions therearound such as the presence of a guardrail or a pedestrian by analyzing images in a plurality of imaging directions 892 captured by the cameras 891, and thus can perform autonomous driving. It can also be used for a system for navigation, risk prediction, or the like.

When arithmetic processing with a neural network or the like is performed on the obtained image data in the imaging device of one embodiment of the present invention, for example, processing such as an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and reduction of glare and reflection can be performed.

Note that an automobile is described above as an example of a moving object and may be any of an automobile having an internal-combustion engine, an electric vehicle, a hydrogen vehicle, and the like. Furthermore, the moving object is not limited to an automobile. Examples of moving objects include a train, a monorail train, a ship, and a flying object (a helicopter, an unmanned aircraft (a drone), an airplane, and a rocket), and these moving objects can include a system utilizing artificial intelligence when equipped with the computer of one embodiment of the present invention.

This embodiment can be combined with the other embodiments as appropriate.

REFERENCE NUMERALS

FL11: first filter, FL12: third filter, FL13: fifth filter, FL21: second filter, FL22: fourth filter, FL23: sixth filter, 100: pixel, 101: photoelectric conversion device, 102: transistor, 102*a*: transistor, 102*b*: transistor, 103: transistor, 103*a*: transistor, 103*b*: transistor, 104: capacitor, 104*a*: capacitor, 104*b*: capacitor, 105: transistor, 105*a*: transistor, 105*b*: transistor, 106: transistor, 106*a*: transistor, 106*b*: transistor, 108: transistor, 111*a*: wiring, 111*a*_1: wiring, 111*a*_2: wiring, 111*a*_3: wiring, 111*b*: wiring, 111*b*_1: wiring, 111*b*_2: wiring, 111*b*_3: wiring, 112*a*: wiring, 112*a*_1: wiring, 112*a*_2: wiring, 112*a*_3: wiring, 112*b*: wiring, 112*b*_1: wiring, 112*b*_2: wiring, 112*b*_3: wiring, 113: wiring, 114: wiring, 115*a*: wiring, 115*b*: wiring, 116*a*: wiring, 116*b*: wiring, 117*a*: wiring, 117*b*: wiring, 118*a*: wiring, 118*b*: wiring, 119*a*: wiring, 119*b*: wiring, 122: wiring, 122_1: wiring, 122_2: wiring, 122_3: wiring, 130*a*: circuit, 130*b*: circuit, 161: transistor, 162: transistor, 163: capacitor, 200: pixel block, 201: circuit, 202: capacitor, 203: transistor, 204: transistor, 205: transistor, 206: transistor, 207: transistor, 212: wiring, 213: wiring, 213A: wiring, 213B: wiring, 215: wiring, 216: wiring, 217: wiring, 218: wiring, 219: wiring, 300: pixel array, 301: circuit, 302: circuit, 303: circuit, 304: circuit, 305: circuit, 311: wiring, 320: memory cell, 325: reference memory cell, 330: circuit, 350: circuit, 360: circuit, 370: circuit, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 545: semiconductor layer, 546: insulating layer, 560: layer, 561: layer, 562: layer, 562*a*: layer, 562*b*: layer, 563: layer, 563*a*: layer, 563*b*: layer, 563*c*: layer, 565*a*: layer, 565*b*: layer, 566*a*: layer, 566*b*: layer, 566*c*: layer, 566*d*: layer, 567*a*: layer, 567*b*: layer, 567*c*: layer, 567*d*: layer, 567*e*: layer, 611: silicon substrate, 612: insulating layer, 613: insulating layer, 614: insulating layer, 616: insulating layer, 617: insulating layer, 618: insulating layer, 619: conductive layer, 621: insulating layer, 622: insulating layer, 623: insulating layer, 624: insulating layer, 625: insulating layer, 626: insulating layer, 627: conductive layer, 628: insulating layer, 631: insulating layer, 632: silicon substrate, 633: insulating layer, 634: insulating layer, 635: insulating layer, 636: conductive layer, 637: insulating layer, 638: insulating layer, 639: conductive layer, 648: insulating layer, 651: insulating layer, 652: insulating layer, 653: insulating layer, 654: insulating layer, 655: conductive layer, 661: insulating layer, 662: insulating layer, 663: insulating layer, 664: insulating layer, 665: insulating layer, 671: light-blocking layer, 672: optical conversion layer, 672B: color filter, 672G: color filter, 672IR: infrared filter, 672R: color filter, 672UV: ultraviolet filter, 673: microlens array, 683: conductive layer, 684: conductive layer, 685: conductive layer, 686: conductive layer, 688: conductive layer, 689: conductive layer, 691: conductive layer, 692: conductive layer, 701: gate electrode, 702: gate insulating film, 703: source region, 704: drain region, 705: source electrode, 706: drain electrode, 707: oxide semiconductor layer, 708: channel formation region, 735: back gate, 890: automobile, 891: camera, 892: imaging direction, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:

1. An imaging device comprising a plurality of pixels and a plurality of first circuits, wherein the plurality of pixels is arranged in a matrix, wherein the first circuit is electrically connected to the plurality of pixels arranged in a column direction, wherein one of the plurality of pixels comprises a second circuit and a third circuit, wherein one of the second circuit and the third circuit is configured to generate first data of an n-th frame by supplying a first weight to image data obtained in the n-th frame, wherein the other of the second circuit and the third circuit is configured to generate first data of an n−1-th frame by supplying a second weight to image data obtained in the n−1-th frame, wherein the one of the plurality of pixels is configured to generate second data by adding the first data of the n−1-th frame and the first data of the n-th frame, wherein the first circuit is configured to generate third data corresponding to a sum of the second data generated by the plurality of pixels, and wherein n is an integer greater than or equal to 2.

2. The imaging device according to claim 1, wherein the one of the plurality of pixels comprises a photoelectric conversion device and a first transistor, wherein the second circuit and the third circuit each comprise a second transistor, a third transistor, a fourth transistor, a fifth transistor, and a first capacitor, wherein one electrode of the photoelectric conversion device is electrically connected to one of a source and a drain of the second transistor, wherein the other of the source and the drain of the second transistor is electrically connected to one of a source and a drain of the third transistor, wherein the one of the source and the drain of the third transistor is electrically connected to a gate of the fourth transistor, wherein the gate of the fourth transistor is electrically connected to one electrode of the first capacitor, wherein the other electrode of the first capacitor is electrically connected to one of a source and a drain of the fifth transistor, wherein one of a source and a drain of the fourth transistor is electrically connected to one of a source and a drain of the first transistor, and wherein the other of the source and the drain of the first transistor is electrically connected to the first circuit.

3. The imaging device according to claim 2, wherein the other of the source and the drain of the fifth transistor is electrically connected to a first wiring, and wherein the first wiring is supplied with either a potential corresponding to the first weight or a potential corresponding to the second weight.

4. The imaging device according to claim 1, wherein the one of the plurality of pixels comprises a photoelectric conversion device and a first transistor, wherein the second circuit and the third circuit each comprise a second transistor, a third transistor, a fourth transistor, and a first capacitor, wherein one electrode of the photoelectric conversion device is electrically connected to one of a source and a drain of the second transistor, wherein the other of the source and the drain of the second transistor is electrically connected to one of a source and a drain of the third transistor, wherein the one of the source and the drain of the third transistor is electrically connected to a gate of the fourth transistor, wherein the gate of the fourth transistor is electrically connected to one electrode of the first capacitor, wherein one of a source and a drain of the fourth transistor is electrically connected to one of a source and a drain of the first transistor, wherein the other of the source and the drain of the first transistor is electrically connected to the first circuit, and wherein the fourth transistor comprises a back gate.

5. The imaging device according to claim 4, wherein the back gate is electrically connected to a first wiring, and wherein the first wiring is supplied with either a potential corresponding to the first weight or a potential corresponding to the second weight.

6. The imaging device according to claim 1, wherein the first circuit comprises a sixth transistor, a seventh transistor, an eighth transistor, a ninth transistor, a tenth transistor, and a second capacitor, wherein one electrode of the second capacitor is electrically connected to the plurality of pixels, wherein the one electrode of the second capacitor is electrically connected to the sixth transistor, wherein the other electrode of the second capacitor is electrically connected to one of a source and a drain of the seventh transistor, wherein the one of the source and the drain of the seventh transistor is electrically connected to a gate of the eighth transistor, wherein one of a source and a drain of the eighth transistor is electrically connected to one of a source and a drain of the ninth transistor, and wherein the one of the source and the drain of the ninth transistor is electrically connected to one of a source and a drain of the tenth transistor.

7. The imaging device according to claim 1, wherein at least one of the transistors of the one of the plurality of pixels and the transistors of the first circuit comprises a metal oxide in a channel formation region, wherein the metal oxide comprises In, Zn, and an element M, and wherein M is one or more of Al, Ti, Ga, Ge, Sn, Y, Zr, La, Ce, Nd, and Hf.

8. The imaging device according to claim 1, wherein at least one of the transistors of the one of the plurality of pixels and the transistors of the first circuit comprises silicon in a channel formation region.

9. The imaging device according to claim 1, wherein one of the transistors of the one of the plurality of pixels and the transistors of the first circuit comprises a metal oxide in a channel formation region, wherein a transistor different from the one of the transistors of the one of the plurality of pixels and the transistors of the first circuit comprises silicon in a channel formation region, and wherein M is one or more of Al, Ti, Ga, Ge, Sn, Y, Zr, La, Ce, Nd, and Hf.

* * * * *